United States Patent
Yokoya et al.

(10) Patent No.: US 8,877,432 B2
(45) Date of Patent: Nov. 4, 2014

(54) METHOD OF FORMING RESIST PATTERN AND RESIST COMPOSITION

(75) Inventors: Jiro Yokoya, Kawasaki (JP); Tsuyoshi Nakamura, Kawasaki (JP); Masaru Takeshita, Kawasaki (JP); Yasuhiro Yoshii, Kawasaki (JP); Hirokuni Saito, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 171 days.

(21) Appl. No.: 13/073,651

(22) Filed: Mar. 28, 2011

(65) Prior Publication Data
US 2011/0262872 A1 Oct. 27, 2011

(30) Foreign Application Priority Data

Mar. 30, 2010 (JP) ................................. 2010-077116

(51) Int. Cl.
| G03F 7/20 | (2006.01) |
| G03F 7/039 | (2006.01) |
| G03F 7/038 | (2006.01) |
| G03F 7/00 | (2006.01) |
| G03F 7/40 | (2006.01) |
| G03F 7/004 | (2006.01) |

(52) U.S. Cl.
CPC ............ *G03F 7/0035* (2013.01); *G03F 7/0397* (2013.01); *G03F 7/0382* (2013.01); *G03F 7/0045* (2013.01); *G03F 7/2041* (2013.01); *G03F 7/40* (2013.01)
USPC .......................................................... 430/325

(58) Field of Classification Search
USPC .................................. 430/394, 322, 325, 330
See application file for complete search history.

(56) References Cited

U.S. PATENT DOCUMENTS

| 5,945,517 A | 8/1999 | Nitta et al. |
| 6,153,733 A | 11/2000 | Yukawa et al. |

(Continued)

FOREIGN PATENT DOCUMENTS

| JP | H09-208554 | 8/1997 |
| JP | A-10-083079 | 3/1998 |

(Continued)

OTHER PUBLICATIONS

Gil, et al., "First Microprocessors with Immersion Lithography," *Optical Microlithography XVIII*, Proceedings of SPIE (2005) 5754:119-128.

(Continued)

*Primary Examiner* — Brittany Raymond
(74) *Attorney, Agent, or Firm* — Knobbe Martens Olson & Bear LLP

(57) ABSTRACT

There are provided a method of forming a resist pattern in which a resist pattern is formed on top of a substrate by using a chemically amplified resist composition and conducting patterning two or more times, the method being capable of reducing the extent of damage, caused by the second patterning, imposed upon the first resist pattern that is formed by the first patterning; as well as a resist composition that is useful for forming the first resist pattern in this method of forming a resist pattern. The method includes forming of a first resist pattern using a resist composition containing a thermal base generator as a chemically amplified resist composition during first patterning, and then conducting a hard bake for baking the first resist pattern under a bake condition such that a base is generated from the thermal base generator, prior to the second patterning.

3 Claims, 2 Drawing Sheets

(56) References Cited

U.S. PATENT DOCUMENTS

| | | | |
|---|---|---|---|
| 6,444,397 | B2 | 9/2002 | Hada et al. |
| 6,949,325 | B2 | 9/2005 | Li et al. |
| 7,074,543 | B2 | 7/2006 | Iwai et al. |
| 2009/0155715 | A1* | 6/2009 | Chen et al. ............. 430/270.1 |
| 2009/0155718 | A1* | 6/2009 | Chen et al. ............. 430/283.1 |
| 2010/0304297 | A1* | 12/2010 | Hatakeyama et al. ..... 430/270.1 |
| 2010/0330471 | A1 | 12/2010 | Bae et al. |
| 2010/0330499 | A1 | 12/2010 | Bae et al. |
| 2010/0330500 | A1 | 12/2010 | Bae et al. |
| 2010/0330501 | A1 | 12/2010 | Bae et al. |
| 2010/0330503 | A1 | 12/2010 | Bae et al. |
| 2011/0008729 | A1 | 1/2011 | Bae et al. |
| 2011/0033803 | A1 | 2/2011 | Hatakeyama et al. |

FOREIGN PATENT DOCUMENTS

| | | |
|---|---|---|
| JP | H11-035551 | 2/1999 |
| JP | H11-035552 | 2/1999 |
| JP | H11-035573 | 2/1999 |
| JP | H11-322707 | 11/1999 |
| JP | 2000-206694 | 7/2000 |
| JP | 2000-330270 | 11/2000 |
| JP | 2003-241385 | 8/2003 |
| JP | 2005-336452 | 12/2005 |
| JP | 2006-259582 | 9/2006 |
| JP | 2006-317803 | 11/2006 |
| JP | 2008-247747 | 10/2008 |
| JP | 2009-019113 | 1/2009 |
| JP | 2010-044164 | 2/2010 |
| JP | A-2011-008237 | 1/2011 |
| JP | A-2011-053666 | 3/2011 |
| JP | A-2011-071480 | 4/2011 |
| WO | WO 2004-074242 | 9/2004 |
| WO | WO 2009/074522 A1 | 6/2009 |

OTHER PUBLICATIONS

Ebihara, et al., "Beyond k1=0.25 lithography : 70nm L/S patterning using KrF scanners," *23rd Annual BACUS Symposium on Photomask Technology*, Proceedings of SPIE (2003) 5256:985-994.

Borodovsky, Yan, "Marching to the Beat of Moore's Law," *Advances in Resist Technology and Processing XXII*, Proceedings of SPIE (2006) 6153:615301-1-615301-19.

Office Action mailed on Dec. 20, 2013 in Japanese Patent Application No. 2010-077116.

* cited by examiner

METHOD OF FORMING RESIST PATTERN AND RESIST COMPOSITION

TECHNICAL FIELD

The present invention relates to a method of forming a resist pattern in which a resist pattern is formed on top of a substrate by using a chemically amplified resist composition and conducting patterning two or more times, and also relates to a resist composition used in the method of forming a resist pattern. More specifically, the present invention relates to a method of forming a resist pattern in which a first resist pattern is formed by forming a first resist film using a first chemically amplified resist composition followed by a first patterning process, and then a second resist film is formed by applying a second chemically amplified resist composition thereon followed by a second patterning process; and also relates to a resist composition which is used as the first chemically amplified resist composition in this method of forming a resist pattern.

Priority is claimed on Japanese Patent Application No. 2010-077116, filed Mar. 30, 2010, the content of which is incorporated herein by reference.

BACKGROUND ART

Techniques (pattern-forming techniques) in which a fine pattern is formed on top of a substrate, and a lower layer beneath that pattern is then fabricated by conducting etching with this pattern as a mask are widely used in the semiconductor industry for IC fabrication and the like, and are attracting considerable attention. These types of fine patterns are usually formed from an organic material, and are formed, for example, using a lithography method or a nanoimprint method or the like. For example, in the case of a lithography method, a resist film composed of a resist material that exhibits a changed solubility in a developing solution upon exposure is formed on top of a supporting material such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

A resist material in which the exposed portions exhibit increased solubility in a developing solution is called a positive-type, and a resist material in which the exposed portions exhibit decreased solubility in a developing solution is called a negative-type.

In recent years, advances in lithography techniques have led to rapid progress in the field of pattern miniaturization. Typically, these miniaturization techniques involve increasing the energy (for example, shortening the wavelength) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having higher energy than these excimer lasers, such as electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist composition containing an acid generator that generates acid upon exposure is used. In addition to the acid generator, the chemically amplified resist composition generally includes a base component that exhibits changed solubility in an alkali developing solution by the action of acid generated from the acid generator. For example, as a base component for the positive chemically amplified resists, a base component that exhibits increased solubility in an alkali developing solution under the action of acid has been used (see, for example, Patent Document 1). Resins are mainly used as a base component for the chemically amplified resist compositions.

As a technique for further improving the resolution of resist patterns, a lithography method called liquid immersion lithography (hereafter, frequently referred to as "immersion exposure") is known in which exposure (immersion exposure) is conducted in a state where the region between the objective lens of the exposure apparatus and the sample is filled with a solvent (an immersion medium) that has a larger refractive index than the refractive index of air (see, for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly studied as the immersion medium.

As a lithography technique which has been recently proposed, a double patterning method is known in which patterning is conducted two or more times to form a resist pattern (for example, see Non-Patent Documents 2 and 3). According to the double patterning process, for example, a first resist film is formed on a substrate, and patterning of the first resist film is conducted to form a plurality of resist patterns. Then, a second resist material is applied to the plurality of resist patterns to form a second resist film which fills the gaps between the plurality of resist patterns. Then, by conducting patterning of the second resist film, it is presumed that a resist pattern can be formed with a higher resolution than the resist pattern formed by the first patterning.

DOCUMENTS OF RELATED ART

Patent Document

[Patent Document 1] Japanese Unexamined Patent Application, First Publication No. 2003-241385

Non-Patent Documents

[Non-Patent Document 1] Proceedings of SPIE (U.S.), vol. 5754, pp. 119-128 (2005)

[Non-Patent Document 2] Proceedings of SPIE (U.S.), vol. 5256, pp. 985-994 (2003)

[Non-Patent Document 3] Proceedings of SPIE (U.S.), vol. 6153, pp. 1-19 (2006)

SUMMARY OF THE INVENTION

Problems to be Solved by the Invention

However, in the double patterning process as described above, when a chemically amplified resist composition is used as a resist material, the resist pattern formed on the first resist film (namely, the first resist pattern) is prone to damage during the second patterning. More specifically, for example, changes in the shape of the first resist pattern (such as reduction in height (thickness loss), reduction in the line width of a line pattern (pattern thinning) and increase in the hole diameter of a hole pattern) may occur, or the first resist pattern itself may be eliminated.

Such problems are more likely to occur as the first resist film becomes thinner or the size of the first resist pattern becomes more minute. Further, in those cases where the chemically amplified resist composition used for forming the first resist film is a positive composition, such problems tend to occur, in particular, when the chemically amplified resist composition used for forming the second resist film is also a positive composition.

The present invention takes the above circumstances into consideration, with an object of providing a method of forming a resist pattern in which a resist pattern is formed on top of a substrate by using a chemically amplified resist composition and conducting patterning two or more times, i.e., the method of forming a resist pattern capable of reducing the extent of damage, caused by the second patterning, imposed on the first resist pattern that is formed by the first patterning; and a resist composition that is useful for forming the first resist pattern in this method of forming a resist pattern.

Means for Solving the Problems

Possible factors causing the above-mentioned problems include the adverse effects of organic solvents contained in a second resist material when the second resist material is applied onto the first resist pattern, and the adverse effects of exposure and development during patterning of the second resist film. Of these adverse effects, the inventors of the present invention particularly focused on the adverse effects by exposure and conducted intensive and extensive studies in order to reduce such effects. As a result, they discovered that the above-mentioned problems can be solved by adding a thermal base generator to the chemically amplified resist composition used for forming the first resist pattern, and following formation of the first resist pattern, generating a base from the thermal base generator prior to the second patterning, thereby completing the present invention.

That is, a first aspect of the present invention is a method of forming a resist pattern, including: a first patterning step for forming a first resist pattern by applying a first chemically amplified resist composition onto a substrate to form a first resist film, followed by selective exposure and alkali developing of the first resist film; a hard bake step for baking the first resist pattern; and a second patterning step for forming a resist pattern by applying a second chemically amplified resist composition onto the substrate, on which the first resist pattern has been formed, to form a second resist film, followed by selective exposure and alkali developing of the second resist film, wherein a resist composition containing a thermal base generator is used as the first chemically amplified resist composition in the first patterning step, and the baking in the hard bake step is conducted under a bake condition such that a base is generated from the thermal base generator.

Further, a second aspect of the present invention is a resist composition containing a thermal base generator, wherein the resist composition is used in a method of forming a resist pattern that includes: a first patterning step for forming a first resist pattern by applying a first chemically amplified resist composition onto a substrate to form a first resist film, followed by selective exposure and alkali developing of the first resist film; a hard bake step for baking the first resist pattern; and a second patterning step for forming a resist pattern by applying a second chemically amplified resist composition onto the substrate, on which the first resist pattern has been formed, to form a second resist film, followed by selective exposure and alkali developing of the second resist film, as the first chemically amplified resist composition.

In the present description and claims, the term "exposure" is used as a general concept that includes irradiation with any form of radiation.

The term "structural unit" refers to a monomer unit that contributes to the formation of a resin component (polymer, copolymer).

The term "alkyl group" includes linear, branched or cyclic, monovalent saturated hydrocarbon, unless otherwise specified.

The term "alkylene group" includes linear, branched or cyclic divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

The term "aliphatic" is a relative concept used in relation to the term "aromatic", and defines a group or compound that has no aromaticity.

Effects of the Invention

According to the present invention, there are provided a method of forming a resist pattern in which a resist pattern is formed on top of a substrate by using a chemically amplified resist composition and conducting patterning two or more times, i.e., the method of forming a resist pattern capable of reducing the extent of damage, caused by the second patterning, imposed upon the first resist pattern that is formed by the first patterning; as well as a resist composition that is useful for forming the first resist pattern in this method of forming a resist pattern.

DETAILED DESCRIPTION OF THE INVENTION

<<Method of Forming a Resist Pattern>>

Figure 1A:
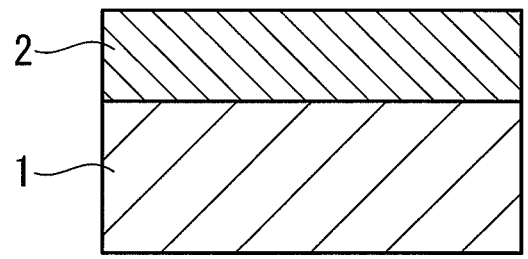
FIG. 1 is a schematic flow chart for explaining a preferred embodiment of a first patterning step in a method of forming a resist pattern according to the present invention.

The method of forming a resist pattern according to the present invention is a method of forming a resist pattern on top of a substrate by using a chemically amplified resist composition.

The chemically amplified resist compositions include an acid generator component which generates acid upon exposure as an essential component. When an acid is generated from the acid generator component, solubility of the entire chemically amplified resist composition in an alkali developing solution changes by the action of this acid. For example, in the case of a positive-type, chemically amplified resist composition, a compound having an acid dissociable, dissolution inhibiting group (such as a component (A) described later) is generally included, and when an acid is generated from the aforementioned acid generator component upon exposure, the acid dissociable, dissolution inhibiting group dissociates from the compound by the action of this acid.

The acid dissociable, dissolution inhibiting group is a group that exhibits an alkali dissolution inhibiting effect that renders the entire compound insoluble in an alkali developing solution prior to dissociation, and also a property to dissociate due to the action of acid generated from the acid generator component. As a result of the dissociation of this acid dissociable, dissolution inhibiting group, the solubility of the entire compound in the alkali developing solution increases. On the other hand, in the case of a negative-type, chemically amplified resist composition, a resin soluble in an alkali developing solution (namely, an alkali-soluble resin) and a cross-linking agent are generally included, and when an acid is generated from the aforementioned acid generator component upon exposure, the alkali-soluble resin is cross-linked by the cross-linking agent due to the action of this acid, thereby reducing the solubility in the alkali developing solution.

As a result, if the resist film formed using a chemically amplified resist composition is selectively exposed, the solubility of the exposed portions of the resist film in an alkali developing solution is changed (either increased or reduced) by the action of acid generated from the acid generator component, whereas the solubility of the unexposed portions in an alkali developing solution remains unchanged. Accordingly, by subsequently performing alkali developing, the exposed portions are dissolved and removed in the case of a positive resist composition, whereas the unexposed portions are dissolved and removed in the case of a negative resist composition, and hence in either case, a resist pattern can be formed.

The method of forming a resist pattern according to the present invention includes: a first patterning step for forming a first resist pattern by applying a first chemically amplified resist composition (hereafter, frequently referred to as a "first resist composition") onto a substrate to form a first resist film, followed by selective exposure and alkali developing of the first resist film; a hard bake step for baking the first resist pattern; and a second patterning step for forming a resist pattern by applying a second chemically amplified resist composition (hereafter, frequently referred to as a "second resist composition") onto the substrate, on which the first resist pattern has been formed, to form a second resist film, followed by selective exposure and alkali developing of the second resist film.

In the present invention, a resist composition containing a thermal base generator is used as the aforementioned first resist composition in the first patterning step, and the aforementioned baking in the hard bake step is conducted under a bake condition such that a base is generated from the aforementioned thermal base generator.

In the present invention, the resist composition used as the first resist composition may have the same composition as that of the known resist compositions, apart from the inclusion of the thermal base generator. This resist composition may be a positive resist composition which exhibits increased solubility in an alkali developing solution upon exposure, or a negative resist composition which exhibits reduced solubility in an alkali developing solution upon exposure, although a positive resist composition is preferred as the usability of the present invention can be enhanced.

There are no particular limitations on the resist composition used as the second resist composition, and any of the known resist compositions can be appropriately selected for use. This resist composition may be a positive resist composition which exhibits increased solubility in an alkali developing solution upon exposure, or a negative resist composition which exhibits reduced solubility in an alkali developing solution upon exposure, although a positive resist composition is preferred as the usability of the present invention can be enhanced.

Further, in the present invention, the second resist composition preferably contains, as an organic solvent, an organic solvent that does not dissolve the first resist film. As a result, during application of the second resist composition in the second patterning step, dissolution of the first resist pattern by the organic solvent in the second resist composition or the occurrence of mixing at the interface between the first resist pattern and the second resist film can be suppressed, thereby further improving the effects of the present invention.

The first resist composition and the second resist composition will be described later in detail, respectively.

An example of embodiments of the method of forming a resist pattern according to the present invention will be described using FIGS. 1A to 1C and 2A to 2D.

In the present embodiment, positive resist compositions are used for both the first and second resist compositions. FIGS. 1A to 1C and FIGS. 2A to 2D are schematic flow charts for explaining the first patterning step and the second patterning step, respectively, in the present embodiment.

Figure 1B:
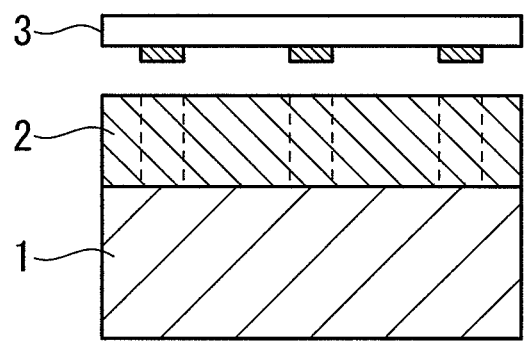
Figure 1C:
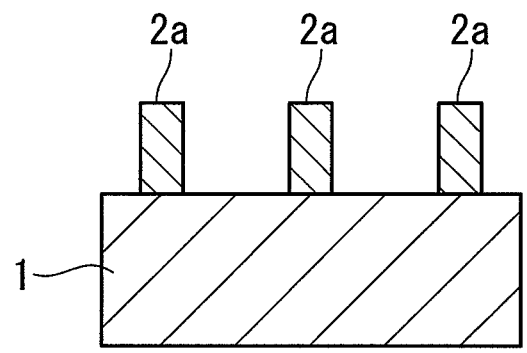

In the present embodiment, the first patterning step is first carried out in accordance with the procedure shown in FIGS. 1A to 1C. In the first patterning step, first, as shown in FIG. 1A, a positive resist composition containing a thermal base generator is applied onto a substrate 1 as the first resist composition to form a first resist film 2.

Then, as shown in FIG. 1B, the first resist film 2 is subjected to selective exposure using a photomask 3 having a predetermined pattern, followed by a post exposure bake (PEB) treatment. As a result, acid is generated from the acid generator component within the exposed portions of the first resist film 2, and the action of this acid causes an increase in the solubility in an alkali developing solution. Accordingly, by subsequently performing developing using an alkali developing solution, the exposed portions of the first resist film 2 are removed. As a result, as shown in FIG. 1C, the first resist pattern having a plurality of resist structures 2a arranged with certain intervals is formed on top of the substrate 1. These resist structures 2a contain a thermal base generator.

Then, the hard bake step for baking the resist structures 2a is conducted. The baking at this time is conducted under a bake condition (in terms of temperature and time) such that a base is generated from the aforementioned thermal base generator. As a result, a base is generated from the aforementioned thermal base generator within the resist structures 2a.

Figure 2A:
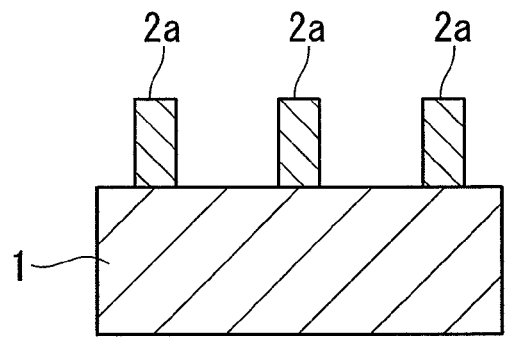
FIG. 2 is a schematic flow chart for explaining a preferred embodiment of a second patterning step in a method of forming a resist pattern according to the present invention.
Figure 2B:
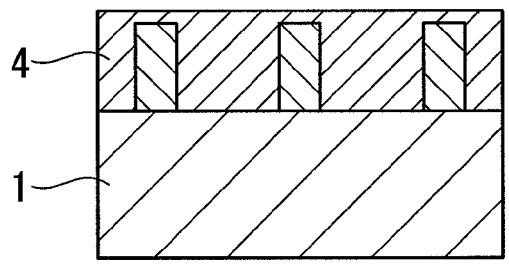

Subsequently, the second patterning step is carried out in accordance with the procedure shown in FIG. 2. In the second patterning step, first, a positive resist composition is applied, as the second resist composition, on top of the substrate 1 on which the resist structures 2a have been formed in the first patterning step (FIG. 2A), to form a second resist film 4 which fills the gap between a plurality of resist structures 2a, as shown in FIG. 2B.

Figure 2C:
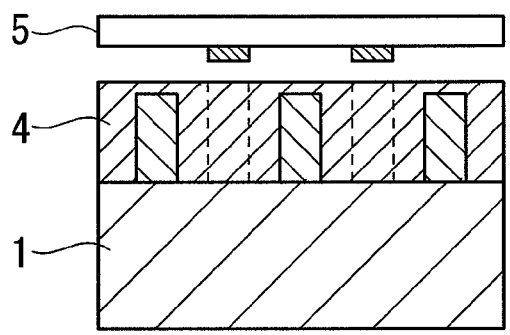

Then, as shown in FIG. 2C, the second resist film 4 is subjected to selective exposure using a photomask 5 having a predetermined pattern, followed by a PEB treatment. As a result, acid is generated from the acid generator component within the exposed portions of the second resist film 4, and the action of this acid causes an increase in the solubility in an alkali developing solution. Accordingly, by subsequently performing developing using an alkali developing solution, the exposed portions of the second resist film 4 are removed.

At this time, the acid generated within the exposed portions of the second resist film 4 diffuses into the resist structures 2a that are in contact with the second resist film 4 within the exposed portions. Further, in the present embodiment, the resist structures 2a are present within the exposed portions of the second resist film 4, and acid may be generated from the acid generator component contained in the resist structures 2a during exposure of the second resist film 4. Although the acid, as it is, may increase the solubility of the resist structures 2a in an alkali developing solution, since the base generated in the hard bake step is present within the resist structures 2a, the acid is scavenged by the base. For this reason, an increase in the solubility of the resist structures 2a in an alkali developing solution can be suppressed by the action of the acid, and the pattern thinning or elimination of the resist structures 2a during alkali developing in the second patterning step can also be prevented.

Figure 2D:
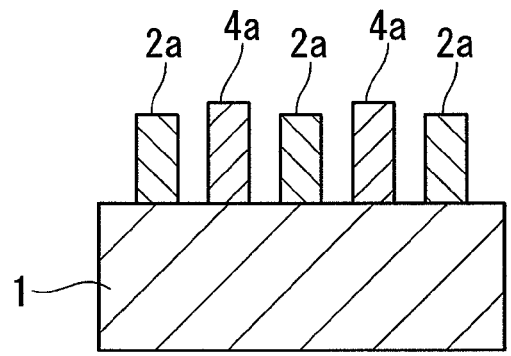

As a result, as shown in FIG. 2D, a resist pattern constituted of the resist structures 2a originating from the first resist film 2 and the resist structures 4a originating from the second resist film 4 can be formed on top of the substrate 1. The resist pattern formed in this manner has a pitch smaller than that of the first resist pattern formed in the first patterning step. Further, before and after the second patterning step, the resist structures 2a within this resist pattern show small fluctuations in the pattern size.

As described above, according to the present invention, as compared to those cases where a resist pattern is formed by a single patterning step, a resist pattern with a narrow pitch can be formed, and the mask reproducibility for the pattern size thereof is also favorable.

Each of these steps will be described in more detail below.
[First Patterning Step]
The substrate 1 is not specifically limited and a conventionally known substrate can be used. For example, substrates for electronic components, and such substrates having wiring patterns formed thereon can be used. Specific examples of the material of the substrate include a silicon wafer; metals such as copper, chromium, iron and aluminum; and glass. Suitable materials for the wiring pattern include copper, aluminum, nickel, and gold.

Further, as the substrate 1, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and a lower-layer organic film used in a multilayer resist method can be used. It is particularly desirable that an organic film is provided because a pattern can be formed on the substrate with a high aspect ratio which is useful in the production of semiconductors.

Here, a "multilayer resist method" is method in which at least one layer of an organic film (lower-layer film) and at least one layer of a resist film are provided on a substrate, and a resist pattern formed within the upper resist film is used as a mask to conduct patterning of the lower-layer film. This method is capable of forming a pattern with a high aspect ratio. The multilayer resist method can be broadly classified into a method in which a double-layer structure consisting of an upper-layer resist film and a lower-layer film is formed, and a method in which a multilayer structure having at least three layers consisting of an upper-layer resist film, a lower-layer film and at least one intermediate layer (thin metal film or the like) provided between the upper-layer resist film and the lower-layer film is formed. In the multilayer resist method, a desired thickness can be ensured by the lower-layer film, and as a result, the thickness of the resist film can be reduced, and an extremely fine pattern with a high aspect ratio can be formed.

An inorganic film can be formed, for example, by coating an inorganic antireflection film composition such as a silicon-based material on a substrate, followed by baking.

An organic film can be formed, for example, by dissolving a resin component and the like for forming the film in an organic solvent to obtain an organic film forming material, coating the organic film forming material on a substrate using a spinner or the like, and baking under heating conditions preferably in the range of 200 to 300° C. for 30 to 300 seconds, more preferably for 60 to 180 seconds.

There are no particular limitations on the method of forming the first resist film 2 by applying a positive resist composition on top of the substrate 1, and the first resist film 2 can be formed by a conventionally known method.

More specifically, the first resist film 2 can be formed, for example, by applying a positive resist composition as the first resist composition onto the substrate 1 through a conventionally known method using a spinner or the like, and vaporizing organic solvents by conducting a bake treatment (prebake) at a temperature of 80 to 150° C. for 40 to 120 seconds, preferably 60 to 90 seconds.

The thickness of the first resist film 2 is preferably within the range from 50 to 500 nm, and more preferably from 50 to 450 nm. By ensuring that the thickness of the resist film satisfies the above-mentioned range, a resist pattern with a high level of resolution can be formed, and a satisfactory level of etching resistance can be achieved.

The wavelength to be used for exposure of the first resist film 2 is not particularly limited and the exposure can be conducted using radiation such as KrF excimer laser, ArF excimer laser, $F_2$ excimer laser, extreme ultraviolet rays (EUV), vacuum ultraviolet rays (VUV), electron beam (EB), X-rays, soft X-rays, and the like.

As the photomask 3, for example, a binary mask in which the transmittance of the light shielding portion is 0% or a halftone-phase shift mask (HT-mask) in which the transmittance of the light shielding portion is 6% can be used. As a binary mask, those in which a chromium film, a chromium oxide film, or the like is formed as a light shielding portion on a quartz glass substrate are generally used. Examples of the half-tone type phase shift masks include those in which a MoSi (molybdenum silicide) film, a chromium film, a chromium oxide film, an oxynitriding silicon film, or the like is formed, as a light shielding portion on a substrate generally made of quartz glass.

Note that although the exposure is conducted through the photomask 3 in the present embodiment, the present invention is not limited to this embodiment, and the exposure may be conducted without using the photomask 3, such as the selective exposure by drawing with electron beam (EB) or the like.

The exposure of the first resist film 2 can be either a general exposure (dry exposure) conducted in air or an inert gas such as nitrogen, or immersion exposure (immersion lithography).

In immersion lithography, exposure (immersion exposure) is conducted in a state where the region between the lens and the resist layer formed on a wafer (which was conventionally filled with air or an inert gas such as nitrogen) is filled with a solvent (an immersion medium) that has a larger refractive index than the refractive index of air. More specifically, in immersion lithography, the region between the resist film formed in the above-described manner and lens at the lowermost portion of the exposure apparatus is filled with a solvent (an immersion medium) that has a larger refractive index than the refractive index of air, and in this state, the resist film is subjected to exposure (immersion exposure) through a desired photomask.

The immersion medium is preferably a solvent that exhibits a refractive index larger than the refractive index of air but smaller than the refractive index of the resist film (i.e., the first resist film 2 in the first patterning step) to be subjected to immersion exposure. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which preferably have a boiling point within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

The aforementioned PEB treatment following the exposure is conducted for the sake of promoting generation of acid from the acid generator component within the exposed portions of the first resist film 2 and changes in the solubility in an alkali developing solution by the action of this acid.

This PEB treatment is preferably conducted under a bake condition (in terms of baking temperature and baking time) such that a base does not substantially generate from the thermal base generator included in the first resist composition. If this PEB treatment is conducted under a bake condition such that a base is generated from the thermal base generator, the acid generated from the acid generator may be scavenged by the base thermal base generator within the first resist film 2 so as to deteriorate the lithography properties such as sensitivity and resolution. Deteriorations in the lithography properties can be prevented by conducting this PEB treatment under a bake condition such that a base does not substantially generate from the thermal base generator.

Here, the expression "does not substantially generate" means that the thermal base generator does not decompose. More specifically, with respect to the thermal base generator, it is possible to judge that a base does not substantially generate from the thermal base generator if the PEB treatment is conducted at a temperature lower than the thermal decomposition temperature determined by thermogravimetric analysis (TGA).

In the present invention, the thermal decomposition temperature is defined, not as a temperature at the time of the start of weight reduction in the TGA, but (when the temperature and the weight decrement are recorded on the x-axis and the y-axis, respectively), as a temperature at the intersection of the straight line indicating zero in terms of the change in weight (y=0) and the straight line when the slope of the reduction reached almost a constant level after the start of weight reduction.

The weight decrement between the temperature at the time of the start of weight reduction and the thermal decomposition temperature is about 10%, although it is considered that factors other than the base generated from the thermal base generator are also responsible for the level of weight change in the TGA. Therefore, it is thought there is no problem in judging that a base does not substantially generate from the thermal base generator if the PEB treatment is conducted at a temperature lower than the thermal decomposition temperature.

The baking temperature in this PEB treatment may be any temperature as long as it is lower than the thermal decomposition temperature of the thermal base generator. A temperature lower than the thermal decomposition temperature of the thermal base generator by 10° C. or more is preferable, and a temperature lower than the thermal decomposition temperature of the thermal base generator by 30° C. or more is more preferable, as a base hardly generates from the thermal base generator. For example, when the thermal decomposition temperature of the thermal base generator is 140° C., the baking temperature may be any temperature lower than 140° C., but is preferably not higher than 130° C., and is more preferably not higher than 110° C. When the thermal decomposition temperature of the thermal base generator is 120° C., the baking temperature may be any temperature lower than 120° C., and is preferably not higher than 110° C.

Although there are no particular limitations on the lower limit for this baking temperature, the PEB treatment is conducted for the sake of promoting generation and diffusion of acid from the acid generator component within the exposed portions of the first resist film 2 and changes in the solubility in an alkali developing solution by the action of this acid. In order to achieve such purposes, the baking temperature is preferably not lower than 80° C., and is more preferably not lower than 90° C. Further, in order to conduct a PEB treatment at such baking temperatures, it is preferable to use a thermal base generator having a thermal decomposition temperature of not lower than 120° C.

The baking time in this PEB treatment may be set in accordance with the baking temperature, but is usually within a range from 40 to 120 seconds, and is preferably from 60 to 90 seconds.

Development of the first resist film 2 can be conducted by a known method using an alkaline aqueous solution such as a 0.1 to 10% by weight aqueous solution of tetramethylammonium hydroxide (TMAH).

A rinsing treatment using water or the like may be conducted following the above-mentioned alkali developing.

A baking treatment (postbake) may be conducted following the above-mentioned alkali developing or rinsing treatment in order to remove the water content of alkali developing solution or rinsing liquid. The postbake is usually conducted at a temperature of about 100° C. for the purpose thereof, and the treatment time is about 30 to 90 seconds.

[Hard Bake Step]

In the hard bake step, the bake conditions (in terms of temperature and time) during baking of the resist structures 2a are not limited as long as a base may be generated from the thermal base generator included within the resist structures 2a, and thus may be set appropriately in consideration of the thermal decomposition temperature of this thermal base generator.

As the baking temperature, by taking the generation efficiency of base or the like into consideration, a temperature 5° C. or more higher than the thermal decomposition temperature of the thermal base generator is preferable, and a temperature 10° C. or more higher than the thermal decomposition temperature of the thermal base generator is more preferable. For example, when the thermal decomposition temperature of the thermal base generator is 120° C., the baking temperature is preferably not lower than 125° C., and is more preferably not lower than 130° C.

Although there are no particular limitations on the upper limit for this baking temperature, it is preferably not higher than 200° C., and is more preferably not higher than 180° C. When considering the advantages of preventing deformation of the resist structures 2a due to heat or the like, the baking temperature of not higher than 170° C. is particularly desirable.

The baking time depends on the baking temperature, but is usually within a range from 40 to 120 seconds, and is preferably from 40 to 80 seconds.

[Second Patterning Step]

The second resist film 4 can be formed in the same manner as the first resist film 2, with the exception that the second resist composition is used instead of the first resist composition.

More specifically, the second resist film 4 can be formed, for example, by applying a positive resist composition serving as the second resist composition onto the substrate 1, on which the aforementioned first resist pattern has been formed, through a conventionally known method using a spinner or the like, and vaporizing organic solvents by conducting a bake treatment (prebake) at a temperature of 80 to 150° C. for 40 to 120 seconds, preferably 60 to 90 seconds.

The second resist composition preferably contains, as an organic solvent, an organic solvent (hereafter, referred to as a "component (S')") that does not dissolve the aforementioned first resist film 2.

By including the component (S') within the second resist composition, during application of the second resist composition, dissolution of the resist structures 2a by the organic solvent in the second resist composition can be suppressed, and the shape deterioration or elimination of the resist structures 2a or the occurrence of mixing at the interface between the resist structures 2a and the second resist film 4 can be prevented.

Here, the expression "does not dissolve the first resist film 2" used with respect to the component (S') means that when the first resist composition is applied and dried on the substrate 1, and the first resist film 2 with a film thickness of 0.2 μm is then formed at 23° C., followed by immersion of the resultant in this organic solvent, even after 60 minutes, elimination of the first resist film 2 or marked changes in the film thickness thereof does not occur (and preferably, the film thickness of the first resist film 2 does not become 0.16 μm or less).

The component (S') is not limited as long as it does not dissolve the first resist film 2 and is also capable of dissolving the components that are included in the second resist composition.

Specific examples thereof include alcohol-based organic solvents, fluorine-based organic solvents, and ether-based organic solvents having no hydroxyl group. Any one of these solvents can be used individually, or two or more types thereof may be mixed for use. Alcohol-based organic solvents are preferred in view of coating properties and the solubility of materials, such as resin components.

Here, the term "alcohol-based organic solvent" refers to a compound in which at least one hydrogen atom within an aliphatic hydrocarbon has been substituted with a hydroxyl group, and is a liquid at normal temperature and normal pressure. The structure of the main chain constituting the aforementioned aliphatic hydrocarbon may be a chain-like structure or a cyclic structure, or may include a cyclic structure within the chain-like structure, or may include an ether bond within the chain-like structure.

The term "fluorine-based organic solvent" refers to a compound that contains a fluorine atom and is a liquid at normal temperature and normal pressure.

The expression "ether-based organic solvent having no hydroxyl group" refers to a compound that contains an ether bond (C—O—C) within the molecule but has no hydroxyl group, and is a liquid at normal temperature and normal pressure. It is preferable that not only hydroxyl groups but also carbonyl groups are absent in the ether-based organic solvents having no hydroxyl group.

As the alcohol-based organic solvent, monohydric alcohols, dihydric alcohols, derivatives of dihydric alcohols and the like are preferred.

As the monohydric alcohol, although depending on the number of carbon atoms, primary or secondary monohydric alcohols are preferred, and primary monohydric alcohols are the most desirable.

Here, the term "monohydric alcohol" refers to a compound in which one hydrogen atom within a hydrocarbon compound constituted only of carbon atoms and hydrogen atoms has been substituted with a hydroxyl group, and does not include derivatives of dihydric or higher polyhydric alcohols. The hydrocarbon compound may have a chain-like structure or a ring structure.

The term "dihydric alcohol" refers to a compound in which two hydrogen atom within the aforementioned hydrocarbon compound have been substituted with hydroxyl groups, and does not include derivatives of trihydric or higher polyhydric alcohols.

Examples of the derivatives of dihydric alcohols include compounds in which one of the hydroxyl groups in the dihydric alcohol has been substituted with a substituent (such as an alkoxy group and an alkoxyalkyloxy group).

The boiling point of alcohol-based organic solvents is preferably within a range from 80 to 160° C., more preferably from 90 to 150° C., and from the viewpoints of the resulting coating properties, the stability of the composition upon storage, and the baking temperature required in the PAB step and/or PEB step, boiling points within a range from 100 to 135° C. are the most desirable.

Examples of the alcohol-based organic solvents having a chain-like structure include propylene glycol (PG), 1-butoxy-2-propanol (BP), n-hexanol, 2-heptanol, 3-heptanol, 1-heptanol, 5-methyl-1-hexanol, 6-methyl-2-heptanol, 1-octanol, 2-octanol, 3-octanol, 4-octanol, 2-ethyl-1-hexanol, 2-(2-butoxyethoxy)ethanol, n-pentylalcohol, s-pentylalcohol, t-pentylalcohol, isopentylalcohol, isobutanol (also called as isobutylalcohol or 2-methyl-1-propanol), isopropylalcohol, 2-ethylbutanol, neopentylalcohol, n-butanol, s-butanol, t-butanol, 1-propanol, 2-methyl-1-butanol, 2-methyl-2-butanol and 4-methyl-2-pentanol.

Further, specific examples of those having a ring structure include cyclopentane methanol, 1-cyclopentylethanol, cyclohexanol, cyclohexane methanol (CM), cyclohexane ethanol, 1,2,3,6-tetrahydrobenzyl alcohol, exo-norborneol, 2-methylcyclohexanol, cycloheptanol, 3,5-dimethylcyclohexanol, and benzyl alcohol.

Among various alcohol-based organic solvents, derivatives of monohydric alcohols or dihydric alcohols having a chain-like structure are preferred, and 1-butoxy-2-propanol (BP), isobutanol (2-methyl-1-propanol), 4-methyl-2-pentanol and n-butanol are more preferred, and isobutanol (2-methyl-1-propanol) and 1-butoxy-2-propanol (BP) are the most desirable.

Examples of fluorine-based organic solvents include perfluoro-2-butyltetrahydrofuran.

Preferred examples of ether-based organic solvents having no hydroxyl group include compounds represented by general formula (s-1) shown below.

$$R^{40}\text{—}O\text{—}R^{41} \tag{s-1}$$

In the formula, each of $R^{40}$ and $R^{41}$ independently represents a monovalent hydrocarbon group, wherein $R^{40}$ and $R^{41}$ may be bonded to form a ring. —O— represents an ether bond.

In the above formula, as the hydrocarbon group for $R^{40}$ and $R^{41}$, for example, an alkyl group, an aryl group or the like can be mentioned, and an alkyl group is preferable. It is more preferable that both of $R^{40}$ and $R^{41}$ represent an alkyl group, and it is particularly desirable that $R^{40}$ and $R^{41}$ represent the same alkyl group.

The alkyl group for $R^{40}$ and $R^{41}$ is not particularly limited and includes, for example, a linear, branched or cyclic alkyl group having 1 to 20 carbon atoms. Some or all of the hydrogen atoms of the alkyl group may or may not be substituted with halogen atoms or the like.

The alkyl group preferably has 1 to 15 carbon atoms, and more preferably 1 to 10 carbon atoms, because coatability of the resist composition becomes satisfactory. Specific examples include an ethyl group, a propyl group, an isopropyl group, an n-butyl group, an isobutyl group, an n-pentyl group, an isopentyl group, a cyclopentyl group and a hexyl group, and an n-butyl group and an isopentyl group are particularly desirable.

The halogen atom, with which hydrogen atoms of the alkyl group may be substituted, is preferably a fluorine atom.

The aryl group for $R^{40}$ and $R^{41}$ is not particularly limited. For example, an aryl group having 6 to 12 carbon atoms may be used in which some or all of the hydrogen atoms of the aryl group may or may not be substituted with alkyl groups, alkoxy groups, or halogen atoms.

The aryl group is preferably an aryl group having 6 to 10 carbon atoms because it can be synthesized at a low cost. Specific examples thereof include a phenyl group, a benzyl group and a naphthyl group.

The alkyl group, with which hydrogen atoms of the aryl group may be substituted, is preferably an alkyl group having 1 to 5 carbon atoms, and more preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and more preferably a methoxy group or an ethoxy group.

The halogen atom, with which hydrogen atoms of the aryl group may be substituted, is preferably a fluorine atom.

Alternatively, in the above formula, $R^{40}$ and $R^{41}$ may be bonded to each other to form a ring.

In this case, each of $R^{40}$ and $R^{41}$ independently represents a linear or branched alkylene group (preferably an alkylene group of 1 to 10 carbon atoms), and $R^{40}$ and $R^{41}$ are bonded to form a ring. Further, a carbon atom of the alkylene group may be substituted with an oxygen atom.

Specific examples of such ether-based organic solvents include 1,8-cineole, tetrahydrofuran and dioxane.

The boiling point (at normal pressure) of ether-based organic solvents having no hydroxyl group is preferably within a range from 30 to 300° C., more preferably from 100 to 200° C., and even more preferably from 140 to 180° C. When the boiling point of the ether-based organic solvent having no hydroxyl group is at least as large as the lower limit of the above-mentioned temperature range, the component (S') hardly evaporates during the spin coating process when applying the second resist composition, thereby suppressing coating irregularities and improving the resulting coating properties. On the other hand, when the boiling point of the ether-based organic solvent having no hydroxyl group is no more than the upper limit of the above-mentioned temperature range, the component (S') is satisfactorily removed from the resist film by a PAB treatment, thereby improving formability of the second resist film. Further, when the boiling point of the ether-based organic solvent having no hydroxyl group is within the above-mentioned temperature range, the effect of reducing the thickness loss of the resist patterns and the stability of the composition upon storage are further improved. Further, it is also preferable from the viewpoints of the baking temperature required in the PAB step and/or PEB step.

Specific examples of the ether-based organic solvents having no hydroxyl group include 1,8-cineole (boiling point: 176° C.), dibutyl ether (boiling point: 142° C.), diisopentyl ether (boiling point: 171° C.), dioxane (boiling point: 101° C.), anisole (boiling point: 155° C.), ethylbenzyl ether (boiling point: 189° C.), diphenyl ether (boiling point: 259° C.), dibenzyl ether (boiling point: 297° C.), phenetole (boiling point: 170° C.), butylphenyl ether, tetrahydrofuran (boiling point: 66° C.), ethylpropyl ether (boiling point: 63° C.), diisopropyl ether (boiling point: 69° C.), dihexyl ether (boiling point: 226° C.) and dipropyl ether (boiling point: 91° C.).

The ether-based organic solvent having no hydroxyl group is preferably a cyclic or chain-like, ether-based organic solvent because the effect of reducing the thickness loss of the first resist pattern becomes satisfactory, and it is particularly desirable that the ether-based organic solvent having no hydroxyl group be at least one compound selected from the group consisting of 1,8-cineole, dibutyl ether and diisopentyl ether.

As the component (S') used in the second resist composition, one type of component may be used alone, or two or more types may be used in combination.

In the present embodiment, the second resist film 4 is formed so as to have a film thickness larger than the height of the resist structures 2a. In other words, when the substrate 1 is viewed from the second resist film 4 side, the surface thereof is flat. As described above, by making the film thickness of the second resist film 4 larger than the height of the resist structures 2a, variations in size can be suppressed. However, the present invention is not limited to this embodiment, and the second resist film 4 may be formed so as to have a film thickness smaller than the height of the resist structures 2a.

The exposure of the second resist film 4 can be conducted by the same method employed for the exposure in the first patterning step.

In the present embodiment, selective exposure of the second resist film 4 is conducted so that the gap portions between a plurality of resist patterns 2a become unexposed portions. As a result, when conducting development using an alkali developing solution following a PEB treatment, the exposed portions of the second resist film 4 are removed while the unexposed portions remain, thereby forming a plurality of resist structures 4a, respectively, between a plurality of resist structures 2a. As a result, as shown in FIG. 2D, resist patterns 4a are formed between a plurality of resist patterns 2a. In this manner, a resist pattern can be formed with a pitch (that is, the spacing between adjacent resist structures) smaller than that of the first resist pattern formed in the first patterning step. For example, when forming a line and space resist pattern, a line and space resist pattern may be formed, in which a plurality of line-shaped resist structures 2a are arranged with a constant pitch, in the first patterning step; and then in the second patterning step, line-shaped resist structures 4a may be formed, respectively, in intermediate regions between a plurality of resist structures 2a formed in the first patterning step. Accordingly, a line and space resist pattern (dense pattern) can be newly formed which has a pitch smaller than that of the previously formed line and space resist pattern (isolated pattern).

The "isolated pattern" is preferably a line and space pattern in which the space width is large so that the ratio of the line width to the space width (i.e., line width:space width) is 1:at least 2.

Selective exposure as described above can be conducted, for example, by parallel displacement of the photomask 3 used in the first patterning step to slightly shift the exposure positions so that the gaps between the plurality of resist structures 2a become the unexposed portions. Alternatively, at this time, a photomask which is different from the photomask used in the first patterning step may be used.

The PEB treatment can be conducted by the same method employed for the PEB treatment in the first patterning step. However, unlike the conditions for the PEB treatment in the aforementioned first patterning step, the conditions for the PEB treatment in the second patterning step are not necessarily the bake conditions under which a base does not substantially generate from the thermal base generator, and thus may be set appropriately within a range so that the solubility of the second resist film 4 in an alkali developing solution may be changed (either increased or reduced). The PEB treatment is usually conducted at a temperature of 80 to 150° C. for 40 to 120 seconds, preferably 60 to 90 seconds.

Development of the second resist film 4 can be conducted by a known method using an alkaline aqueous solution such as a 0.1 to 10% by weight aqueous solution of tetramethylammonium hydroxide (TMAH).

A rinsing treatment using water or the like may be conducted following the above-mentioned alkali developing.

A baking treatment (postbake) may be conducted following the above-mentioned alkali developing or rinsing treatment in order to remove the water content of alkali developing solution or rinsing liquid. The postbake is usually conducted at a temperature of about 100° C. for the purpose thereof, and the treatment time is about 30 to 90 seconds.

In the method of forming a resist pattern described in the present embodiment, a resist pattern formed on top of the substrate 1 is preferably a line and space resist pattern. In other words, both the resist structures 2a and the resist structures 4a are line-shaped.

As described above, a dense line and space pattern with a narrow pitch can be readily formed by forming the line-shaped resist structures 4a at positions that do not at all overlap the positions of the line-shaped resist structures 2a.

More specifically, for example, a line and space pattern (i.e., an isolated pattern) in which the resist structures 2a with a line width of 100 nm are arranged with a pitch of 400 nm (line width:space width=1:3) is first formed; followed by formation of the second resist film 4; and then the resist structures 4a with a line width of 100 nm that are parallel to the respective line-shaped resist structures 2a are formed with a pitch of 400 nm, within this second resist film 4, at intermediate positions between the respective line-shaped resist structures 2a of the aforementioned isolated pattern. As a result, a line and space pattern with a line width of 100 nm and the line width:space width ratio of 1:1 (i.e., a dense pattern), in which the resist structures 2a and the resist structures 4a are arranged alternately, is formed on top of the substrate 1.

The embodiment described above used positive resist compositions for both the first resist composition and the second resist composition. However, the present invention is not limited to this embodiment, and negative resist compositions may be used for either one of, or both, the first resist composition and the second resist composition. For example, a negative resist composition may be used as the second resist composition while using a positive resist composition as the first resist composition, a positive resist composition may be used as the second resist composition while using a negative resist composition as the first resist composition, or a negative resist composition may be used as the second resist composition while using a negative resist composition as the first resist composition. However, in any case, the first resist composition contains a thermal base generator.

It should be noted that in those cases where a positive resist composition is used as the second resist composition as described above while using a negative resist composition as the first resist composition, although the resist structures 2a are present within the exposed portions of the second resist film, the solubility in an alkali developing solution does not increase even when the acid acts, but rather, the solubility in an alkali developing solution reduces. For this reason, compared to those cases where the first resist composition is a positive resist composition, problems such as elimination of the resist structures 2a due to the adverse effects of the second patterning step are unlikely to occur. Therefore, in the present invention, the first resist composition is preferably a positive resist composition, as the usability of the present invention can be enhanced.

Further, in those cases where a negative resist composition is used as the second resist composition, regardless of the first resist composition being a positive resist composition or a negative resist composition, the resist structures 2a are present, not within the exposed portions, but within the unexposed portions of the second resist film. For this reason, compared to those cases where the second resist composition is a positive resist composition, problems such as elimination of the resist structures 2a due to the adverse effects of the second patterning step are unlikely to occur. Therefore, in the present invention, the second resist composition is preferably a positive resist composition, as the usability of the present invention can be enhanced.

In the embodiment described above, an example has been shown where the resist structures 4a are formed at positions that do not at all overlap with the positions of the resist structures 2a. However, the present invention is not limited to this embodiment, and the resist structures 4a may be formed at positions that partially overlap with the positions of the resist structures 2a. In this case, resist patterns with a complex shape can be formed.

For example, by forming a line and space resist pattern as the first resist pattern in the first patterning step and conducting a crossline patterning in the second patterning step, in other words, by subjecting the second resist film to exposure and developing to intersect with this first resist pattern, through rotational movement of the photomask 3 used in the first patterning step or the like, a hole-like or lattice-like resist pattern can be ultimately formed. When conducting a crossline patterning process, the (line width:space width) ratio or the intersection angle formed between the respective line and space patterns may be appropriately controlled, in accordance with the profiles of hole-like or lattice-like resist pattern to be ultimately formed. For example, depending on the types of targeted pattern, the intersection angle may be changed so that one pattern intersects with another pattern orthogonally or diagonally (i.e., at an angle less than 90°).

Further, a fine resist pattern and/or a resist pattern with various profiles can be formed, for example, by using, in the second patterning step, a photomask different from the photomask 3 used in the first patterning step (for instance, by using a photomask with a line and space pattern in the first patterning step and then using a mask with a hole pattern in the second patterning step).

In the method of forming a resist pattern according to the present invention, a step of protecting the first resist pattern using a freezing material may be conducted before conducting the second patterning step described above (namely, either following the first patterning step or following the hard bake step). However, in terms of improving the usability and throughput of the present invention, it is preferable to directly apply the second resist composition onto the first resist pattern in the second patterning step without carrying out the protection step using a freezing material.

Examples of the freezing material include insolubilized resin compositions as disclosed in Japanese Unexamined Patent Application, First Publication No. 2010-44164.

Protection of the first resist pattern using a freezing material can be conducted, for example, through a method employing application of the freezing material, baking treatment; exposure, or the like, or by combining development or the like with this method.

In the method of forming a resist pattern according to the present invention, following the second patterning step described above, the same patterning step as this second patterning step may be repeated several times. That is, operations for forming a resist pattern by applying a resist composition onto the substrate, on which a resist pattern has already been formed in the second patterning step described above, to form a resist film, followed by selective exposure and developing of this resist film, may be conducted several times. As a result, denser patterns with a narrower pitch or patterns with a complex shape can be formed.

In the method of forming a resist pattern according to the present invention, following the second patterning step described above, etching of the substrate 1 may be conducted by using the obtained resist pattern as a mask.

By etching the substrate 1, a semiconductor device or the like can be produced.

Known methods can be employed for the etching. For example, dry etching is preferred for etching organic films (such as resist patterns and organic antireflection films). Oxygen plasma etching or etching using $CF_4$ gas or $CHF_3$ gas is preferred, and oxygen plasma etching is particularly desirable.

For etching substrates or organic antireflection films, etching that uses a halogen gas is preferred, etching that uses a fluorocarbon gas is even more preferred, and etching that uses $CF_4$ gas or $CHF_3$ gas is particularly desirable.

<<First Resist Composition>>

A resist composition of the present invention used in the method of forming a resist pattern described above as the first resist composition contains a thermal base generator (hereafter, frequently referred to as a "component (T)").

Here, the term "thermal base generator" refers to a compound that decomposes and generates a base by the action of heat.

In the present invention, as the component (T), those that decompose at a temperature equal to, or higher than 120° C. are preferred. If the temperature at which the component (T) decomposes (namely, the thermal decomposition temperature) is 120° C. or higher, as described above, the PEB treatment in the first patterning step can be conducted at a temperature of not lower than 80° C. (and preferably not lower than 90° C.), thereby improving lithography properties such as sensitivity.

The thermal decomposition temperature of the component (T) is preferably at least 130° C., and is more preferably at least 140° C. There are no particular limitations on the upper limit for the thermal decomposition temperature, although it is preferably not higher than 160° C., more preferably not higher than 155° C., and still more preferably not higher than 150° C., as the baking temperature in the hard bake step can be set to a low level, and also in view of Tg of the resist structures and the like.

As described above, the thermal decomposition temperature of the component (T) can be determined by thermogravimetric analysis (TGA).

There are no particular limitations on the component (T), and any of those which have been proposed conventionally in the field of photosensitive composition or the like can be appropriately selected for use. Examples of such compounds include carbamate derivatives such as 1-methyl-1-(4-biphenylyl)ethyl carbamate and 1,1-dimethyl-2-cyanoethyl carbamate; urea derivatives such as urea and N,N-dimethyl-N'-methylurea; dihydropyridine derivatives such as 1,4-dihydronicotinamide; quaternary ammonium salts of organic silane or organic borane; and dicyandiamide. In addition, other examples include guanidine trichloroacetate, methylguanidine trichloroacetate, potassium trichloroacetate, guanidine phenylsulfonylacetate, guanidine p-chlorophenylsulfonylacetate, guanidine p-methanesulfonylphenylsulfonylacetate, potassium phenylpropiolate, guanidine phenylpropiolate, cesium phenylpropiolate, guanidine p-chlorophenylpropiolate, guanidine p-phenylene-bis-phenylpropiolate, tetramethylammonium phenylsulfonylacetate and tetramethylammonium phenylpropiolate.

Known compounds (photobase generators) which decompose and generate a base upon irradiation can also be used as the component (T). Such compounds are generally decomposable also by the action of heat, and thus may be used as a thermal base generator. Examples of such compounds include triphenylmethanol, photoactive carbamates such as benzyl carbamate and benzoin carbamate; amides such as O-carbamoylhydroxylamide, O-carbamoyloxime, aromatic sulfonamide, alpha-lactam and N-(2-allylethynyl)amide, as well as other amides; oxime esters; α-aminoacetophenone, and cobalt complexes. Specific examples thereof include 2-nitrobenzylcyclohexyl carbamate, triphenylmethanol, o-carbamoylhydroxylamide, o-carbamoyloxime, [[(2,6-dinitrobenzyl)oxy]carbonyl]cyclohexylamine, bis[[(2-nitrobenzyl)oxy]carbonyl]hexane 1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexaaminecobalt(III)tris(triphenylmethylborate) and 2-benzyl-2-dimethylamino-1-(4-morpholinophenyl)-butanone. Further, examples of the photobase generators (or photobase proliferating agents) that are sensitive to i-line, g-line and h-line radiation and radiation having longer wavelengths include compounds disclosed in Japanese Unexamined Patent Application, First Publication No. 2000-330270, Japanese Unexamined Patent Application, First Publication No. 2008-247747, and Japanese Unexamined Patent Application, First Publication No. 2009-19113.

As the component (T), compounds represented by general formula (T1) shown below are preferred in view of thermal decomposition properties. When heat is applied to such compounds, at least the bond between the nitrogen atom in this formula (T1) and the carbon atom of carbonyl group which is adjacent to this nitrogen atom is cleaved to produce amine or ammonia.

[Chemical Formula 1]

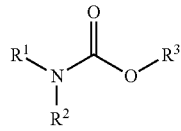

(T1)

In the formula, each of $R^1$ and $R^2$ independently represents a hydrogen atom or a monovalent hydrocarbon group which may contain a hetero atom, wherein $R^1$ and $R^2$ may be mutually bonded to form a cyclic group together with the adjacent nitrogen atom; and $R^3$ represents a monovalent organic group having an aliphatic ring or aromatic ring.

The hetero atom which the hydrocarbon group for $R^1$ and $R^2$ in formula (T1) may have is an atom other than a carbon atom and a hydrogen atom, and examples thereof include an oxygen atom, a nitrogen atom, a sulfur atom and a halogen atom. Examples of halogen atoms include a fluorine atom, a chlorine atom, a bromine atom and an iodine atom.

The hydrocarbon group may be either an aromatic hydrocarbon group or an aliphatic hydrocarbon group.

An aromatic hydrocarbon group is a hydrocarbon group having an aromatic ring.

The aromatic hydrocarbon group for $R^1$ and $R^2$ preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of the aromatic hydrocarbon group include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an arylalkyl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2 carbon atoms, and most preferably 1 carbon atom.

The aromatic hydrocarbon group may have a substituent. For example, some of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

Further, when the aromatic hydrocarbon group has an aliphatic hydrocarbon group bonded to the aromatic ring, a part of the carbon atoms constituting the aliphatic hydrocarbon group may be substituted with a divalent linking group containing a hetero atom, or a part or all of the hydrogen atoms constituting the aliphatic hydrocarbon group may be substituted with a substituent. Examples of the aliphatic hydrocarbon group and the divalent linking group containing a hetero atom include the same aliphatic hydrocarbon groups and the same divalent linking groups containing a hetero atom as those described later, respectively, in connection with the aliphatic hydrocarbon groups for $R^1$ and $R^2$.

Examples of the aromatic hydrocarbon groups in which a part of the carbon atoms constituting the aromatic ring has been substituted with a hetero atom include a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned hetero atom.

Examples of the substituents for substituting the hydrogen atom bonded to the aromatic ring within the aforementioned aromatic hydrocarbon group include an alkyl group, an alkoxy group, a halogen atom, a halogenated alkyl group, a hydroxyalkyl group, a hydroxyl group, an oxygen atom (=O), —COOR", —OC(=O)R", a cyano group, a nitro group, NR"$_2$, —R$^{1'''}$—N(R$^{2'''}$)—C(=O)—O—R$^{3'''}$ and a nitrogen-containing heterocyclic group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkoxy group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

The hydroxyallyl group for the substituent preferably has 1 to 6 carbon atoms, and specific examples thereof include the aforementioned alkyl groups for the substituent in which at least one hydrogen atom has been substituted with a hydroxyl group.

All of R'' in the —COOR'' group, the —OC(=O)R'' group and the —NR''$_2$ group, preferably represents a hydrogen atom or a linear, branched or cyclic alkyl group of 1 to 15 carbon atoms.

When R'' represents a linear or branched alkyl group, it is preferably an alkyl group of 1 to 10 carbon atoms, more preferably an alkyl group of 1 to 5 carbon atoms, and most preferably a methyl group or an ethyl group.

When R'' is a cyclic alkyl group, it preferably has 3 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

Two R'' in the —NR''$_2$ group may be the same or different from each other.

In the —R$^{1''}$—N(R$^{2''}$)—C(=O)—O—R$^{3'}$ group, R$^{1''}$ represents a divalent hydrocarbon group which may contain a hetero atom; R$^{2''}$ represents a hydrogen atom or a monovalent hydrocarbon group which may contain a hetero atom; and R$^{3'}$ represents a monovalent organic group having an aliphatic ring or aromatic ring.

Examples of the hydrocarbon group for R$^{1''}$ include groups in which one hydrogen atom has been removed from the hydrocarbon group for R$^1$ in formula (T1).

As R$^{2''}$ and R$^{3'}$, the same groups as those mentioned for R$^2$ and R$^3$ (described later for R$^3$) in formula (T1), respectively, can be used.

In the —R$^{1''}$—N(R$^{2''}$)—C(=O)—O—R$^{3'}$ group, R$^{2''}$ may be bonded to R$^{1''}$ to form a ring.

Among R$^1$ and R$^2$ in formula (T1), for example, when R$^1$ includes the —R$^{1''}$—N(R$^{2''}$)—C(=O)—O—R$^{3'}$ group as a substituent, R$^{2''}$ in this formula may be bonded to R$^2$ in formula (T1) to form a ring.

Among R$^1$ and R$^2$ in formula (T1), when R$^1$ includes the —R$^{1''}$—N(R$^{2''}$)—C(=O)—O—R$^{3'}$ group as a substituent, the compounds represented by formula (T1) are preferably compounds represented by general formula shown below.

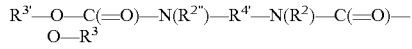

In the formula, R$^2$ to R$^3$ and R$^{2''}$ to R$^{3'}$ are the same as defined above; and R$^{4'}$ represents a divalent aliphatic hydrocarbon group.

Examples of the divalent aliphatic hydrocarbon group for R$^{4'}$ include groups in which one hydrogen atom has been removed from the aliphatic hydrocarbon groups for R$^1$ and R$^2$ that are described later.

The "nitrogen-containing heterocyclic groups" for the aforementioned substituent are groups in which at least one hydrogen atom has been removed from nitrogen-containing heterocyclic compounds containing a nitrogen atom within the ring skeleton. The nitrogen-containing heterocyclic compounds may contain a hetero atom (such as an oxygen atom and a sulfur atom) in addition to carbon atoms and nitrogen atoms within the ring skeleton thereof.

The nitrogen-containing heterocyclic compound may be an aromatic compound or an aliphatic compound. Further, when the compound is an aliphatic compound, it may be saturated or unsaturated. Furthermore, the nitrogen-containing heterocyclic compound may be a monocyclic compound or a polycyclic compound.

The nitrogen-containing heterocyclic compound preferably contains 3 to 30 carbon atoms, more preferably 5 to 30 carbon atoms, and still more preferably 5 to 20 carbon atoms.

Specific examples of monocylic, nitrogen-containing heterocyclic compounds include pyrrole, pyridine, imidazole, pyrazole, 1,2,3-triazole, 1,2,4-triazole, pyrimidine, pyrazine, 1,3,5-triazine, tetrazole, piperidine, piperazine, pyrrolidine and morpholine.

Specific examples of polycyclic, nitrogen-containing heterocyclic compound include quinoline, isoquinoline, indole, pyrrolo[2,3-b]pyridine, indazole, benzimidazole, benzotriazole, carbazole, acridine, 1,5-diazabicyclo[4.3.0]-5-nonene, 1,8-diazabicyclo[5.4.0]-7-undecene, hexamethylenetetramine and 1,4-diazabicyclo[2.2.2]octane.

The nitrogen-containing heterocyclic group may have a substituent. Examples of the substituents include the same substituents as those described above for substituting the hydrogen atom bonded to the aromatic ring within the aforementioned aromatic hydrocarbon group.

An "aliphatic hydrocarbon group" refers to a hydrocarbon group that has no aromaticity.

The aliphatic hydrocarbon group for R$^1$ and R$^2$ may be either saturated (alkyl group) or unsaturated, but in general, the aliphatic hydrocarbon group is preferably saturated. Further, the aliphatic hydrocarbon group may be any one of linear, branched or cyclic group, or may be a combination of these groups. Examples of such combinations include groups in which a cyclic aliphatic hydrocarbon group is bonded to the terminal of a liner or branched aliphatic hydrocarbon group, and groups in which a cyclic aliphatic hydrocarbon group is interposed within a liner or branched aliphatic hydrocarbon group.

The linear or branched alkyl group preferably has 1 to 20 carbon atoms, more preferably 1 to 15 carbon atoms, and most preferably 1 to 10 carbon atoms.

Specific examples of the linear alkyl group include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

Specific examples of the branched alkyl group include a 1-methylethyl group (iso-propyl group), a 1-methylpropyl group, a 2-methylpropyl group, a 1-methylbutyl group, a 2-methylbutyl group, a 3-methylbutyl group, a 1-ethylbutyl group, a 2-ethylbutyl group, a tert-butyl group, a 1-methylpentyl group, a 2-methylpentyl group, a 3-methylpentyl group and a 4-methylpentyl group.

The cyclic alkyl group may be a monocyclic group or a polycyclic group, and preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples of the cyclic alkyl group include groups in which one hydrogen atom has been removed from a monocycloalkane, and groups in which one hydrogen atom has been removed from a polycycloalkane such as a bicycloalkane, tricycloalkane or tetracycloalkane. More specific examples include groups in which one hydrogen atom has been removed from a monocycloalkane, such as a cyclopentyl group and a cyclohexyl group. Further, examples of the groups in which one hydrogen atom has been removed from a polycycloalkane include an adamantyl group, a norbornyl group, an isobornyl group, a tricyclodecyl group and a tetracyclododecyl group.

The aliphatic hydrocarbon group may have a substituent. For example, a part of the carbon atoms constituting the aliphatic hydrocarbon group may be substituted with a divalent linking group containing a hetero atom, or a part or all of the hydrogen atoms constituting the aliphatic hydrocarbon group may be substituted with a substituent.

With respect to this divalent linking group containing a hetero atom, examples of the hetero atom include the same hetero atoms as those described above for substituting a part of the carbon atoms constituting the aromatic ring within the aforementioned aromatic hydrocarbon group. Examples of the divalent linking group containing a hetero atom include divalent non-hydrocarbon groups containing a hetero atom such as —O—, —C(=O)—, —C(=O)—O—, a carbonate bond (—O—C(O)—O—), —S(=O)$_2$—O—, —NH—, —NR$^{04}$— (R$^{04}$ represents a substituent such as an alkyl group or an acyl group), —NH—C(=O)— and =N—. Further, combinations of these "divalent non-hydrocarbon groups containing a hetero atom" with divalent aliphatic hydrocarbon groups can also be used. Examples of the divalent aliphatic hydrocarbon group include groups in which one hydrogen atom has been removed from the aliphatic hydrocarbon group described above, and a linear or branched aliphatic hydrocarbon group is preferable.

Examples of the substituents for the aliphatic hydrocarbon group in the latter example include the same substituents as those described above for substituting the hydrogen atom bonded to the aromatic ring within the aforementioned aromatic hydrocarbon group.

In the aforementioned general formula (T1), R$^1$ and R$^2$ may be mutually bonded to form a cyclic group together with the adjacent nitrogen atom.

This cyclic group may be either an aromatic cyclic group or an aliphatic cyclic group. When the cyclic group is an aliphatic cyclic group, it may be either saturated or unsaturated, but in general, the aliphatic cyclic group is preferably saturated.

This cyclic group may contain another nitrogen atom within the ring skeleton thereof, in addition to the nitrogen atom to which R$^1$ and R$^2$ are bonded. Further, the cyclic group may contain a hetero atom (such as an oxygen atom and a sulfur atom) in addition to carbon atoms and nitrogen atoms within the ring skeleton thereof.

This cyclic group may be a monocyclic group or a polycyclic group.

When the cyclic group is monocylic, the number of atoms constituting the skeleton of this cyclic group is preferably 4 to 7, and more preferably 5 to 6. In other words, this cyclic group is preferably a 4 to 7-membered ring, and more preferably a 5 to 6-membered ring. Specific examples of the monocylic group include groups in which the hydrogen atom has been removed from an —NH— moiety within the ring structure of a monocyclic heterocyclic compound, such as piperidine, pyrrolidine, morpholine, pyrrole, imidazole, pyrazole, 1,2,3-triazole, 1,2,4-triazole, tetrazole and piperazine.

When the cyclic group is polycylic, this cyclic group is preferably dicyclic, tricyclic or tetracyclic, and also the number of atoms constituting the skeleton of this cyclic group is preferably 7 to 12, and more preferably 7 to 10. Specific examples of the polycylic, nitrogen-containing heterocyclic group include groups in which the hydrogen atom has been removed from an —NH— moiety within the ring structure of a polycyclic heterocyclic compound, such as indole, isoindole, carbazole, benzimidazole, indazole and benzotriazole.

This cyclic group may have a substituent. Examples of the substituents include the same substituents as those described above for substituting the hydrogen atom bonded to the aromatic ring within the aforementioned aromatic hydrocarbon group.

As the cyclic group formed by R$^1$ and R$^2$ bonded to each other together with the adjacent nitrogen atom, groups represented by general formula (II) shown below are particularly desirable.

[Chemical Formula 2]

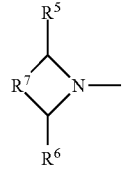

(II)

In the formula, each of R$^5$ and R$^6$ independently represents a hydrogen atom or an alkyl group; and R$^7$ represents a linear alkylene group of 1 to 3 carbon atoms in which carbon atoms may be substituted with an oxygen atom or a nitrogen atom, and hydrogen atoms may be substituted with a substituent.

In formula (II), as the alkyl group for R$^5$ and R$^6$, the same alkyl groups as those described above in connection with the aliphatic hydrocarbon group for R$^1$ and R$^2$ can be used, and a methyl group is particularly desirable.

Examples of the alkylene group for R$^7$ in which carbon atoms may be substituted with an oxygen atom or a nitrogen atom include —CH$_2$—, —CH$_2$—O—, —CH$_2$NH—, —CH$_2$—CH$_2$—, —CH$_2$—O—CH$_2$—, —CH$_2$—NH—CH$_2$—, —CH$_2$—CH$_2$—CH$_2$—, —CH$_2$—CH$_2$—O—CH$_2$— and —CH$_2$—CH$_2$—NH—CH$_2$—.

Examples of the substituents for substituting the hydrogen atom of the alkylene group include the same substituents as those described above for substituting the hydrogen atom bonded to the aromatic ring within the aforementioned aromatic hydrocarbon group. The hydrogen atom substituted with this substituent may be a hydrogen atom boned to a carbon atom or a hydrogen atom boned to a nitrogen atom.

In formula (T1), R$^3$ represents a monovalent organic group having an aliphatic ring or aromatic ring.

This aliphatic ring may be a monocyclic group or a polycyclic group, although a polycyclic group is preferred in view of compatibility with other components.

This aliphatic ring preferably has 3 to 40 carbon atoms, more preferably 6 to 40 carbon atoms, still more preferably 6 to 38 carbon atoms, and most preferably 6 to 35 carbon atoms.

The aliphatic ring may be a hydrocarbon ring or a heterocyclic ring. Further, the aliphatic ring may be either saturated or unsaturated, but in general, the aliphatic ring is preferably saturated.

Examples of the saturated aliphatic hydrocarbon group include a monocycloalkane such as cyclopentane, cyclohexane, cycloheptane or cyclooctane; and a polycycloalkane such as bicycloalkane, tricycloalkane or tetracycloalkane. Specific examples of polycycloalkane include adamantane, norbornane, isobornane, tricyclodecane and tetracyclododecane.

As the saturated aliphatic heterocyclic ring, for example, those in which the carbon atoms within the ring skeleton of the above-mentioned aliphatic hydrocarbon ring have been substituted with hetero atoms such as nitrogen atoms, oxygen atoms and sulfur atoms can be used.

The aforementioned aromatic ring preferably has 3 to 40 carbon atoms, and may be either a hydrocarbon ring or a heterocyclic ring.

Examples of this aromatic hydrocarbon ring include benzene, biphenyl, indene, naphthalene, fluorene, anthracene and phenanthrene. Among these, benzene or anthracene is particularly desirable in view of improving the resistance to exposure. Further, naphthalene is also preferred, as the absorption for the radiation having a wavelength of 193 nm becomes minimal.

As the aromatic heterocyclic ring, for example, those in which the carbon atoms within the ring skeleton of the above-mentioned aromatic hydrocarbon ring have been substituted with hetero atoms such as nitrogen atoms, oxygen atoms and sulfur atoms can be used.

These aliphatic rings or aromatic rings may have a substituent. Examples of the substituents include the same substituents as those described above for substituting the hydrogen atom bonded to the aromatic ring within the aromatic hydrocarbon group with respect to $R^1$ and $R^2$. However, when this substituent is the —$R^{1''}$—$N(R^{2''})$—$C(=O)$—$O$—$R^{3'}$ group, the case where this $R^{3'}$ represents the —$R^{1''}$—$N(R^{2''})$—$C(=O)$—$O$—$R^{3'}$ group is excluded. The hydrogen atom substituted with this substituent may be a hydrogen atom boned to a carbon atom or a hydrogen atom boned to a hetero atom such as a nitrogen atom.

As the substituent included within this aliphatic ring or aromatic ring, a nitro group is particularly desirable in view of the generation efficiency of thermal base generator.

Examples of the organic group for $R^3$ include monovalent aliphatic cyclic groups or aromatic cyclic groups, and groups constituted of these aliphatic cyclic groups or aromatic cyclic groups and divalent linking groups.

Examples of these aliphatic cyclic groups or aromatic cyclic groups include groups in which one hydrogen atom has been removed from the aforementioned aliphatic rings or aromatic rings.

Examples of the divalent linking group include divalent aliphatic hydrocarbon groups and divalent linking groups containing a hetero atom.

Examples of the divalent aliphatic hydrocarbon group include groups in which one hydrogen atom has been removed from the aliphatic hydrocarbon groups described above in connection with $R^1$ and $R^2$. As the divalent aliphatic hydrocarbon group, a saturated aliphatic hydrocarbon group (alkylene group) is particularly desirable. Examples of the alkylene group include groups in which one hydrogen atom has been removed from the alkyl groups described above in connection with $R^1$ and $R^2$. As the alkylene group, a linear or branched alkylene group is preferable, and a methylene group, an alkylmethylene group, an ethylene group or an alkylethylene group is particularly desirable. The alkyl group within this alkylmethylene group or alkylethylene group preferably has 1 to 4 carbon atoms, more preferably 1 or 2 carbon atoms, and most preferably one carbon atom.

Examples of the divalent linking group containing a hetero atom include the same divalent linking groups containing a hetero atom as those described above in connection with the aliphatic hydrocarbon groups. Of these, combinations of divalent non-hydrocarbon groups containing a hetero atom with divalent aliphatic hydrocarbon groups are preferable, combinations of —$S(=O)_2$— and linear or branched aliphatic hydrocarbon groups are more preferable, and combinations of —$S(=O)_2$— and alkylene groups are particularly desirable.

As $R^3$, a group represented by general formula (I) shown below is particularly desirable.

[Chemical Formula 3]

-Q-$R^4$ (I)

In the formula, $R^4$ represents an aliphatic cyclic group or an aromatic cyclic group of 6 to 40 carbon atoms which may have a substituent; and Q represents an alkylene group which may contain —$S(=O)_2$— or a single bond.

In formula (I), as the aliphatic cyclic group or aromatic cyclic group for $R^4$, the same groups as those described above for $R^3$ can be used.

As the alkylene group for Q, the same alkylene groups as those mentioned above for the divalent aliphatic hydrocarbon group within the description for the divalent linking groups can be used.

As Q, —$CH_2$—, —$CH(CH_3)$—, —$CH_2$—$S(=O)_2$—, —$CH(CH_3)$—$CH_2$—$S(=O)_2$— or a single bond is preferable, and —$CH_2$— or a single bond is particularly desirable.

As the component (T1), compounds represented by general formula (T1-1) shown below are particularly desirable. Of these, those selected from the compounds represented by any one of general formulas (T1-11) to (T1-13) shown below are preferred.

[Chemical Formula 4]

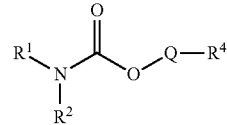

(T1-1)

In the formula, each of $R^1$ and $R^2$, $R^4$ and Q is the same as defined above.

[Chemical Formula 5]

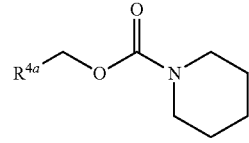

(T1-11)

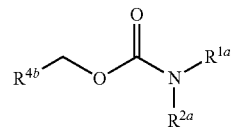

(T1-12)

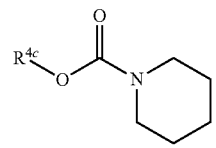

(T1-13)

In the formulas, each of $R^{4a}$ to $R^{4c}$ independently represents an aliphatic cyclic group or an aromatic cyclic group of 6 to 40 carbon atoms which may have a substituent; and each of $R^{1a}$ and $R^{2a}$ independently represents an alkyl group of 1 to 5 carbon atoms.

As $R^{4a}$ to $R^{4c}$ in formulas (T1-11) to (T1-13), the same groups as those mentioned above for $R^4$ can be used.

Of these, as $R^{4a}$ and $R^{4b}$, an aliphatic polycyclic group or an aromatic polycyclic group is preferred, and an adamantyl group or an anthryl group is particularly desirable.

As $R^{4c}$, an aromatic cyclic group having at least a nitro group as a substituent is preferred, and a nitrophenyl group is particularly desirable.

Each of $R^{1a}$ and $R^{2a}$ is preferably a linear or branched alkyl group, and more preferably a methyl group or an ethyl group.

The lower the absorption coefficient of the component (T) for the wavelength of an exposure light source (for example, 193 nm in the case of ArF excimer lasers) used in exposure of the first resist film, the better, because the sensitivity, exposure margin (EL) or the like during the first patterning step improves. There are no particular limitations on the lower limit for this absorption coefficient, and lower values are more preferable.

The absorption coefficient of the component (T) can be determined using a vacuum ultraviolet spectrophotometer.

As the component (T) included in the resist composition of the present invention, one type of component may be used alone, or two or more types may be used in combination.

The amount of the component (T) within the resist composition is preferably from 0.01 to 50 parts by weight, more preferably from 0.1 to 20 parts by weight, and still more preferably from 1 to 10 parts by weight, relative to 100 parts by weight of the base component included in the resist composition. By ensuring that the amount is at least as large as the lower limit of the above-mentioned range, pattern thinning and elimination of the first resist pattern or the like during the second patterning step can be suppressed, and the double patterning process can be conducted favorably. It is thought that this is because when the second resist film formed on top of the first resist pattern, which is obtained using this resist composition, is subjected to exposure and PEB treatment, the acid generated from the acid generator component within the second resist film or first resist pattern is scavenged satisfactorily. On the other hand, by ensuring that the amount of the component (T) is not more than the upper limit of the above-mentioned range, the exposure margin or depth of focus of the first resist composition improves.

Here, the term "base component" refers to an organic compound capable of forming a film. A base component (for example, the component (A) described later) is usually blended in the resist composition as a film forming component. As the base component, an organic compound having a molecular weight of 500 or more is typically used. When the organic compound has a molecular weight of 500 or more, the film-forming ability is improved, and a resist pattern of nano level can be easily formed. The base component will be described later in detail in the section for the component (A).

The resist composition of the present invention may have the same composition as those of the chemically amplified resist compositions which have been proposed, except the inclusion of the component (T). For example, those prepared by adding the component (T) to known chemically amplified resist compositions can be used.

This chemically amplified resist composition may be a positive resist composition which exhibits increased solubility in an alkali developing solution upon exposure, or a negative resist composition which exhibits reduced solubility in an alkali developing solution upon exposure, although a positive resist composition is preferred as the usability of the present invention can be enhanced.

The chemically amplified resist composition generally includes a base component (A) (hereafter, referred to as "component (A)") which exhibits changed solubility in an alkali developing solution by the action of acid and an acid generator component (B) (hereafter, referred to as "component (B)") which generates acid upon exposure. In the chemically amplified resist composition, acid is generated from the component (B) upon exposure, and the solubility of the component (A) in an alkali developing solution changes by the action of this acid.

<Component (A)>

As described above, the term "base component" refers to an organic compound capable of forming a film, and preferably refers to an organic compound having a molecular weight of 500 or more.

The "organic compounds having a molecular weight of 500 or more" which can be used as the base component can be broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

As a polymer, any of those which have a molecular weight of 1,000 or more is generally used. Hereafter, the term "resin" or "polymeric compound" refers to a polymer having a molecular weight of 1,000 or more. In the case of the polymer, the "molecular weight" refers to the polystyrene-equivalent weight average molecular weight value determined by gel permeation chromatography (GPC).

The component (A) may be a resin component which exhibits changed solubility in an alkali developing solution under the action of acid, a low molecular weight compound which exhibits changed solubility in an alkali developing solution under the action of acid, or a mixture of these components.

In those cases where the first resist composition in the present invention is a positive resist composition, a base component (hereafter referred to as "component (A1)") that exhibits increased solubility in an alkali developing solution under the action of acid is used as the component (A). The component (A1) is substantially insoluble in an alkali developing solution prior to exposure, but when acid is generated from the component (B) upon exposure, the action of the acid causes an increase in the solubility of the component (A) in an alkali developing solution. Therefore, in the first patterning step, by conducting selective exposure of a resist film formed by applying the positive resist composition onto a substrate, the exposed portions change from an insoluble state to a soluble state in an alkali developing solution, whereas the unexposed portions remain substantially insoluble in an alkali developing solution, and hence, a resist pattern can be formed by alkali developing.

The component (A1) may be a resin component that exhibits increased solubility in an alkali developing solution under the action of acid (hereafter, referred to as "component (A1-1)"), a low molecular weight compound that exhibits increased solubility in an alkali developing solution under the action of acid (hereafter, referred to as "component (A1-2)"), or a mixture of the component (A1-1) and the component (A1-2).

In the present invention, it is particularly desirable that the component (A) include the component (A1-1).

[Component (A1-1)]

As the component (A1-1), any of the base resins which have been proposed for conventional chemically amplified, positive resist compositions designed for KrF, positive resist compositions for ArF, positive resist compositions for EB, positive resist compositions for EUV and the like can be appropriately selected in accordance with the type of the exposure light source used during formation of resist patterns.

Specific examples of the aforementioned base resins include those in which hydrophilic groups within the resins having hydrophilic groups (such as hydroxyl groups and carboxyl groups) are protected with a substituent containing an acid dissociable, dissolution inhibiting group.

Examples of the resins having a hydrophilic group include novolak resins, polyhydroxystyrene (PHS) based resins having structural units derived from a hydroxystyrene, such as polyhydroxystyrene and hydroxystyrene-styrene copolymers, and acrylic resins having structural units derived from an acrylate ester. These resins may be used either individually, or in combination of two or more different resins.

An "acid dissociable, dissolution inhibiting group" refers to a group having an alkali dissolution-inhibiting effect that renders the entire component (A1-1) insoluble in an alkali developing solution prior to dissociation, and then following dissociation by the action of acid generated from the component (B) upon exposure, increases the solubility of the entire component (A1-1) in the alkali developing solution. As the "acid dissociable, dissolution inhibiting group", for example, the same acid dissociable, dissolution inhibiting groups as those described later in connection with the structural unit (a1) can be used.

The substituents containing an acid dissociable, dissolution inhibiting group may be those constituted only of an acid dissociable, dissolution inhibiting group, or may be those constituted of an acid dissociable, dissolution inhibiting group and another group other than the acid dissociable, dissolution inhibiting group.

In the description and claims of the present invention, the expression "structural unit derived from a hydroxystyrene" describes a structural unit formed by cleavage of the ethylenic double bond of a hydroxystyrene.

The term "hydroxystyrene" is a generic term that includes hydroxystyrenes having a hydrogen atom bonded to the carbon atom on the α-position (i.e., the carbon atom to which the phenyl group is bonded), and hydroxystyrenes having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group.

A "structural unit derived from an acrylate ester" describes a structural unit formed by cleavage of the ethylenic double bond of an acrylate ester.

The term "acrylate ester" is a generic term that includes acrylate esters having a hydrogen atom bonded to the carbon atom on the α-position (i.e., the carbon atom to which the carbonyl group within the acrylic acid is bonded), and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group. A carbon atom on the α-position of an acrylate ester refers to the carbon atom having the carbonyl group within the acrylic acid bonded thereto, unless specified otherwise.

With respect to the hydroxystyrene or acrylate ester, the alkyl group for the substituent at the α-position is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group for the substituent at the α-position include groups in which some or all of the hydrogen atoms of the aforementioned "alkyl group for the substituent at the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group for the substituent at the α-position include groups in which some or all of the hydrogen atoms of the aforementioned "alkyl group for the substituent at the α-position" are substituted with hydroxyl groups. The number of hydroxyl groups within the hydroxyalkyl group is preferably 1 to 5, and most preferably 1.

It is preferable that a hydrogen atom, an alkyl group of 1 to 5 carbon atoms or a halogenated alkyl group of 1 to 5 carbon atoms is bonded to the α-position of the hydroxystyrene or acrylate ester, and more preferably a hydrogen atom, an alkyl group of 1 to 5 carbon atoms or a fluorinated alkyl group of 1 to 5 carbon atoms. In terms of industrial availability, a hydrogen atom or a methyl group is particularly desirable.

In the present invention, the component (A1-1) preferably includes a structural unit derived from an acrylate ester (such as structural units (a1) to (a4) and (a5') described later).

The amount of the structural unit derived from an acrylate ester within the component (A1-1), based on the combined total of all the structural units that constitute the component (A1-1), is preferably at least 50 mol %, more preferably 80 mol % or greater, and may also be 100 mol %.

It is particularly desirable that the component (A1-1) have a structural unit (a1) derived from an acrylate ester containing an acid dissociable, dissolution inhibiting group.

Further, it is preferable that the component (A1-1) have at least one structural unit (a2) selected from the group consisting of structural units derived from an acrylate ester containing a lactone-containing cyclic group, and structural units derived from an acrylate ester containing a —$SO_2$-containing cyclic group, as well as the structural unit (a1).

Furthermore, it is preferable that the component (A1-1) have a structural unit (a3) derived from an acrylate ester containing a polar group-containing aliphatic hydrocarbon group, as well as the structural unit (a1), or the structural unit (a1) and the structural unit (a2).

Structural Unit (a1):

The structural unit (a1) is a structural unit derived from an acrylate ester containing an acid dissociable, dissolution inhibiting group.

An "acid dissociable, dissolution inhibiting group" refers to a group having an alkali dissolution-inhibiting effect that renders the entire component (A1-1) insoluble in an alkali developing solution prior to dissociation, and then following dissociation by the action of acid generated from the component (B) upon exposure, increases the solubility of the entire component (A1-1) in the alkali developing solution.

As the acid dissociable, dissolution inhibiting group in the structural unit (a1), any of the groups that have been proposed as acid dissociable, dissolution inhibiting groups for the base resins of chemically amplified resists can be used. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known. Here, the term "(meth)acrylate ester" is a generic term that includes either or both of the acrylate ester having a hydrogen atom bonded to the α-position and the methacrylate ester having a methyl group bonded to the α-position.

A "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

Here, the term "aliphatic branched" refers to a branched structure having no aromaticity. The "aliphatic branched acid dissociable, dissolution inhibiting group" is not limited to structures constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable, dissolution inhibiting group, for example, a group represented by the formula —C(R$^{71}$)(R$^{72}$)(R$^{73}$) can be given (in the formula, each of R$^{71}$ to R$^{73}$ independently represents a linear alkyl group of 1 to 5 carbon atoms). The group represented by the formula —C(R$^{71}$)(R$^{72}$)(R$^{73}$) preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

In the "aliphatic cyclic group-containing acid dissociable, dissolution inhibiting group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring structure of the "aliphatic cyclic group" exclusive of substituents is not limited to structures constituted from only carbon and hydrogen (not limited to hydrocarbon groups), but is preferably a hydrocarbon group. Further, the "hydrocarbon group" may be either saturated or unsaturated, but is preferably saturated.

Furthermore, the "aliphatic cyclic group" is preferably a polycyclic group.

As the aliphatic cyclic groups, for example, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Further, these groups in which one or more hydrogen atoms have been removed from a monocycloalkane and groups in which one or more hydrogen atoms have been removed from a polycycloalkane may have part of the carbon atoms constituting the ring replaced with an ethereal oxygen atom (—O—).

Examples of aliphatic cyclic group-containing acid dissociable, dissolution inhibiting groups include:
(i) a monovalent aliphatic cyclic group in which a substituent (a group or an atom other than hydrogen) is bonded to the carbon atom on the ring skeleton to which an atom adjacent to the acid dissociable, dissolution inhibiting group (e.g., "—O—" within "—C(=O)—O— group") is bonded to form a tertiary carbon atom; and
(ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable, dissolution inhibiting group on the ring skeleton of the aliphatic cyclic group, an alkyl group can be mentioned. Examples of the alkyl group include the same groups as those represented by R$^{14}$ in formulas (1-1) to (1-9) described later.

Specific examples of the group (i) include groups represented by general formulas (1-1) to (1-9) shown below.

Specific examples of the group (ii) include groups represented by general formulas (2-1) to (2-6) shown below.

[Chemical Formula 6]

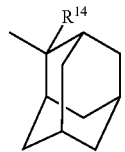

(1-1)

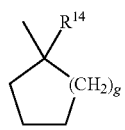

(1-2)

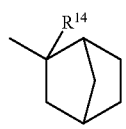

(1-3)

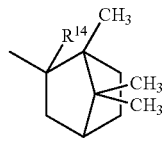

(1-4)

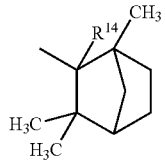

(1-5)

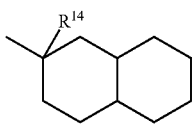
(1-6)

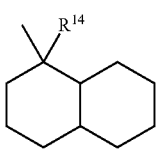
(1-7)

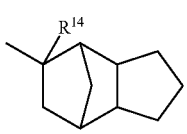
(1-8)

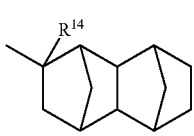
(1-9)

In the formulas above, R$^{14}$ represents an alkyl group; and g represents an integer of 0 to 8.

[Chemical Formula 7]

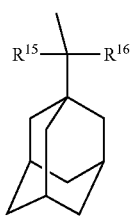
(2-1)

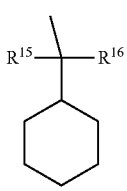
(2-2)

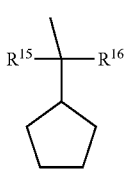
(2-3)

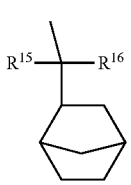
(2-4)

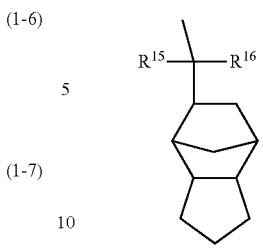
(2-5)

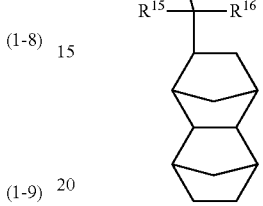
(2-6)

In the formulas above, each of R$^{15}$ and R$^{16}$ independently represents an alkyl group.

As the alkyl group for R$^{14}$, a linear or branched alkyl group is preferable.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably 1 to 3, and still more preferably 1 or 2.

As the alkyl group for R$^{15}$ and R$^{16}$, the same alkyl groups as those for R$^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 8]

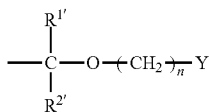

(p1)

In the formula, $R^{1'}$ and $R^{2'}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1) above, n is preferably an integer of 0 to 2, more preferably 0 or 1, and most preferably 0.

As the alkyl group for $R^{1'}$ and $R^{2'}$, the same alkyl groups as those described above as the substituent on the α-position of the aforementioned acrylate ester can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 9]

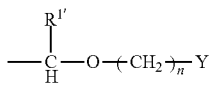

(p1-1)

In the formula, $R^{1'}$, n and Y are the same as defined above.

As the alkyl group for Y, the same alkyl groups as those described above for the substituent on the α-position of the aforementioned acrylate ester can be mentioned.

As the aliphatic cyclic group for Y, any of the aliphatic monocyclic/polycyclic groups which have been proposed for conventional ArF resists and the like can be appropriately selected for use. For example, the same aliphatic cyclic groups described above in connection with the "acid dissociable, dissolution inhibiting group containing an aliphatic cyclic group" can be used.

Further, as the acetal-type, acid dissociable, dissolution inhibiting group, groups represented by general formula (p2) shown below can also be used.

[Chemical Formula 10]

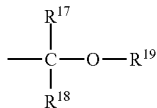

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the $R^{17}$ group is bonded to the $R^{19}$ group to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the $R^{19}$ group may be bonded to the $R^{17}$ group.

In such a case, a cyclic group is formed by $R^{17}$, $R^{19}$, the oxygen atom having $R^{19}$ bonded thereto, and the carbon atom having the oxygen atom and $R^{17}$ bonded thereto.

Such a cyclic group is preferably a 4- to 7-membered ring, and more preferably a 4- to 6-membered ring. Specific examples of the cyclic group include tetrahydropyranyl group and tetrahydrofuranyl group.

Specific examples of the structural unit (a1) include a structural unit represented by general formula (a1-0-1) shown below and a structural unit represented by general formula (a1-0-2) shown below.

[Chemical Formula 11]

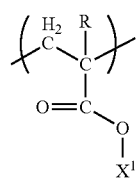

(a1-0-1)

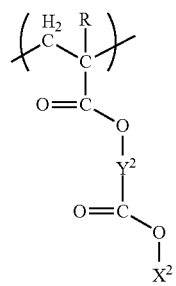

(a1-0-2)

In the formulas, R represents a hydrogen atom, an alkyl group of 1 to 5 carbon atoms or a halogenated alkyl group of 1 to 5 carbon atoms; $X^1$ represents an acid dissociable, dissolution inhibiting group; $Y^2$ represents a divalent linking group; and $X^2$ represents an acid dissociable, dissolution inhibiting group.

In general formula (a1-0-1), the alkyl group and the halogenated alkyl group for R are respectively the same as defined for the alkyl group and the halogenated alkyl group for the substituent on the α-position of the aforementioned alkylester. R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above. $X^2$ is the same as defined for $X^1$ in general formula (a1-0-1).

There are no particular limitations on the divalent linking group for $Y^2$, and examples thereof include an alkylene group, a divalent aliphatic cyclic group, a divalent aromatic cyclic group, and a divalent linking group containing a hetero atom.

When $Y^2$ represents an alkylene group, it preferably has 1 to 10 carbon atoms, more preferably 1 to 6 carbon atoms, still more preferably 1 to 4 carbon atoms, and most preferably 1 to 3 carbon atoms.

When $Y^2$ represents a divalent aliphatic cyclic group, as the aliphatic cyclic group, the same aliphatic cyclic groups as those described above in connection with the "aliphatic cyclic group-containing acid dissociable, dissolution inhibiting groups" can be used, except that two hydrogen atoms have been removed therefrom. As the aliphatic cyclic group for $Y^2$, groups in which two or more hydrogen atoms have been removed from cyclopentane, cyclohexane, norbornane, isobornane, adamantane, tricyclodecane or tetracyclododecane are particularly desirable.

When $Y^2$ represents a divalent aromatic cyclic group, as the aromatic cyclic group, groups in which two hydrogen atoms have been removed from the aromatic hydrocarbon rings which may have a substituent may be used. The aromatic hydrocarbon ring preferably has 6 to 15 carbon atoms. Examples thereof include a benzene ring, a naphthalene ring, a phenanthrene ring and an anthracene ring. Among these, a benzene ring or a naphthalene ring is particularly desirable.

Examples of substituents which an aromatic hydrocarbon ring may have include a halogen atom, an alkyl group, an alkoxy group, a halogenated lower alkyl group, and an oxygen atom (=O). Examples of the halogen atom include a fluorine atom, a chlorine atom, an iodine atom and a bromine atom.

When $Y^2$ represents a divalent linking group containing a hetero atom, examples of the divalent linking group containing a hetero atom include —O—, —C(=O)—O—, —C(=O)—, —O—C(=O)—O—, —C(=O)—NH—, —NH— (wherein H may be substituted with a substituent such as an alkyl group or acyl group or the like), —S—, —S(=O)$_2$—O—, a group represented by the formula -A-O—B—, a group represented by the formula -A-O—C(=O)—B—, and a group represented by the formula -[A-C(=O)—O]$_m$—B—. Here, in the formulas -A-O—B—, -A-O—C(=O)—B—, and -[A-C(=O)—O]$_m$—B—, each of A and B independently represents a divalent hydrocarbon group which may have a substituent, —O— represents an oxygen atom, and m represents an integer of 0 to 3.

When $Y^2$ represents —NH— group, this H may be substituted with a substituent such as an alkyl group or an acyl group. The substituent (an alkyl group, an acyl group or the like) preferably has 1 to 10 carbon atoms, more preferably 1 to 8 carbon atoms, and most preferably 1 to 5 carbon atoms.

When $Y^2$ is a group represented by formula -A-O—B—, -A-O—C(=O)—B— or -[A-C(=O)—O]$_m$—B—, each of A and B independently represents a divalent hydrocarbon group which may have a substituent. The description that the hydrocarbon group "may have a substituent" means that some or all of the hydrogen atoms within the hydrocarbon group may be substituted with an atom other than a hydrogen atom or with a group.

The hydrocarbon group for A may be either an aliphatic hydrocarbon group, or an aromatic hydrocarbon group. An "aliphatic hydrocarbon group" refers to a hydrocarbon group that has no aromaticity. The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be given.

The linear or branched aliphatic hydrocarbon group preferably has 1 to 10 carbon atoms, more preferably 1 to 8 carbon atoms, still more preferably 2 to 5 carbon atoms, and most preferably 2 carbon atoms.

As a linear aliphatic hydrocarbon group, a linear alkylene group is preferable, and specific examples include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; alkyltrimethylene groups such as —CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

These linear or branched aliphatic hydrocarbon groups may or may not have a substituent. Examples of the substituent include a fluorine atom, a fluorinated alkyl group of 1 to 5 carbon atoms, and an oxygen atom (=O).

Examples of the hydrocarbon group containing a ring in the structure thereof include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an aforementioned chain-like aliphatic hydrocarbon group, or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocycle group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include a lower alkyl group of 1 to 5 carbon atoms, a fluorine atom, a fluorinated lower alkyl group of 1 to 5 carbon atoms, and an oxygen atom (=O).

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A-C(=O)—O]$_m$—B—, m represents an integer of 0 to 3, preferably an integer of 0 to 2, more preferably 0 or 1, and most preferably 1.

Specific examples of the structural unit (a1) include structural units represented by general formulas (a1-1) to (a1-4) shown below.

[Chemical Formula 12]

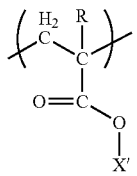
(a1-1)

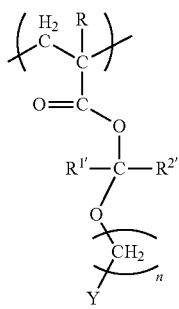
(a1-2)

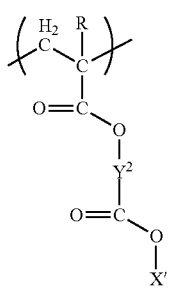
(a1-3)

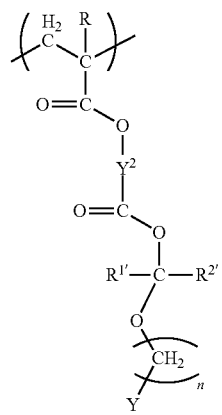
(a1-4)

In the formulas, R, R$^{1'}$, R$^{2'}$, n, Y and Y$^2$ are the same as defined above; and X' represents a tertiary alkyl ester-type acid dissociable, dissolution inhibiting group.

In the formulas, examples of the tertiary alkyl ester-type acid dissociable, dissolution inhibiting group for X' include the same tertiary alkyl ester-type acid dissociable, dissolution inhibiting groups as those described above.

As R$^{1'}$, R$^{2'}$, n and Y are respectively the same as defined for R$^{1'}$, R$^{2'}$, n and Y in general formula (p1) described above in connection with the "acetal-type acid dissociable, dissolution inhibiting group".

As examples of Y$^2$, the same groups as those described above for Y$^2$ in general formula (a1-0-2) can be given.

Specific examples of structural units represented by general formula (a1-1) to (a1-4) are shown below.

In the formulas shown below, R$^\alpha$ represents a hydrogen atom, a methyl group or a trifluoromethyl group.

[Chemical Formula 13]

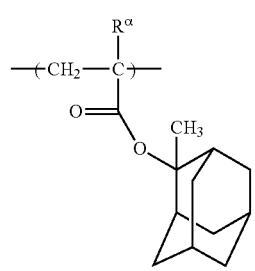
(a1-1-1)

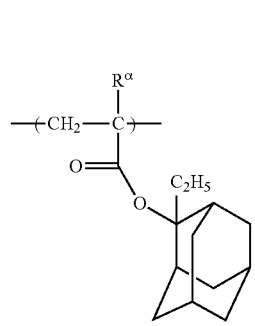
(a1-1-2)

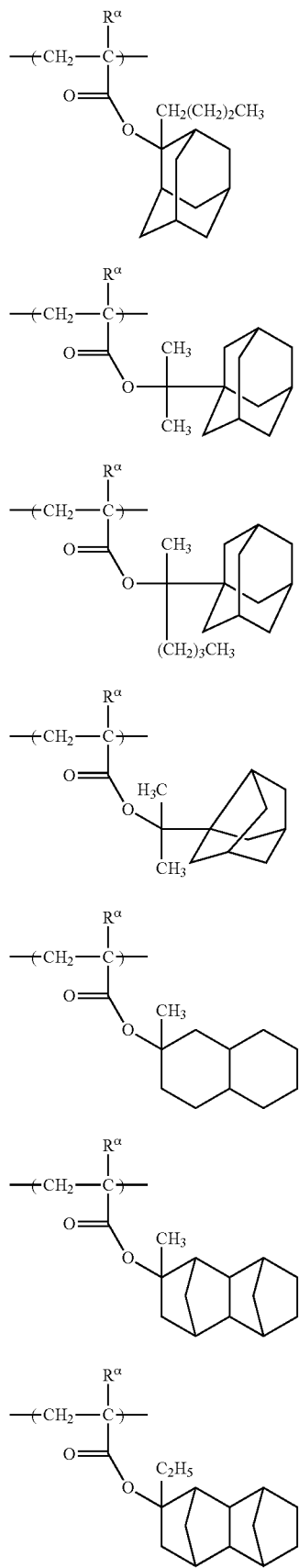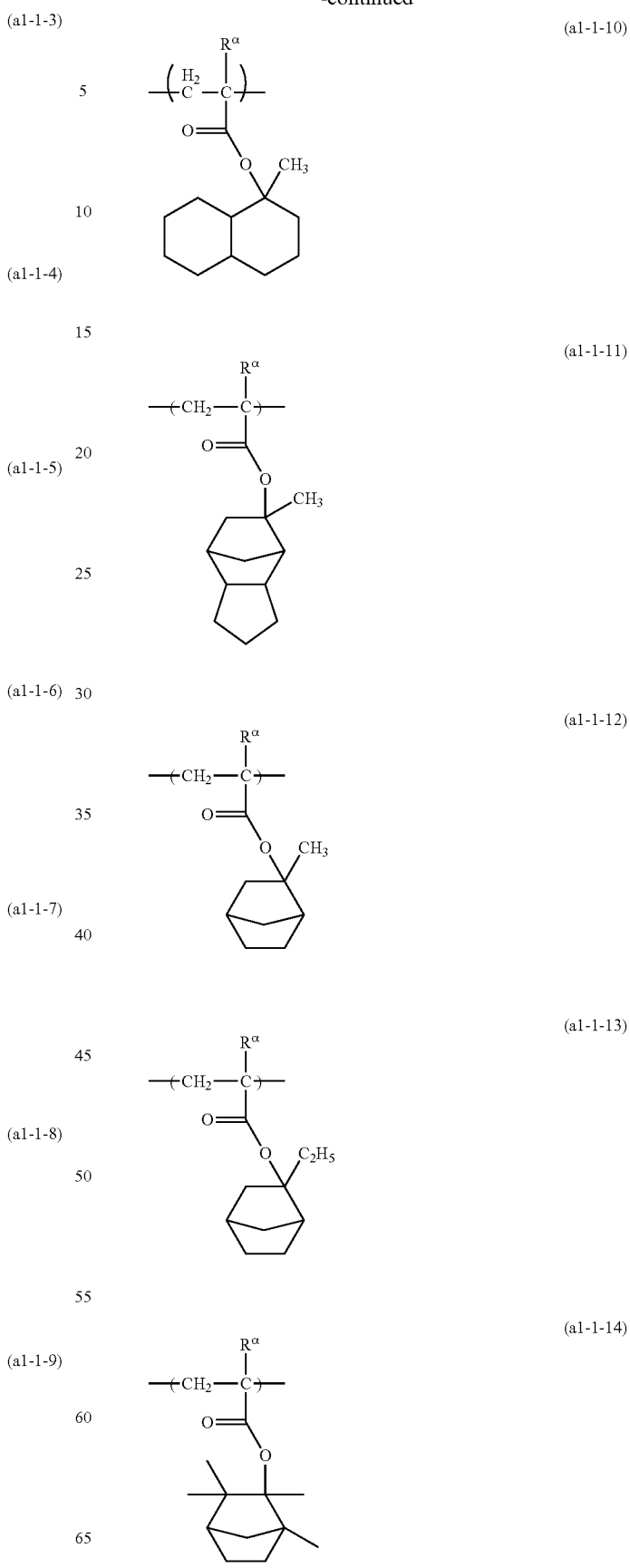

(a1-1-15) 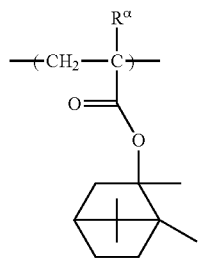
(a1-1-16) 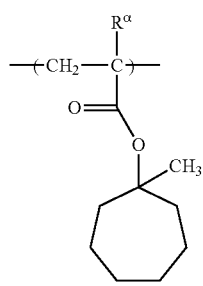
(a1-1-17) 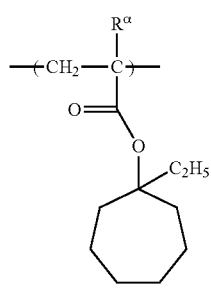
(a1-1-18) 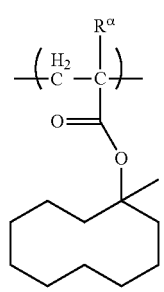
(a1-1-19) 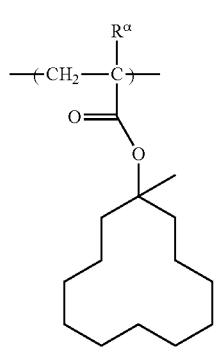
(a1-1-20) 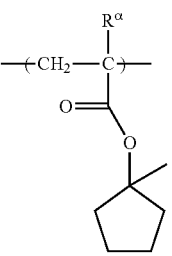
(a1-1-21) 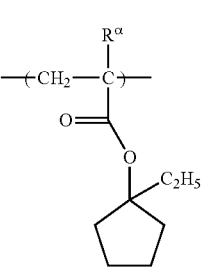
[Chemical Formula 14]
(a1-1-22) 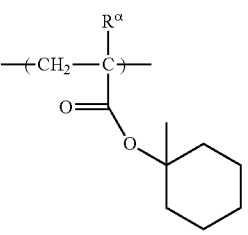
(a1-1-23) 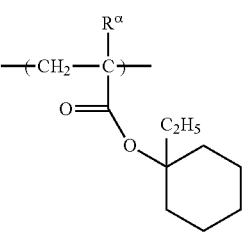
(a1-1-24) 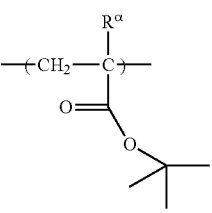
(a1-1-25) 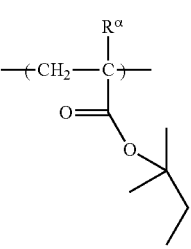

-continued
(a1-1-26) 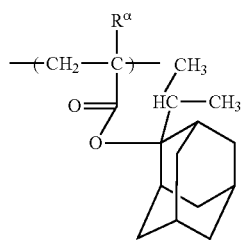
(a1-1-27) 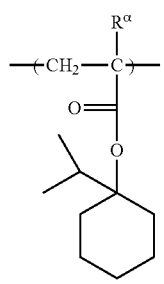
(a1-1-28) 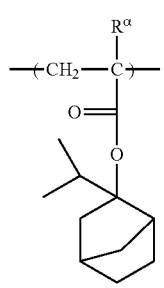
(a1-1-29) 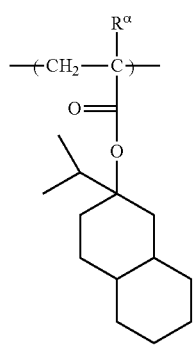
(a1-1-30) 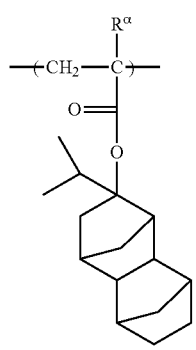
(a1-1-31) 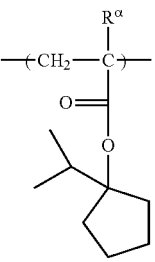
[Chemical Formula 15]
(a1-2-1) 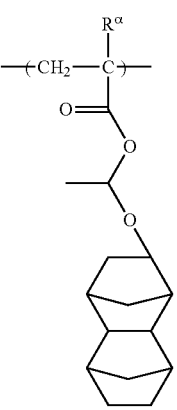
(a1-2-2) 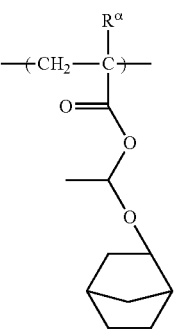
(a1-2-3) 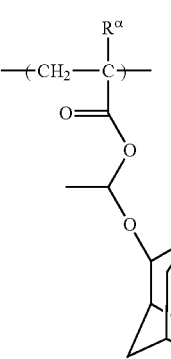

(a1-2-4)
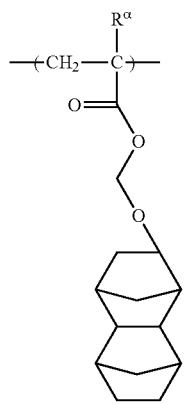
(a1-2-5)
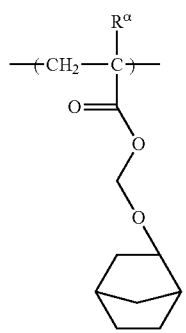
(a1-2-6)
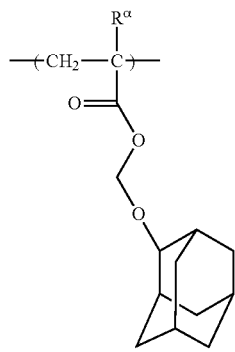
(a1-2-7)
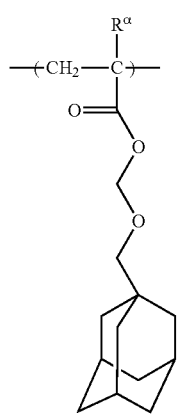
(a1-2-8)
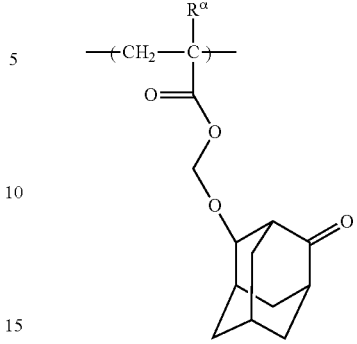
(a1-2-9)
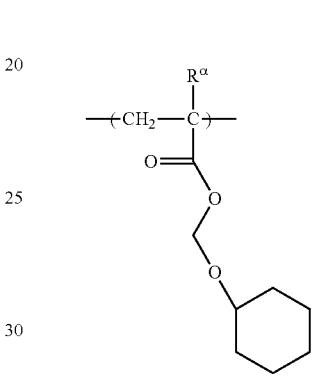
(a1-2-10)
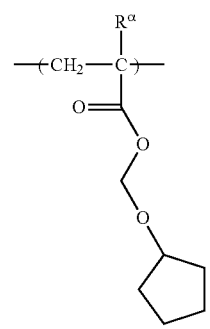
(a1-2-11)
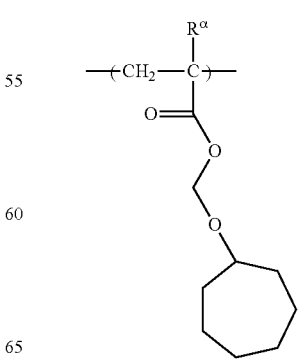

-continued
(a1-2-12)
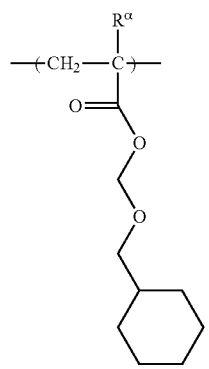
(a1-2-13)
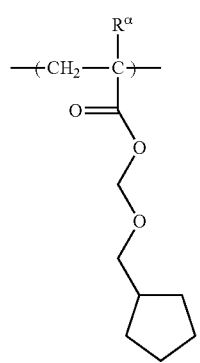
(a1-2-14)
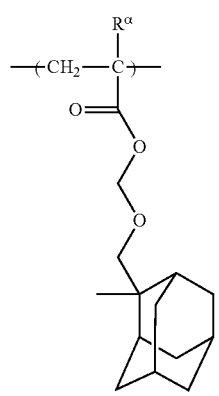
(a1-2-15)
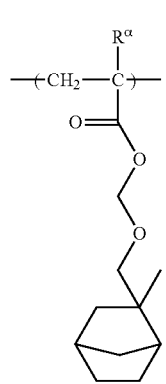
-continued
(a1-2-16)
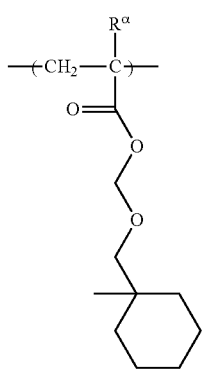
(a1-2-17)
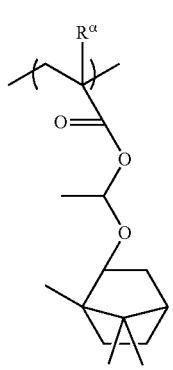
(a1-2-18)
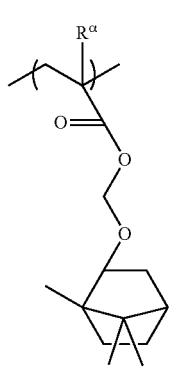
(a1-2-19)
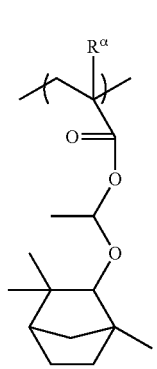

(a1-2-20) 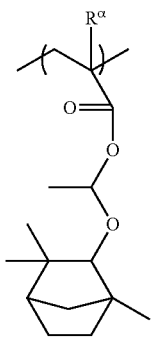
(a1-2-21) 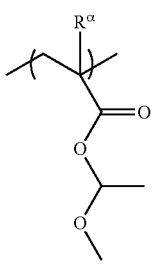
(a1-2-22) 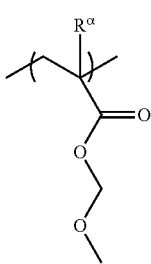
(a1-2-23) 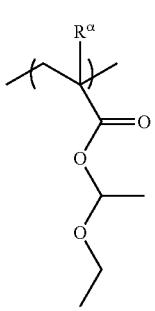
(a1-2-24) 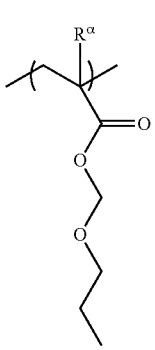
[Chemical Formula 16]
(a1-3-1) 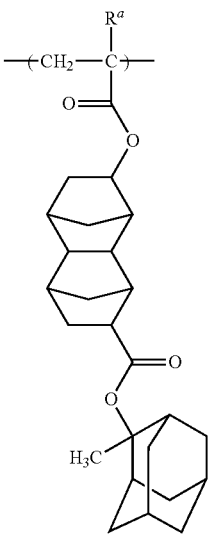
(a1-3-2) 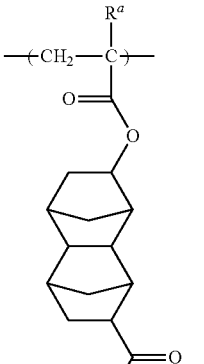
(a1-3-3) 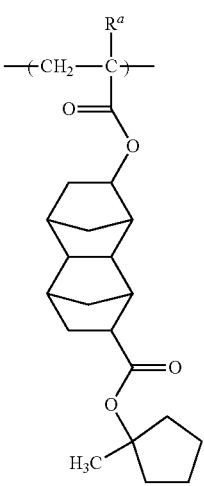

53
-continued
(a1-3-4)
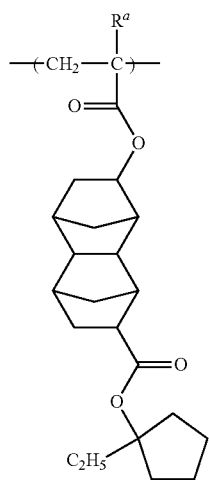
(a1-3-5)
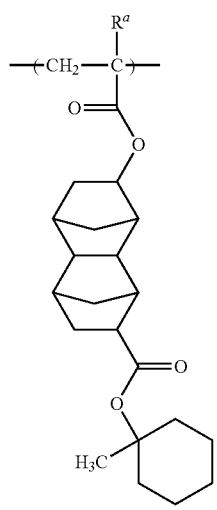
(a1-3-6)
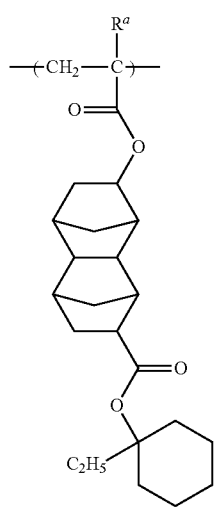
54
-continued
(a1-3-7)
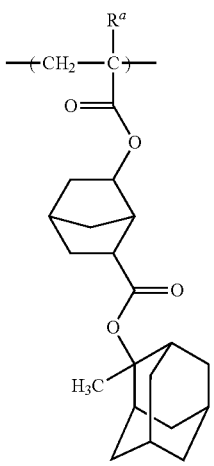
(a1-3-8)
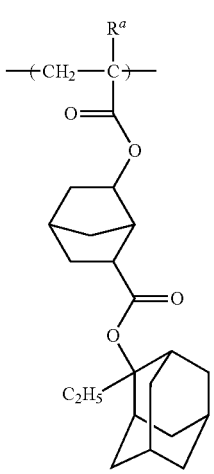
(a1-3-9)
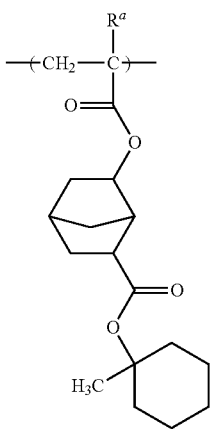

(a1-3-10) 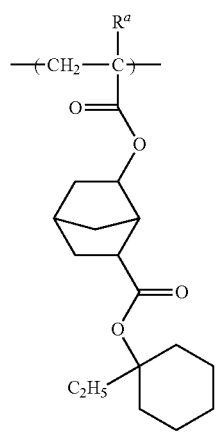
(a1-3-11) 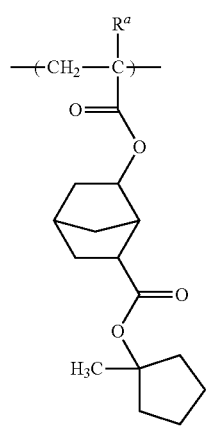
(a1-3-12) 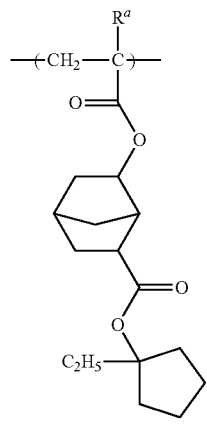
(a1-3-13) 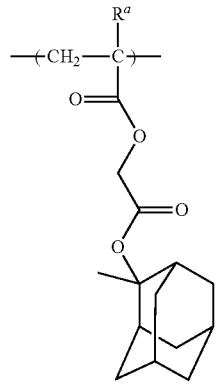
(a1-3-14) 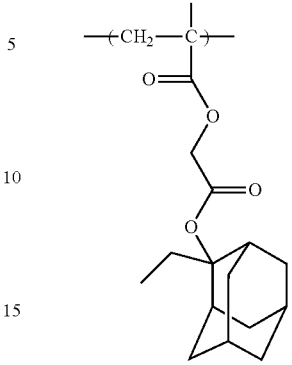
(a1-3-15) 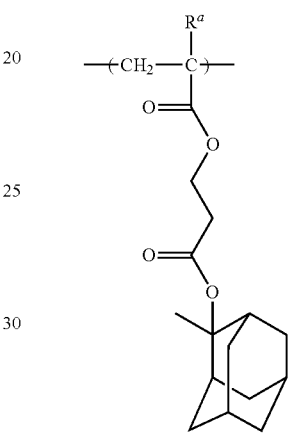
(a1-3-16) 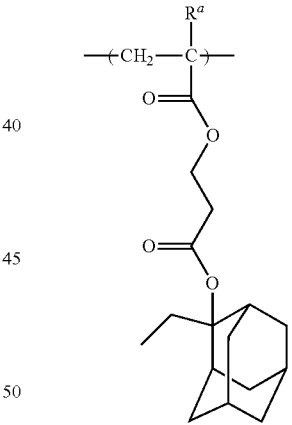
(a1-3-17) 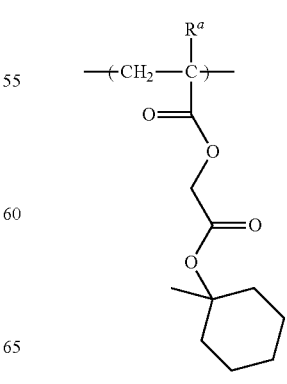

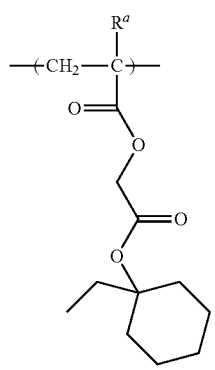
(a1-3-18)
[Chemical Formula 17]
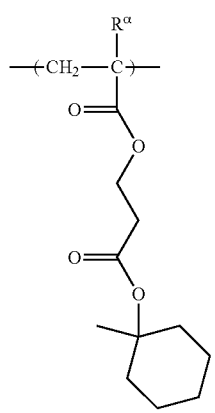
(a1-3-19)
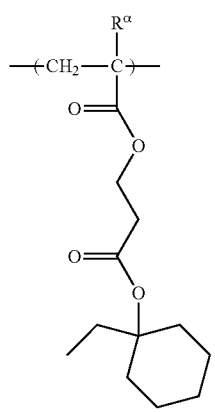
(a1-3-20)
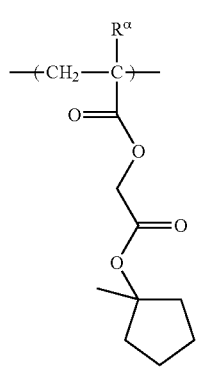
(a1-3-21)
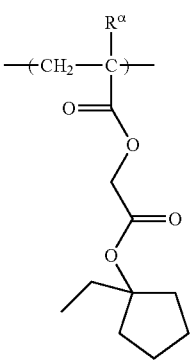
(a1-3-22)
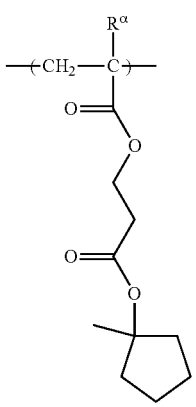
(a1-3-23)
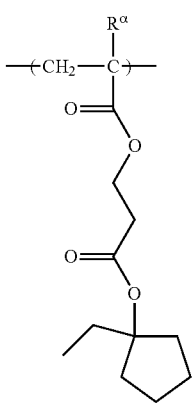
(a1-3-24)

[Chemical Formula 18]
(a1-3-25)
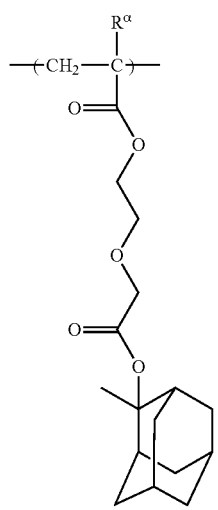
(a1-3-26)
(a1-3-27)
(a1-3-28)
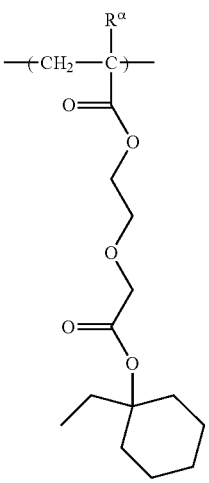
(a1-3-29)
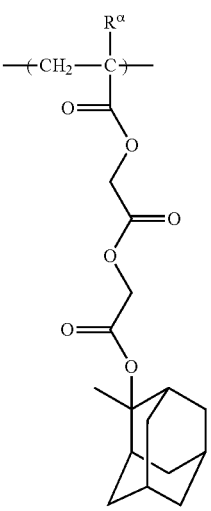
(a1-3-30)
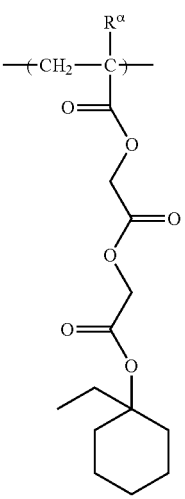

(a1-3-31)
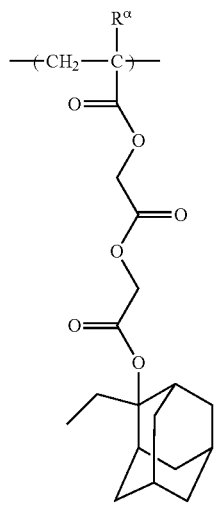
(a1-3-32)
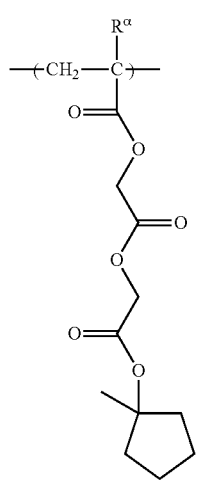
[Chemical Formula 19]
(a1-4-1)
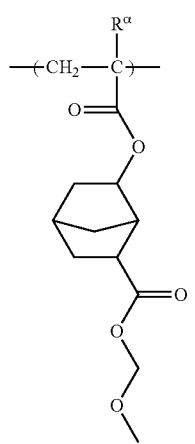
(a1-4-2)
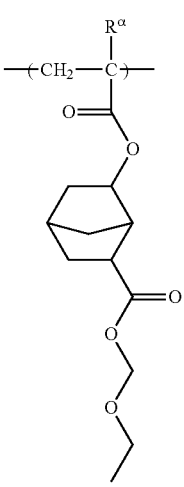
(a1-4-3)
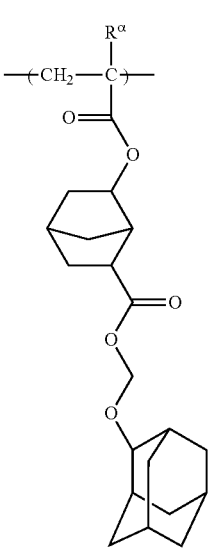
(a1-4-4)
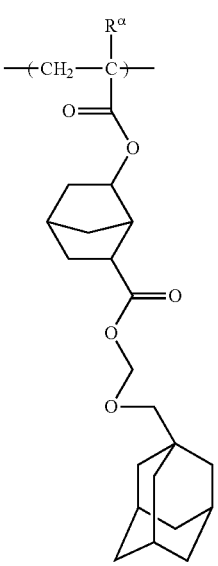

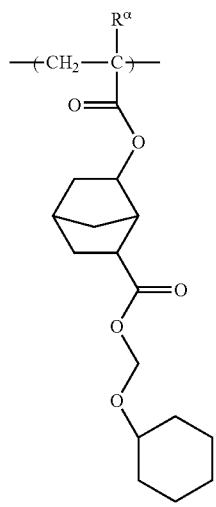 (a1-4-5)
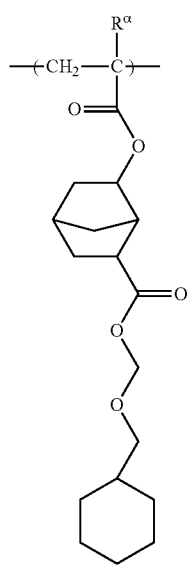 (a1-4-6)
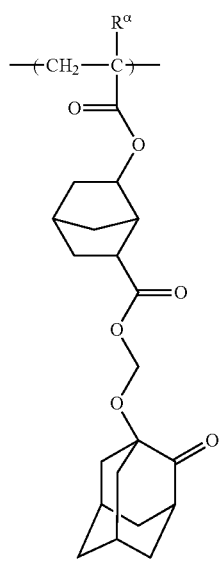 (a1-4-7)
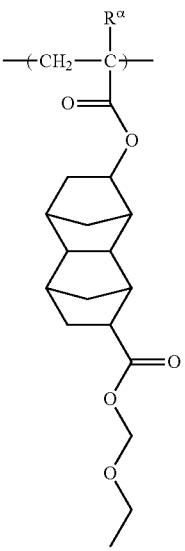 (a1-4-8)
 (a1-4-9)

(a1-4-10)
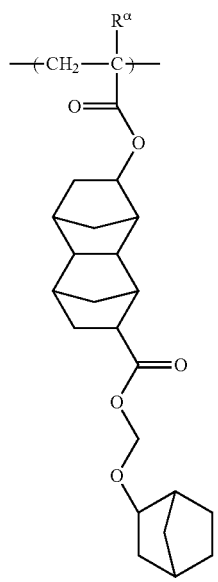
(a1-4-11)
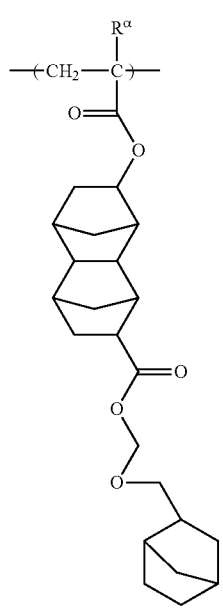
(a1-4-12)
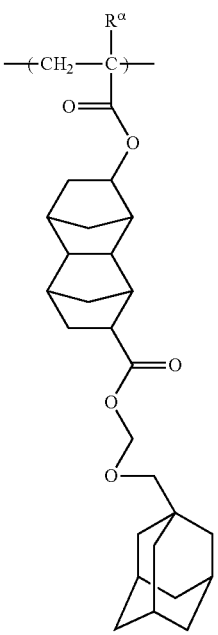
(a1-4-13)
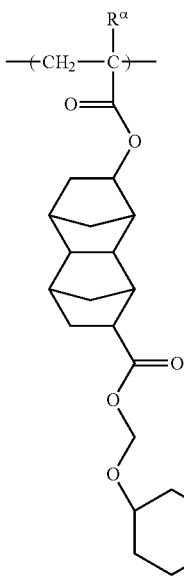

-continued (a1-4-14)

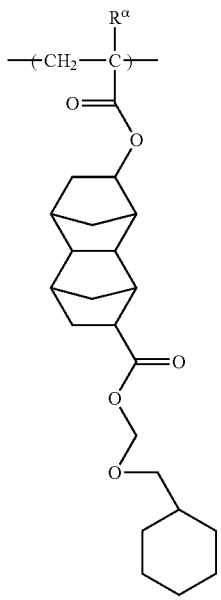

(a1-4-15)

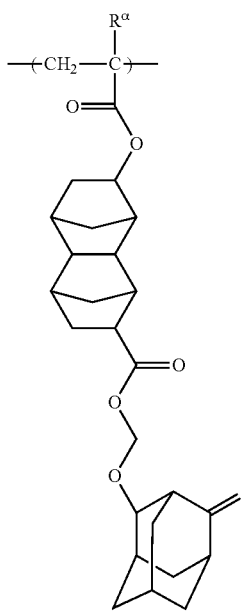

As the structural unit (a1), one type of structural unit may be used alone, or two or more types of structural units may be used in combination.

Among these, as the structural unit (a1), structural units represented by general formula (a1-1) or (a1-3) are preferable. More specifically, at least one structural unit selected from the group consisting of structural units represented by formulas (a1-1-1) to (a-1-1-4), (a1-1-20) to (a1-1-23) and (a1-3-25) to (a1-3-32) is more preferable.

Further, as the structural unit (a1), structural units represented by general formula (a1-1-01) shown below which includes the structural units represented by formulas (a1-1-1) to (a1-1-3), structural units represented by general formula (a1-1-02) shown below which includes the structural units represented by formulas (a1-1-16) to (a1-1-18) and (a1-1-20) to (a1-1-23), (a1-1-27) and (a1-1-31), structural units represented by general formula (a1-3-01) shown below which include the structural units represented by formulas (a1-3-25) and (a1-3-26), structural units represented by general formula (a1-3-02) shown below which include the structural units represented by formulas (a1-3-27) to (a1-3-28), and structural units represented by general formula (a1-3-03) shown below which include the structural units represented by formulas (a1-3-29) to (a1-3-32) are also preferable.

[Chemical Formula 20]

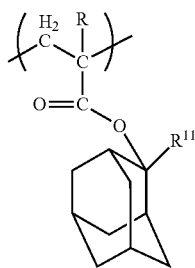
(a1-1-01)

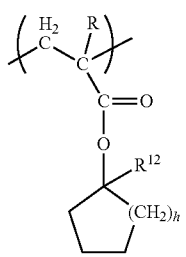
(a1-1-02)

In the formulas, R represents a hydrogen atom, an alkyl group of 1 to 5 carbon atoms or a halogenated alkyl group of 1 to 5 carbon atoms; $R^{11}$ represents an alkyl group of 1 to 5 carbon atoms; $R^{12}$ represents an alkyl group of 1 to 5 carbon atoms; and h represents an integer of 1 to 6.

In general formula (a1-1-01), R is the same as defined above.

The alkyl group for $R^{11}$ is the same as the alkyl group defined above for R, and is preferably a methyl group, an ethyl group or an isopropyl group.

In general formula (a1-1-02), R is the same as defined above.

The alkyl group for $R^{12}$ is the same as the alkyl group defined above for R, and is preferably a methyl group, an ethyl group or an isopropyl group.

h is preferably 1 or 2, and most preferably 2.

[Chemical Formula 21]

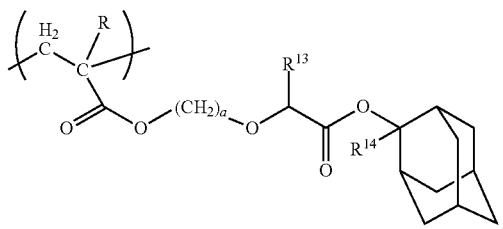
(a1-3-01)

-continued

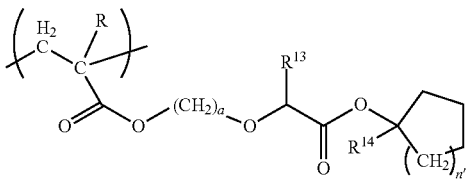

(a1-3-02)

In the formulas, R represents a hydrogen atom, an alkyl group of 1 to 5 carbon atoms or a halogenated alkyl group of 1 to 5 carbon atoms; $R^{14}$ represents an alkyl group of 1 to 5 carbon atoms; $R^{13}$ represents a hydrogen atom or a methyl group; a represents an integer of 1 to 10; and n' represents an integer of 1 to 6.

In general formulas (a1-3-01) and (a1-3-02), R is the same as defined above.

$R^{13}$ is preferably a hydrogen atom.

The alkyl group for $R^{14}$ is the same as the alkyl group defined above for $R^{14}$ in formulas (1-1) to (1-9), and is preferably a methyl group, an ethyl group or an isopropyl group.

a is preferably an integer of 1 to 8, more preferably an integer of 2 to 5, and most preferably 2.

n' is most preferably 1 or 2.

[Chemical Formula 22]

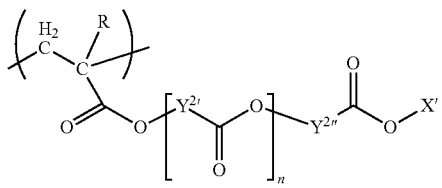

(a1-3-03)

In the formula, R is the same as defined above; each of $Y^{2'}$ and $Y^{2''}$ independently represents a divalent linking group; X' represents an acid dissociable, dissolution inhibiting group; and n represents an integer of 0 to 3.

In general formula (a1-3-03), as the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable, dissolution inhibiting group for X', the same groups as those described above can be used. X' is preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is preferable.

n represents an integer of 0 to 3, preferably an integer of 0 to 2, more preferably 0 or 1, and most preferably 1.

The amount of the structural unit (a1) within the component (A1-1) based on the combined total of all structural units constituting the component (A1-1) is preferably 10 to 80 mol %, more preferably 20 to 70 mol %, and still more preferably 25 to 50 mol %. By ensuring that the amount of the structural unit (a1) is at least as large as the lower limit of the above range, a pattern can be formed easily using a resist composition prepared from the component (A1-1), whereas by ensuring that the amount is not more than the upper limit of the above range, a good balance can be achieved with the other structural units.

Structural Unit (a2):

The structural unit (a2) is at least one structural unit selected from the group consisting of structural units derived from an acrylate ester containing a lactone-containing cyclic group (hereafter, referred to as "structural unit $(a2^L)$") and structural units derived from an acrylate ester containing a —$SO_2$-containing cyclic group (hereafter, referred to as "structural unit $(a2^S)$").

Structural Unit $(a2^L)$:

The structural unit $(a2^L)$ is a structural unit derived from an acrylate ester containing a lactone-containing cyclic group.

The term "lactone-containing cyclic group" refers to a cyclic group including a ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1-1) is used for forming a resist film, the lactone-containing cyclic group of the structural unit $(a2^L)$ is effective in improving the adhesion between the resist film and the substrate, and increasing the compatibility with the developing solution containing water.

The lactone-containing cyclic group for the structural unit $(a2^L)$ is not particularly limited, and an arbitrary structural unit may be used. Specific examples of lactone-containing monocyclic groups include a group in which one hydrogen atom has been removed from a 4- to 6-membered lactone ring, such as a group in which one hydrogen atom has been removed from β-propionolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit $(a2^L)$ include structural units represented by general formulas (a2-1) to (a2-5) shown below.

[Chemical Formula 23]

(a2-1) 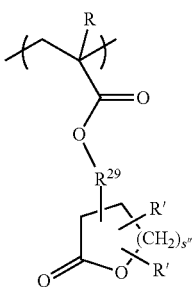

(a2-2) 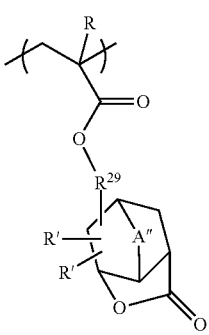

(a2-3) 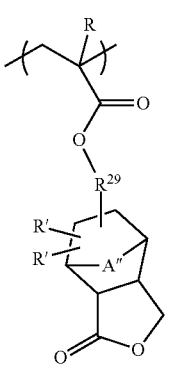

(a2-4) 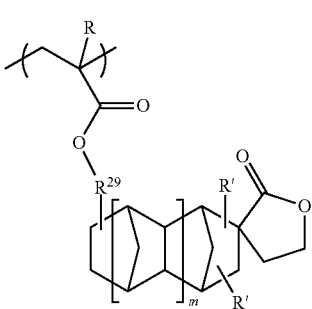

(a2-5) 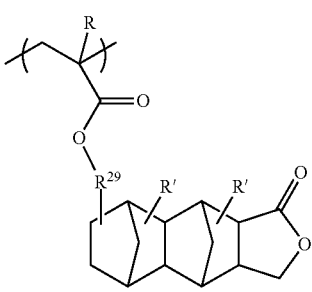

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined above for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group.

In terms of industrial availability, R' is preferably a hydrogen atom.

The alkyl group for R" may be any of linear, branched or cyclic.

In those cases where R" represents a linear or branched alkyl group, the alkyl group preferably has 1 to 10 carbon atoms, and more preferably 1 to 5 carbon atoms.

In those cases where R" represents a cyclic alkyl group, the cyclic alkyl group preferably has 3 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms, an oxygen atom (—O—) or a sulfur atom (—S—), and more preferably an alkylene group of 1 to 5 carbon atoms or —O—. As the alkylene group of 1 to 5 carbon atoms, a methylene group or a dimethylethylene group is preferable, and a methylene group is particularly desirable.

$R^{29}$ represents a single bond or a divalent linking group. As examples of the divalent linking group, the same divalent linking groups as those described above for $Y^2$ in general formula (a1-0-2) can be given. Among these, an alkylene group, an ester bond (—C(=O)—O—) or a combination of these is preferable. The alkylene group as a divalent linking group for $R^{29}$ is preferably a linear or branched alkylene group. Specific examples include the same linear alkylene groups and branched alkylene groups as those listed above for the aliphatic hydrocarbon group for A within the description for $Y^2$.

It is particularly desirable that $R^{29}$ represent a single bond or —$R^{29'}$—C(=O)—O— (wherein $R^{29'}$ represents a linear or branched alkylene group). The linear or branched alkylene group for $R^{29'}$ preferably has 1 to 10 carbon atoms, more preferably 1 to 8 carbon atoms, and still more preferably 1 to 5 carbon atoms.

In formula (a2-1), s" is preferably 1 or 2.

Specific examples of structural units represented by general formulas (a2-1) to (a2-5) are shown below. In the formulas shown below, $R^α$ represents a hydrogen atom, a methyl group or a trifluoromethyl group.
[Chemical Formula 24]
(a2-1-1)
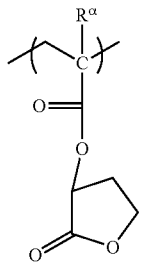
(a2-1-2)
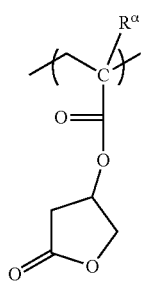
(a2-1-3)
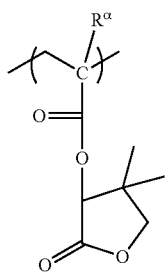
(a2-1-4)
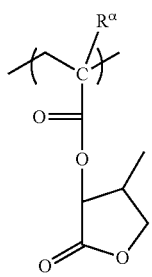
(a2-1-5)
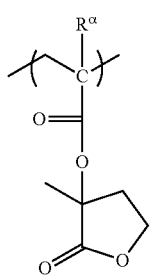
-continued
(a2-1-6)
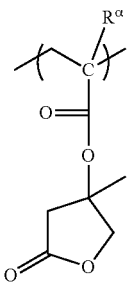
(a2-1-7)
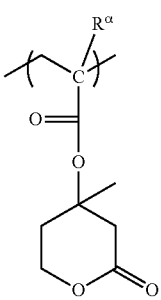
(a2-1-8)
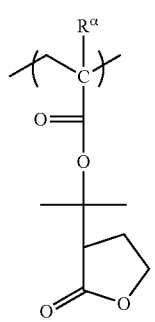
(a2-1-9)
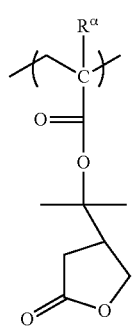
(a2-1-10)
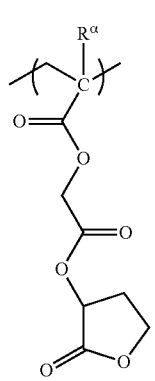

(a2-1-11)
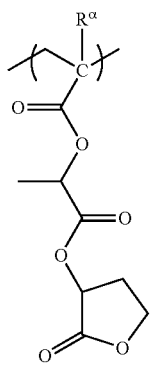
(a2-1-12)
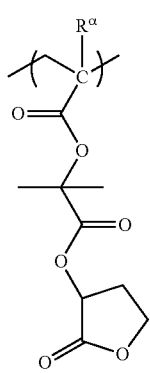
(a2-1-13)
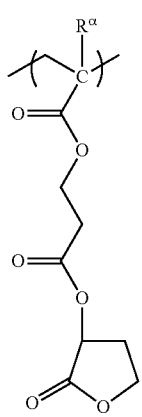
[Chemical Formula 25]
(a2-2-1)
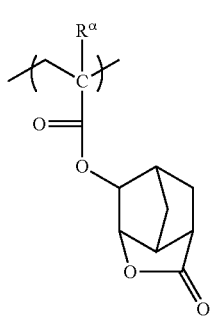
(a2-2-2)
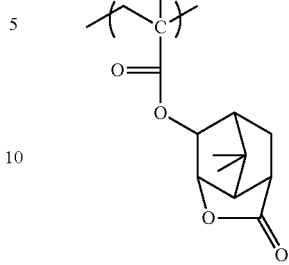
(a2-2-3)
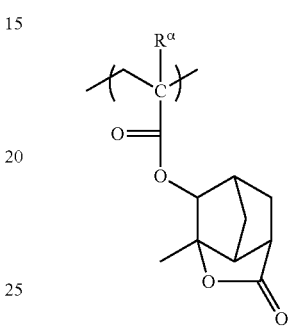
(a2-2-4)
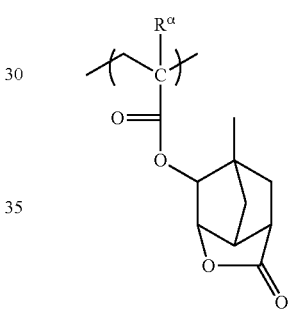
(a2-2-5)
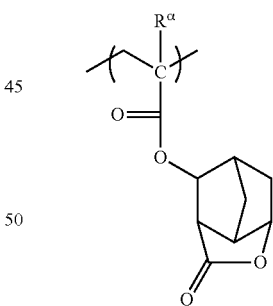
(a2-2-6)
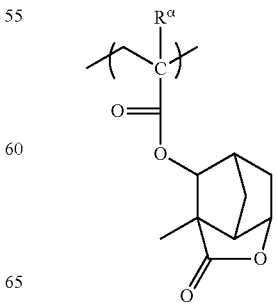

(a2-2-7) 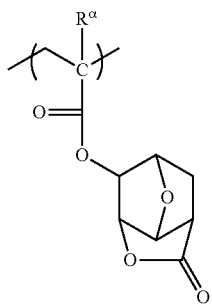
(a2-2-8) 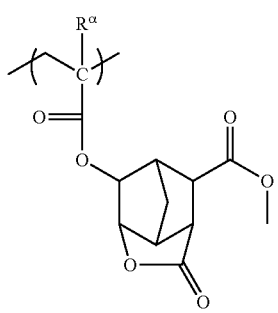
(a2-2-9) 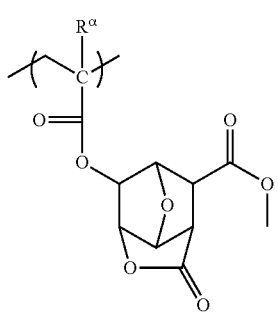
(a2-2-10) 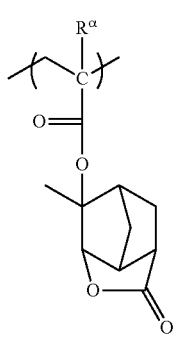
(a2-2-11) 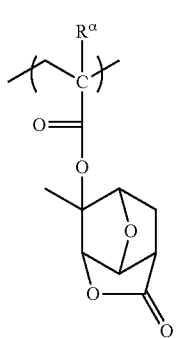
(a2-2-12) 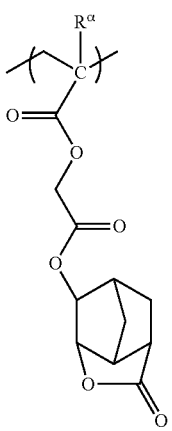
(a2-2-13) 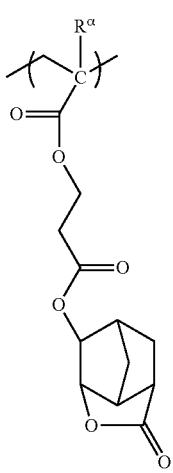
(a2-2-14) 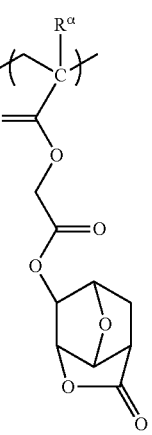

(a2-2-15)
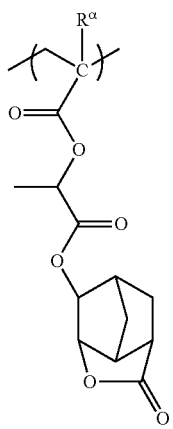
(a2-2-16)
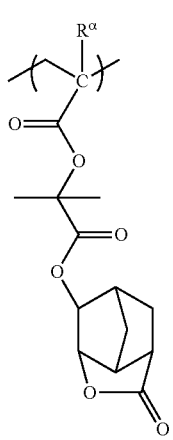
(a2-2-17)
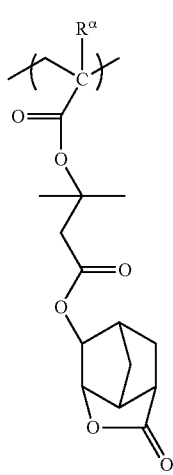
[Chemical Formula 26]
(a2-3-1)
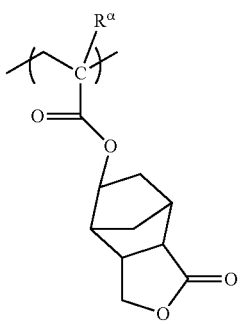
(a2-3-2)
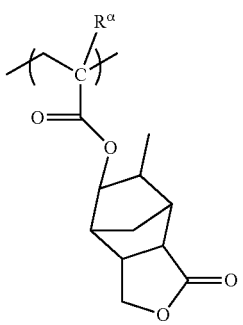
(a2-3-3)
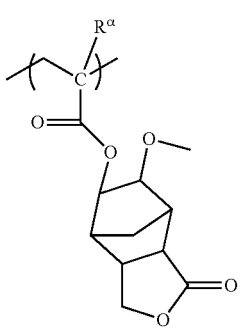
(a2-3-4)
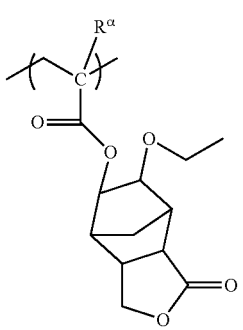
(a2-3-5)
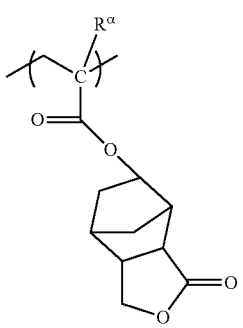

[Chemical Formula 27]
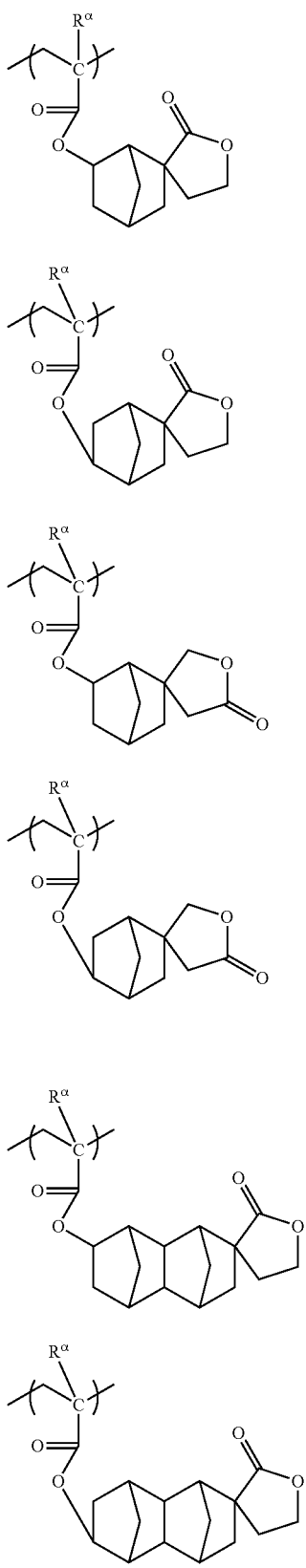
(a2-4-1)
(a2-4-2)
(a2-4-3)
(a2-4-4)
(a2-4-5)
(a2-4-6)
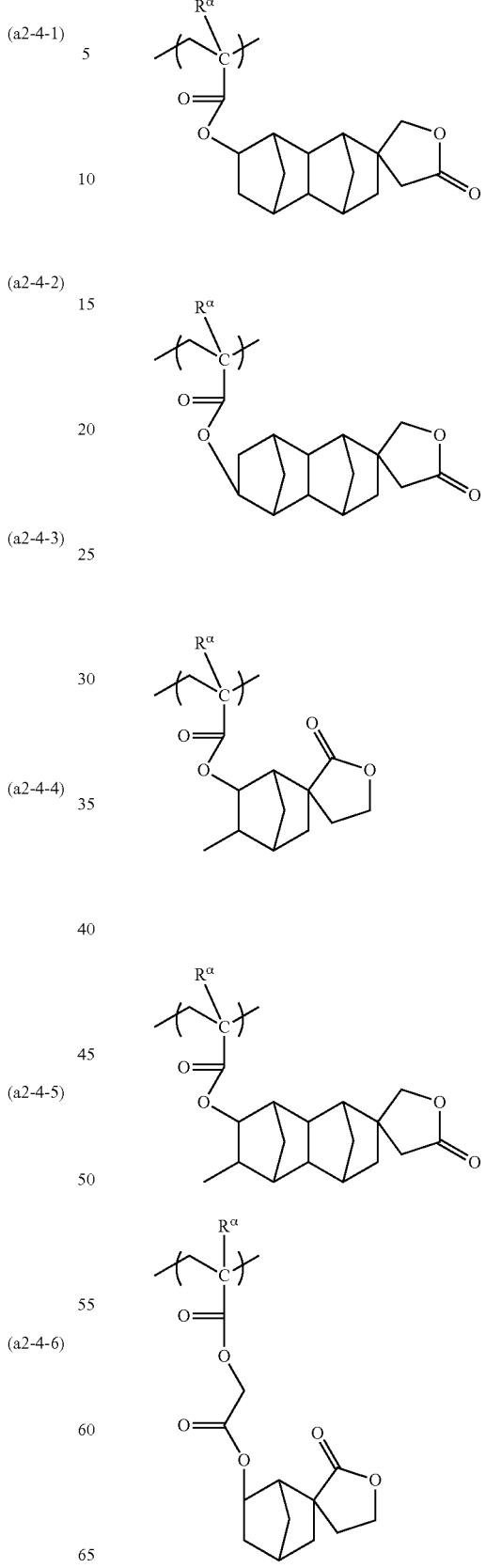
(a2-4-7)
(a2-4-8)
(a2-4-9)
(a2-4-10)
(a2-4-11)

(a2-4-12)
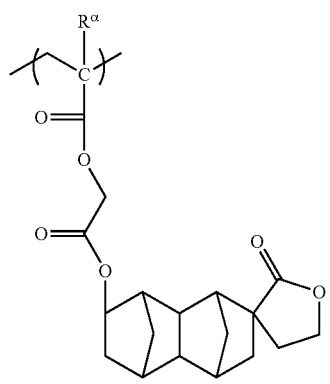
[Chemical Formula 28]
(a2-5-1)
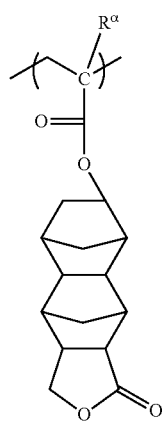
(a2-5-2)
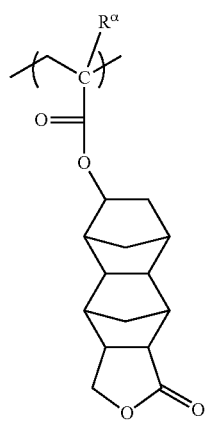
(a2-5-3)
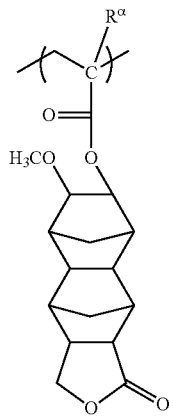
(a2-5-4)
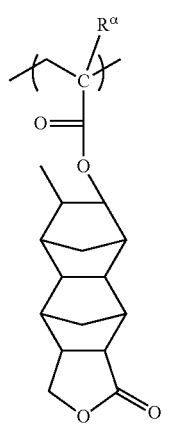
(a2-5-5)
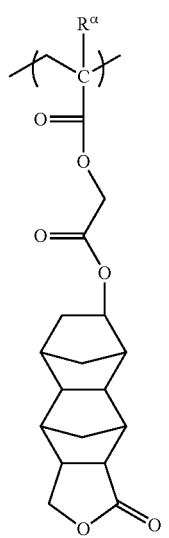

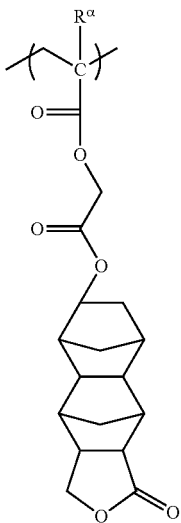

(a2-5-6)

Structural Unit (a2$^S$):

The structural unit (a2$^S$) is a structural unit derived from an acrylate ester containing a —SO$_2$-containing cyclic group.

Here, an "—SO$_2$-containing cyclic group" refers to a cyclic group having a ring that contains —SO$_2$— within the ring skeleton thereof, i.e., a cyclic group in which the sulfur atom (S) within —SO$_2$— forms part of the ring skeleton of the cyclic group. This ring that contains —SO$_2$— within the ring skeleton thereof is counted as the first ring. A cyclic group in which the only ring structure is this ring is referred to as a monocyclic group, and a group containing other ring structures is described as a polycyclic group regardless of the structure of the other rings. The —SO$_2$-containing cyclic group may be either a monocyclic group or a polycyclic group.

When the component (A1-1) is used for forming a resist film, the —SO$_2$-containing cyclic group of the structural unit (a2$^S$) is effective in improving the adhesion between the resist film and the substrate, and increasing the compatibility with the developing solution containing water.

As the —SO$_2$-containing cyclic group, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable.

The —SO$_2$-containing cyclic group preferably has 3 to 30 carbon atoms, more preferably 4 to 20 carbon atoms, still more preferably 4 to 15 carbon atoms, and most preferably 4 to 12 carbon atoms. Herein, the number of carbon atoms refers to the number of carbon atoms constituting the ring skeleton, excluding the number of carbon atoms within a substituent.

The —SO$_2$-containing cyclic group may be either a —SO$_2$-containing aliphatic cyclic group or a —SO$_2$-containing aromatic cyclic group. An —SO$_2$-containing aliphatic cyclic group is preferable.

Examples of the —SO$_2$-containing aliphatic cyclic group include aliphatic cyclic groups in which part of the carbon atoms constituting the ring skeleton has been substituted with a —SO$_2$— group or a —O—SO$_2$— group and has at least one hydrogen atom removed from the aliphatic hydrocarbon ring. Specific examples include an aliphatic hydrocarbon ring in which a —CH$_2$— group constituting the ring skeleton thereof has been substituted with a —SO$_2$— group and has at least one hydrogen atom removed therefrom; and an aliphatic hydrocarbon ring in which a —CH$_2$—CH$_2$— group constituting the ring skeleton has been substituted with a —O—SO$_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —SO$_2$-containing cyclic group may have a substituent. Examples of the substituent include an alkyl group, an alkoxy group, a halogen atom, a halogenated alkyl group, a hydroxyl group, an oxygen atom (=O), —COOR$^{06}$, —OC(=O)R$^{06}$, a hydroxyalkyl group and a cyano group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkoxy group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR$^{06}$ group and the —OC(=O)R$^{06}$ group, R$^{06}$ represents a hydrogen atom or a linear, branched or cyclic alkyl group of 1 to 15 carbon atoms.

When R$^{06}$ represents a linear or branched alkyl group, it is preferably an alkyl group of 1 to 10 carbon atoms, more preferably an alkyl group of 1 to 5 carbon atoms, and most preferably a methyl group or an ethyl group.

In those cases where R$^{06}$ represents a cyclic alkyl group, the cyclic alkyl group preferably has 3 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxyl group.

More specific examples of the —SO$_2$-containing cyclic group include groups represented by general formulas (3-1) to (3-4) shown below.

[Chemical Formula 29]

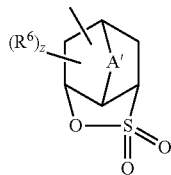
(3-1)

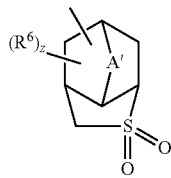
(3-2)

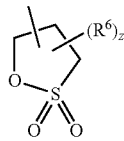
(3-3)

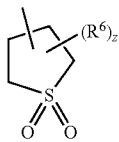
(3-4)

In the formulas, A' represents an oxygen atom, a sulfur atom or an alkylene group of 1 to 5 carbon atoms which may contain an oxygen atom or a sulfur atom; z represents an integer of 0 to 2; and R$^6$ represents an alkyl group, an alkoxy group, a halogenated alkyl group, a hydroxyl group, —COOR$^{06}$, —OC(=O)R$^{06}$, a hydroxyalkyl group or a cyano group, wherein R$^{06}$ represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

When z is 2, the plurality of R$^6$ may be the same or different from each other.

As the alkyl group, alkoxy group, halogenated alkyl group, —COOR$^{06}$, —OC(=O)R$^{06}$ and hydroxyalkyl group for R$^6$, the same alkyl groups, alkoxy groups, halogenated alkyl groups, —COOR$^{06}$, —OC(=O)R$^{06}$ and hydroxyalkyl groups as those described above as the substituent which the —SO$_2$-containing cyclic group may have can be used.

Specific examples of the cyclic groups represented by general formulas (3-1) to (3-4) are shown below. In the formulas shown below, "Ac" represents an acetyl group.

[Chemical Formula 30]

(3-1-1)

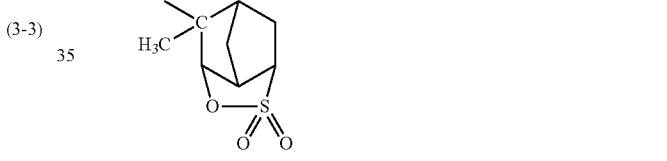
(3-1-2)

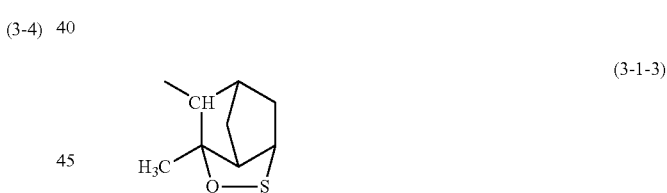
(3-1-3)

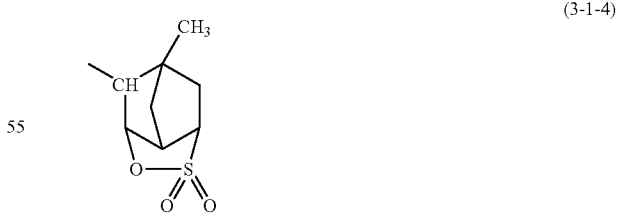
(3-1-4)

(3-1-5)

-continued
(3-1-6)
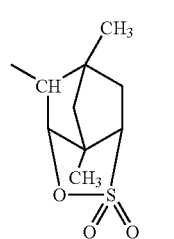
(3-1-7)
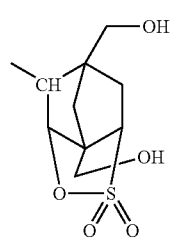
(3-1-8)
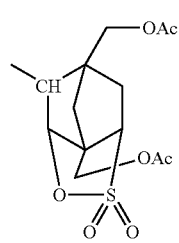
(3-1-9)
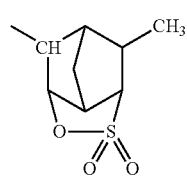
(3-1-10)
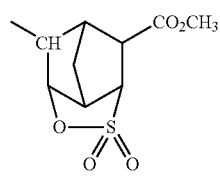
(3-1-11)
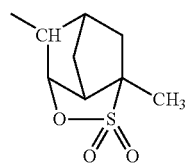
(3-1-12)
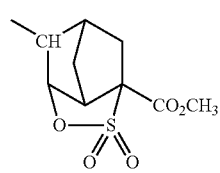
[Chemical Formula 31]
(3-1-13)
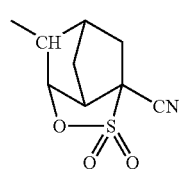
-continued
(3-1-14)
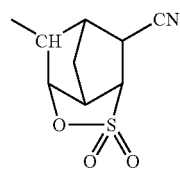
(3-1-15)
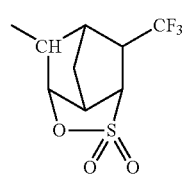
(3-1-16)
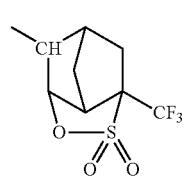
(3-1-17)
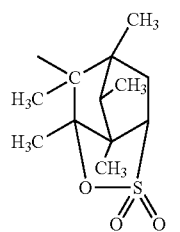
[Chemical Formula 32]
(3-1-18)
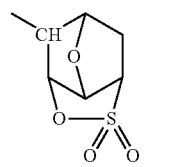
(3-1-19)
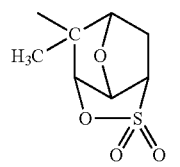
(3-1-20)
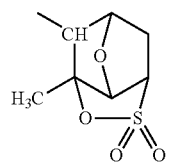
(3-1-21)
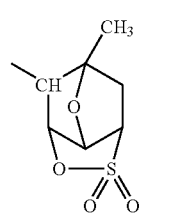

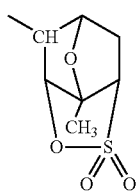 (3-1-22)

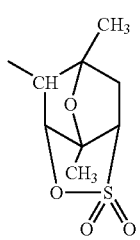 (3-1-23)

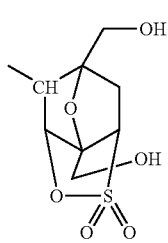 (3-1-24)

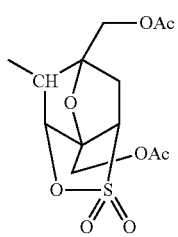 (3-1-25)

[Chemical Formula 33]

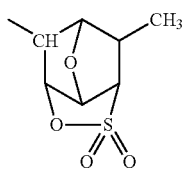 (3-1-26)

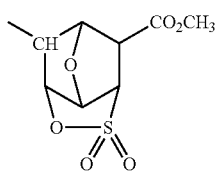 (3-1-27)

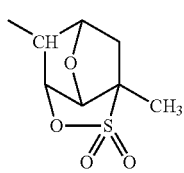 (3-1-28)

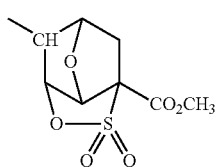 (3-1-29)

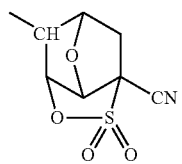 (3-1-30)

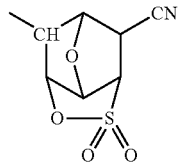 (3-1-31)

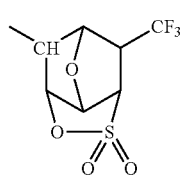 (3-1-32)

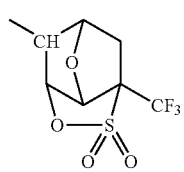 (3-1-33)

[Chemical Formula 34]

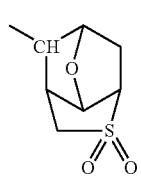 (3-2-1)

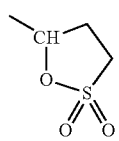 (3-2-2)

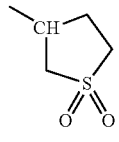 (3-3-1)

(3-4-1)

As the —$SO_2$-containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by the aforementioned chemical formula (3-1-1) is most preferable.

More specific examples of the structural unit (a2$^S$) include structural units represented by general formula (a2-6) shown below.

[Chemical Formula 35]

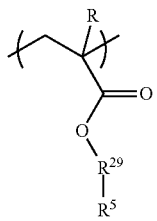

(a2-6)

In the formula, R represents a hydrogen atom, an alkyl group of 1 to 5 carbon atoms or a halogenated alkyl group of 1 to 5 carbon atoms; $R^5$ represents a —$SO_2$-containing cyclic group; and $R^{29}$ represents a single bond or a divalent linking group.

In genera formula (a2-6), R is the same as defined above.

$R^5$ is the same as defined for the aforementioned —$SO_2$-containing cyclic group.

$R^{29}$ may be either a single bond or a divalent linking group. In terms of the effects of the present invention, a divalent linking group is preferable.

As the divalent linking group for $R^{29}$, the same divalent linking groups as those described above for $R^{29}$ in general formulas (a2-1) to (a2-5) can be mentioned. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by $Y^2$.

As the divalent linking group containing an ester bond, a group represented by general formula: —$R^4$—C(=O)—O— (in the formula, $R^4$ represents a divalent linking group) is particularly desirable. That is, the structural unit ($a2^S$) is preferably a structural unit represented by general formula (a2-6-1) shown below.

[Chemical Formula 36]

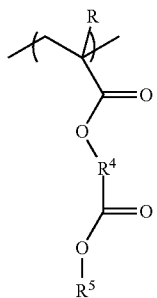

(a2-6-1)

In the formula, R and $R^5$ are the same as defined above; and $R^4$ represents a divalent linking group.

$R^4$ is not particularly limited. For example, the same divalent linking groups as those described for $Y^2$ in general formula (a1-0-2) explained above in relation to the structural unit (a1) can be mentioned.

As the divalent linking group for $R^4$, a linear or branched alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent aliphatic cyclic hydrocarbon group and divalent linking group containing a hetero atom as those described above as preferable examples of $Y^2$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH($CH_3$)—, —C($CH_3$)$_2$— or —C($CH_3$)$_2CH_2$— is particularly desirable.

As the divalent linking group containing an oxygen atom, a divalent linking group containing an ether bond or an ester bond is preferable, and a group represented by the aforementioned formula -A-O—B—, -A-O—C(=O)—B— or -[A-C(=O)—P]$_m$—B— is more preferable.

Among these, a group represented by the formula -A-O—C(O)—B— is preferable, and a group represented by the formula: —($CH_2$)$_c$—C(=O)—O—($CH_2$)$_d$— is particularly desirable. c represents an integer of 1 to 5, and preferably 1 or 2. d represents an integer of 1 to 5, and preferably 1 or 2.

In particular, as the structural unit ($a2^S$), a structural unit represented by general formula (a2-6-11) or (a2-6-12) shown below is preferable, and a structural unit represented by general formula (a2-6-12) shown below is more preferable.

[Chemical Formula 37]

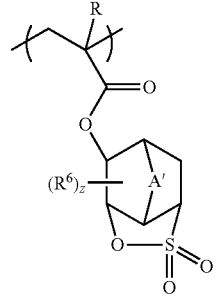

(a2-6-11)

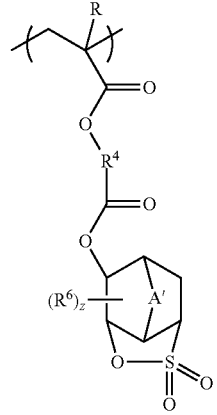

(a2-6-12)

In the formulas, R, A', $R^6$, z and $R^4$ are the same as defined above.

In general formula (a2-6-11), A' is preferably a methylene group, an oxygen atom (—O—) or a sulfur atom (—S—).

As $R^4$, a linear or branched alkylene group or a divalent linking group containing an oxygen atom is preferable. As the linear or branched alkylene group and the divalent linking group containing an oxygen atom represented by $R^4$, the same linear or branched alkylene groups and the divalent linking groups containing an oxygen atom as those described above can be mentioned.

As the structural unit represented by general formula (a2-6-12), a structural unit represented by general formula (a2-6-12a) or (a2-6-12b) shown below is particularly desirable.

[Chemical Formula 38]

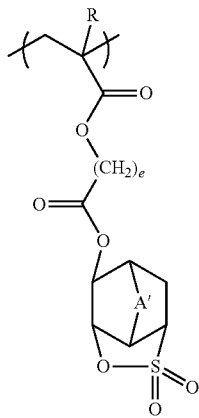

(a2-6-12a)

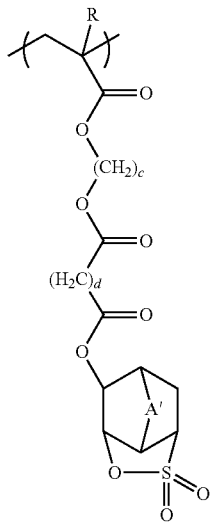

(a2-6-12b)

In the formulas, R and A' are the same as defined above; and each of c to e independently represents an integer of 1 to 3.

In the component (A1-1), as the structural unit (a2), one type of structural unit may be used alone, or two or more types of structural units may be used in combination. For example, as the structural unit (a2), a structural unit (a2$^S$) may be used alone, or a structural unit (a2$^L$) may be used alone, or a combination of these structural units may be used. Further, as the structural unit (a2$^S$) or the structural unit (a2$^L$), either a single type of structural unit may be used, or two or more types may be used in combination.

As the structural unit (a2), at least one structural unit selected from the group consisting of formulas (a2-1) to (a2-6) is preferable, and at least one structural unit selected from the group consisting of formulas (a2-1) to (a2-3) and (a2-6) is more preferable. Of these, at least one structural unit selected from the group consisting of the structural units represented by chemical formulas (a2-1-1), (a2-2-1), (a2-2-7), (a2-3-1), (a2-3-5) and (a2-6-1) is particularly desirable.

The amount of the structural unit (a2) within the component (A1-1), based on the combined total of all the structural units that constitute the component (A1-1), is preferably within a range from 5 to 60 mol %, more preferably from 10 to 50 mol %, and still more preferably from 20 to 50 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

Structural Unit (a3):

The structural unit (a3) is a structural unit derived from an acrylate ester containing a polar group-containing aliphatic hydrocarbon group.

When the component (A1-1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, a cyano group, a carboxyl group, or a fluorinated alcohol group (a hydroxyalkyl group in which part of the hydrogen atoms of the alkyl group have been substituted with fluorine atoms), although a hydroxyl group is particularly desirable.

In the structural unit (a3), the number of polar groups bonded to the aliphatic hydrocarbon group is not particularly limited, although 1 to 3 groups is preferable, and 1 group is particularly desirable.

Examples of the aliphatic hydrocarbon group to which the aforementioned polar groups are bonded include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

As the structural unit (a3), structural units derived from an acrylate ester that include an aliphatic polycyclic group that contains a hydroxyl group, a cyano group, a carboxyl group or a fluorinated alcohol group are preferred. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid.

On the other hand, when the hydrocarbon group within the polar group-containing aliphatic hydrocarbon group is a polycyclic group, the structural unit (a3) is preferably a structural unit represented by formulas (a3-1), (a3-2) and (a3-3) shown below. Among these, a structural unit represented by general formula (a3-1) is particularly desirable.

[Chemical Formula 39]

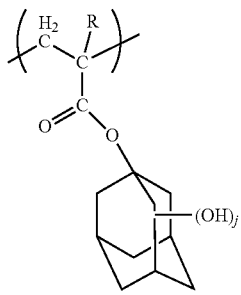

(a3-1)

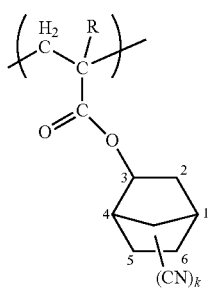

(a3-2)

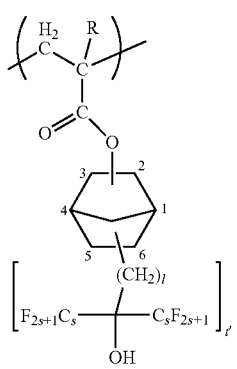

(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group. j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, in formula (a3-3), it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3), one type of structural unit may be used alone, or two or more types of structural units may be used in combination.

The amount of the structural unit (a3) within the component (A1-1) based on the combined total of all structural units constituting the component (A1-1) is preferably 5 to 50 mol %, more preferably 5 to 40 mol %, and still more preferably 5 to 25 mol %.

The component (A1-1) may also have a structural unit other than the above-mentioned structural units (a1) to (a3), as long as the effects of the present invention are not impaired.

As such a structural unit, any other structural unit which cannot be classified as one of the above structural units (a1) to (a3) can be used without any particular limitation, and any of the multitude of conventional structural units used within resist resins for ArF excimer lasers or KrF excimer lasers (and particularly for ArF excimer lasers) can be used.

Examples of other structural units include a structural unit (a4) derived from an acrylate ester containing a non-acid-dissociable aliphatic polycyclic group, and a structural unit (a5') described later in the description for the component (A'). However, in the present invention, it is preferable that the component (A1-1) do not include the structural unit (a5').

Examples of the aliphatic polycyclic group within the structural unit (a4) include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used. In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a-4-1) to (a-4-5) shown below.

[Chemical Formula 40]

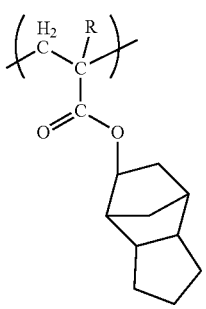

(a4-1)

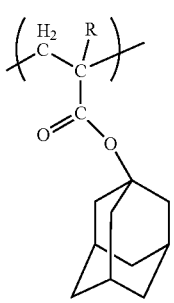

(a4-2)

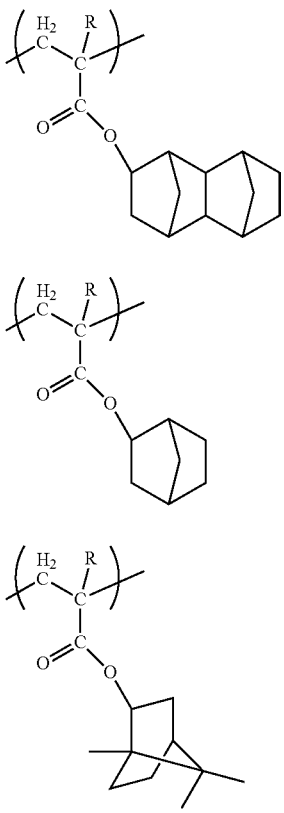

(a4-3)

(a4-4)

(a4-5)

In the formulas, R is the same as defined above.

When the structural unit (a4) is included in the component (A1-1), the amount of the structural unit (a4) based on the combined total of all the structural units that constitute the component (A1-1) is preferably within the range from 1 to 30 mol %, and more preferably from 10 to 20 mol %.

The component (A1-1) is preferably a copolymer having the structural units (a1), (a2) and (a3). Examples of such copolymers include a copolymer consisting of the above-mentioned structural units (a1), (a2) and (a3); and a copolymer consisting of the above-mentioned structural units (a1), (a2), (a3) and (a4).

As the component (A1-1), a copolymer that includes three types of structural units represented by general formula (A1-1-1) shown below.

[Chemical Formula 41]

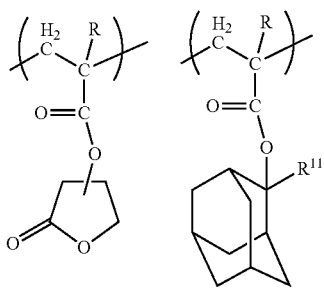

(A1-1-1)

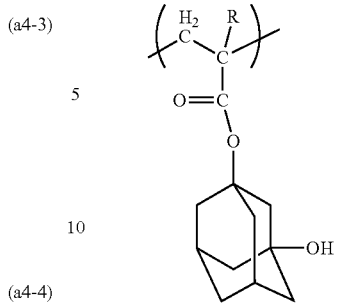

In the formula, R is the same as defined above, and the plurality of R groups may be either the same or different from each other; and R" is the same as defined for $R^{11}$ in formula (a1-1-01).

The component (A1-1) can be obtained, for example, by a conventional radical polymerization or the like of the monomers corresponding with each of the structural units, using a radical polymerization initiator such as azobisisobutyronitrile (AIBN).

Furthermore, in the component (A1-1), by using a chain transfer agent such as $HS-CH_2-CH_2-CH_2-C(CF_3)_2-OH$ during the above polymerization, a $-C(CF_3)_2-OH$ group can be introduced at the terminals of the component (A1-1). Such a copolymer having introduced a hydroxyalkyl group in which some of the hydrogen atoms of the alkyl group are substituted with fluorine atoms is effective in reducing developing defects and LER (line edge roughness:unevenness of the side walls of a line pattern).

The weight average molecular weight (Mw) (the polystyrene equivalent value determined by gel permeation chromatography (GPC)) of the component (A1-1) is not particularly limited, but is preferably within a range from 1,000 to 50,000, more preferably from 1,500 to 30,000, and most preferably from 2,000 to 20,000. Provided the weight average molecular weight is not more than the upper limit of the above-mentioned range, the component (A1-1) exhibits satisfactory solubility in a resist solvent when used as a resist, whereas provided the weight average molecular weight is at least as large as the lower limit of the above-mentioned range, the dry etching resistance and cross-sectional shape of the resist pattern can be improved.

Further, the dispersity (Mw/Mn) of the component (A1-1) is not particularly limited, but is preferably 1.0 to 5.0, more preferably 1.0 to 3.0, and most preferably 1.0 to 2.5. Here, Mn is the number average molecular weight.

[Component (A1-2)]

As the component (A1-2), it is preferable to use a compound that has a molecular weight of at least 500 but less than 4,000, contains a hydrophilic group, and also contains an acid-dissociable, dissolution-inhibiting group such as those listed above in connection with the component (A1-1). Specific examples include compounds containing a plurality of phenol skeletons in which a part of the hydrogen atoms within hydroxyl groups have been substituted with the aforementioned acid dissociable, dissolution inhibiting groups.

Examples of the component (A1-2) include low molecular weight phenol compounds in which a portion of the hydroxyl group hydrogen atoms have been substituted with an aforementioned acid dissociable, dissolution inhibiting group. These types of compounds are known, for example, as sensitizers or heat resistance improvers for use in non-chemically amplified g-line or i-line resists.

Specific examples of the low molecular weight phenolic compounds include bisphenol type compounds such as bis(4-hydroxyphenyl)methane, bis(2,3,4-trihydroxyphenyl)methane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, bis(2,3-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, and 2-(2,3,4-trihydroxyphenyl)-2-(4'-hydroxy-3',5'-dimethylphenyl)propane; tris-phenol type compounds such as tris(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, and bis(5-cyclohexyl-4-hydroxy-2-methylphenyl)-3,4-dihydroxyphenylmethane; linear three benzene ring type phenolic compounds such as 2,4-bis(3,5-dimethyl-4-hydroxybenzyl)-5-hydroxyphenol, and 2,6-bis(2,5-dimethyl-4-hydroxybenzyl)-4-methylphenol; linear four benzene ring type phenolic compounds such as 1,1-bis[3-(2-hydroxy-5-methylbenzyl)-4-hydroxy-5-cyclohexylphenyl]isopropane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, and bis[2,5-dimethyl-3-(2-hydroxy-5-methylbenzyl)-4-hydroxyphenyl]methane; linear polyphenol compounds including linear five benzene ring type phenolic compounds such as 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and 2,6-bis[2,5-dimethyl-3-(2-hydroxy-5-methylbenzyl)-4-hydroxybenzyl]-4-methylphenol; polynuclear branched compounds such as 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene; and 2 to 12 benzene ring type formalin condensation products of phenols such as phenol, m-cresol, p-cresol and xylenol. Needless to say, the low molecular weight phenolic compound is not limited to these examples.

Also, there are no particular limitations on the acid dissociable, dissolution inhibiting group, and suitable examples include the groups described above.

When the first resist composition is a negative resist composition, as the component (A), a base component that is soluble in an alkali developing solution is used, and a cross-linking agent is blended therein.

In the negative resist composition, when acid is generated from the component (B) upon exposure, the action of this acid causes cross-linking between the base component and the cross-linking agent, and solubility of the base component in an alkali developing solution changes, thereby rendering the base component, which has been soluble, substantially insoluble in the alkali developing solution. As a result, when a resist film formed by using the negative resist composition is selectively exposed, then the exposed portions become insoluble in an alkali developing solution, whereas the unexposed portions remain soluble in the alkali developing solution, meaning alkali developing can then be used to remove only the unexposed portions, thereby forming a resist pattern.

As the base component of the negative resist composition, a resin that is soluble in an alkali developing solution (i.e., an alkali-soluble resin) is usually used.

As this alkali-soluble resin, it is preferable to use, for example, a resin having a structural unit derived from at least one of α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; a (meth)acrylic resin or polycycloolefin resin having a sulfoneamide group, as disclosed in U.S. Pat. No. 6,949,325; a (meth)acrylic resin having a fluorinated alcohol, as disclosed in U.S. Pat. No. 6,949,325, Japanese Unexamined Patent Application, First Publication No. 2005-336452 or Japanese Unexamined Patent Application, First Publication No. 2006-317803; and a polycycloolefin resin having a fluorinated alcohol, as disclosed in Japanese Unexamined Patent Application, First Publication No. 2006-259582, as such resins enable the formation of a favorable resist pattern with minimal swelling.

Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group is preferable, as it enables the formation of a resist pattern with minimal swelling.

The amount of the cross-linking agent added is preferably within the range from 1 to 50 parts by weight, relative to 100 parts by weight of the alkali-soluble resin.

As the component (A), one type of component may be used alone, or two or more types may be used in combination.

The amount of the component (A) within the resist composition may be adjusted in accordance with factors such as the thickness of the resist film that is to be formed.

[Component (B)]

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-1) or (b-2) shown below can be used.

[Chemical Formula 42]

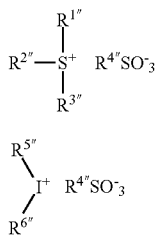

In the above formulas, $R^{1''}$ to $R^{3''}$, $R^{5''}$ and $R^{6''}$ each independently represents an aryl group or alkyl group which may have a substituent, wherein two of $R^{1''}$ to $R^{3''}$ in formula (b-1) may be bonded to each other to form a ring with the sulfur atom in the formula; and $R^{4''}$ represents an alkyl group, halogenated alkyl group, aryl group or alkenyl group which may have a substituent; with the proviso that at least one of $R^{5''}$ and $R^{6''}$ represents an aryl group.

In formula (b-1), $R^{1''}$ to $R^{3''}$ each independently represents an aryl group or alkyl group which may have a substituent. In formula (b-1), two of $R^{1''}$ to $R^{3''}$ may be bonded to each other to form a ring with the sulfur atom in the formula.

Further, it is preferable that at least one group among $R^{1''}$ to $R^{3''}$ represent an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited, and examples thereof include an aryl group having 6 to 20 carbon atoms. The aryl group is preferably an aryl group having 6 to 10 carbon atoms because it can be synthesized at a low cost. Specific examples thereof include a phenyl group and naphthyl group.

The aryl group may have a substituent. The expression "have a substituent" means that some or all of the hydrogen atoms within the aryl group has been substituted with a substituent. Examples of the substituent include an alkyl group, an alkoxy group, a halogen atom, a hydroxyl group, an alkoxyalkyloxy group, and a group represented by general formula: —O—$R^{50}$—C(=O)—(O)$_n$—$R^{51}$ (in the formula, $R^{50}$ represents an alkylene group or a single bond, $R^{51}$ represents an acid dissociable group or an acid non-dissociable group, and n represents 0 or 1).

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

Examples of the alkoxyalkyloxy group, with which hydrogen atoms of the aryl group may be substituted, include -O—C($R^{47}$)($R^{48}$)—O—$R^{49}$ (in the formula, each of $R^{47}$ and $R^{48}$ independently represents a hydrogen atom or a linear or branched alkyl group, and $R^{49}$ represents an alkyl group, wherein $R^{48}$ and $R^{49}$ may be mutually bonded to form a ring structure, provided that at least one of $R^{47}$ and $R^{48}$ represents a hydrogen atom.

The alkyl group for $R^{47}$ and $R^{48}$ preferably has 1 to 5 carbon atoms, and is preferably an ethyl group or a methyl group, and most preferably a methyl group.

Further, it is preferable that at least one of $R^{47}$ and $R^{48}$ represent a hydrogen atom, and the other represent a hydrogen atom or a methyl group. It is particularly desirable that both of $R^{47}$ and $R^{48}$ represent a hydrogen atom.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12 carbon atoms, and most preferably 5 to 10 carbon atoms.

Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

$R^{45}$ and $R^{49}$ may be mutually bonded to form a ring structure. In such a case, a cyclic group is formed by $R^{48}$, $R^{49}$, the oxygen atom having $R^{49}$ bonded thereto, and the carbon atom having the oxygen atom and $R^{48}$ bonded thereto. Such a cyclic group is preferably a 4- to 7-membered ring, and more preferably a 4- to 6-membered ring.

In the —O—$R^{50}$—C(=O)—(O)$_n$—$R^{51}$ group which may substitute the hydrogen atoms within the aryl group, the alkylene group for $R^{50}$ is preferably a linear or branched alkylene group of 1 to 5 carbon atoms. Examples of the alkylene group include a methylene group, an ethylene group, a trimethylene group, a tetramethylene group and a 1,1-dimethylethylene group.

The acid dissociable group for $R^{51}$ is not particularly limited as long as it is an organic group that is dissociable by the action of an acid (generated from the component (B) upon exposure), and examples thereof include the same acid dissociable, dissolution inhibiting groups as those described above in the explanation of the component (A). Among these, a tertiary alkyl ester-type acid dissociable group is preferable.

Preferable examples of the acid non-dissociable group for $R^{51}$ include a decyl group, a tricyclodecanyl group, an adamantyl group, a 1-(1-adamantyl)methyl group, a tetracyclododecanyl group, an isobornyl group and a norbornyl group.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkyl group may have a substituent. The expression "have a substituent" means that part or all of the hydrogen atoms within the alkyl group has been substituted with a substituent. Examples of the substituent include the same groups as those described above for the substituent of the aforementioned aryl group.

In formula (b-1), two of $R^{1''}$ to $R^{3''}$ may be mutually bonded to form a ring with the sulfur atom in the formula. The ring may be saturated or unsaturated. Further, the ring may be monocyclic or polycyclic. For example, when either one or both of the two of $R^{1''}$ to $R^{3''}$ represent a cyclic group (a cyclic alkyl group or an aryl group), a polycyclic ring (condensed ring) is formed when the two groups are bonded.

When two of $R^{1''}$ to $R^{3''}$ are bonded to each other to form a ring, it is preferable that a ring containing the sulfur atom in the formula within the ring skeleton thereof be a 3 to 10-membered ring including the sulfur atom, and it is particularly desirable that the ring be a 5 to 7-membered ring including the sulfur atom.

Specific examples of the ring formed by two of $R^{1''}$ to $R^{3''}$ mutually bonded include benzothiophene, dibenzothiophene, 9H-thioxanthene, thioxanthene, thianthrene, phenoxathiine, tetrahydrothiophenium and tetrahydrothiopyranium.

When two of $R^{1''}$ to $R^{3''}$ are bonded to each other to form a ring with the sulfur atom in the formula, the remaining one of $R^{1''}$ to $R^{3''}$ is preferably an aryl group.

In the compound represented by formula (b-1), preferable examples of the cation moiety in which all of $R^{1''}$ to $R^{3''}$ represents a phenyl group which may have a substituent, i.e., the cation moiety having a triphenylsulfonium skeleton, include cation moieties represented by formulas (I-1-1) to (I-1-14) shown below.

[Chemical Formula 43]

(I-1-1)

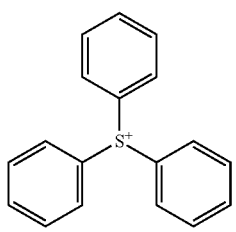

(I-1-2)

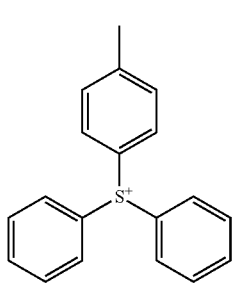

-continued (I-1-3)

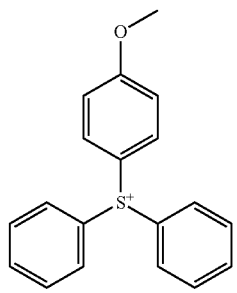

(I-1-4)

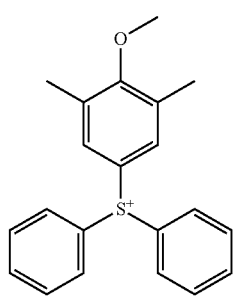

(I-1-5)

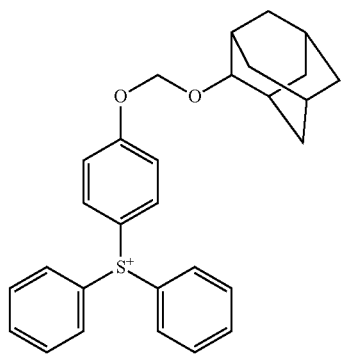

(I-1-6)

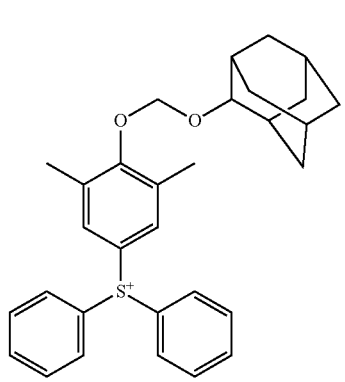

(I-1-7)

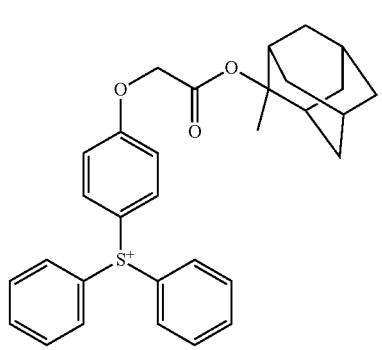

-continued

[Chemical Formula 44]

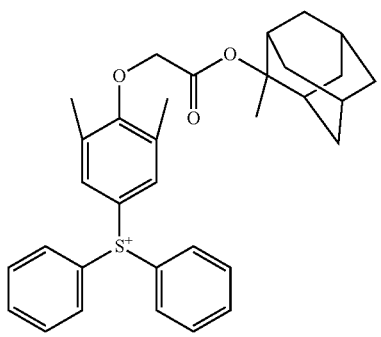
(I-1-8)

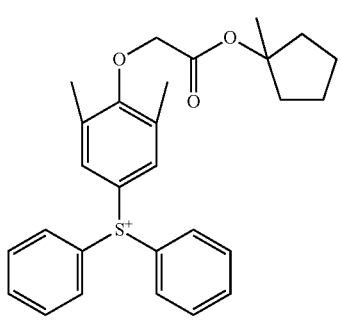
(I-1-9)

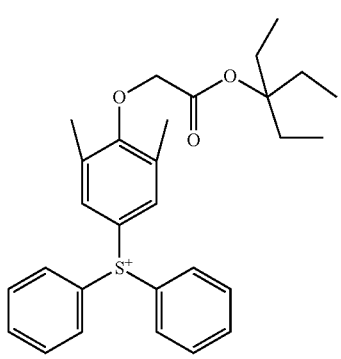
(I-1-10)

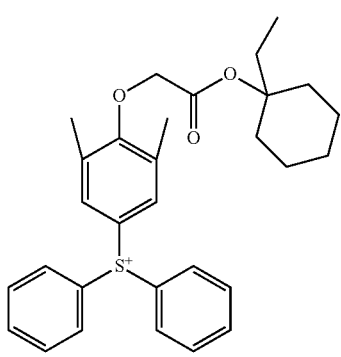
(I-1-11)

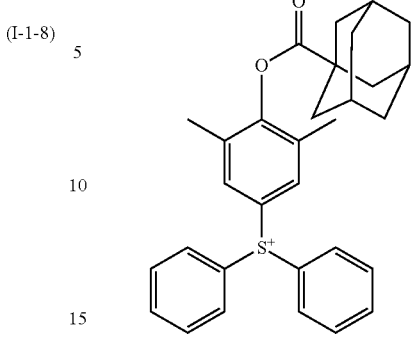
(I-1-12)

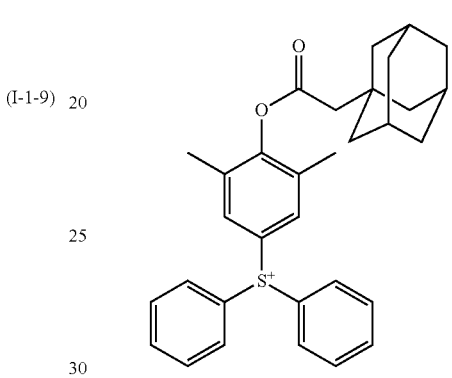
(I-1-13)

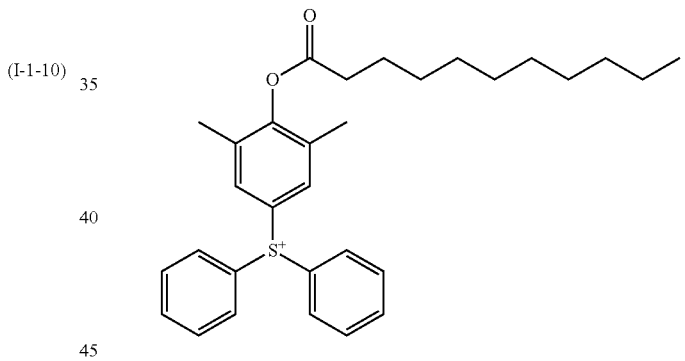
(I-1-14)

Further, a cation moiety in which part or all of the phenyl groups have been replaced with a naphthyl group which may have a substituent can also be given as a preferable example. It is preferable that 1 or 2 of the 3 phenyl groups are replaced with a naphthyl group.

Furthermore, in the compound represented by formula (b-1), preferable examples of the cation moiety in which two of $R^{1''}$ to $R^{3''}$ are mutually bonded to form a ring with a sulfur atom in the formula include cation moieties represented by formulas (I-11-10) to (I-11-13) shown below.

[Chemical Formula 45]

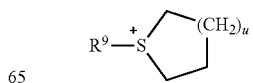
(I-11-10)

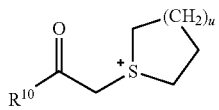

(I-11-11)

In the formulas, $R^9$ represents a phenyl group which may have a substituent, a naphthyl group which may have a substituent, or an alkyl group of 1 to 5 carbon atoms; $R^{10}$ represents a phenyl group which may have a substituent, a naphthyl group which may have a substituent, an alkyl group of 1 to 5 carbon atoms, an alkoxy group of 1 to 5 carbon atoms, or a hydroxyl group; and u represents an integer of 1 to 3.

[Chemical Formula 46]

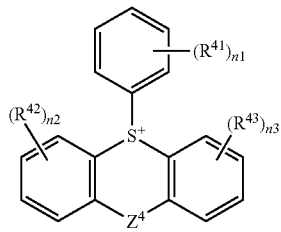

(I-11-12)

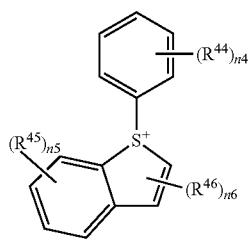

(I-11-13)

In the formulas, $Z^4$ represents a single bond, a methylene group, a sulfur atom, an oxygen atom, a nitrogen atom, a carbonyl group, —SO—, —SO$_2$—, —SO$_3$—, —COO—, —CONH— or —N(R$_N$)— (wherein R$_N$ represents an alkyl group of 1 to 5 carbon atoms); each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

In formulas (I-11-10) and (I-11-11), examples of the substituent for the phenyl group or the naphthyl group represented by $R^9$ and $R^{10}$ include the same substituents as those described above for the aryl group represented by $R^{1''}$ to $R^{3''}$. Further, examples of the substituent for the alkyl group represented by $R^9$ and $R^{10}$ include the same substituents as those described above for the alkyl group represented by $R^{1''}$ to $R^{3''}$.

u is an integer of 1 to 3, and most preferably 1 or 2.

In general formulas (I-11-12) and (I-11-13), with respect to $R^{41}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

When the subscripts n1 to n6 of $R^{41}$ to $R^{46}$ represent an integer of 2 or more, the plurality of $R^{41}$ to $R^{46}$ may be the same or different.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

In formulas (b-1) and (b-2), $R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula X-Q$^1$- (in the formula, Q$^1$ represents a divalent linking group containing an oxygen atom; and X represents a hydrocarbon group of 3 to 30 carbon atoms which may have a substituent).

Examples of halogen atoms and alkyl groups as substituents for $R^{4'''}$ include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula X-Q$^1$-, Q$^1$ represents a divalent linking group containing an oxygen atom.

Q$^1$ may also contain atoms other than the oxygen atom. Examples of atoms other than the oxygen atom include a carbon atom, a hydrogen atom, a sulfur atom and a nitrogen atom.

Examples of the divalent linking group containing an oxygen atom include non-hydrocarbon-based oxygen atom-containing linking groups such as an oxygen atom (an ether bond; —O—), an ester bond (—C(=O)—O—), an amido bond (—C(=O)—NH—), a carbonyl group (—C(=O)—), and a carbonate bond (—O—C(=O)—O—); and combinations of these non-hydrocarbon-based oxygen atom-containing linking groups with an alkylene group.

Specific examples of these combinations include —$R^{91}$—O—, —$R^{92}$—O—C(=O)—, —C(=O)—O—$R^{93}$— and —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$—, —CH($CH_2CH_3$)$CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

$Q^1$ is preferably a divalent linking group containing an ester linkage or ether linkage, and more preferably a group of —$R^{91}$—O—, —$R^{92}$—O—C(=O)—, —C(=O)—O—, —C(=O)—O—$R^{93}$—, or —C(=O)—O—$R^{93}$—O—C(=O)—.

In the group represented by the formula X-$Q^1$-, the hydrocarbon group for X may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2 carbon atoms, and most preferably 1 carbon atom.

The aromatic hydrocarbon group may have a substituent. For example, some of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, a portion of the carbon atoms constituting the aliphatic hydrocarbon group may be substituted with a substituent containing a hetero atom, and/or some or all of the hydrogen atoms constituting the aliphatic hydrocarbon group may be substituted with a substituent containing a hetero atom.

There are no particular limitations on this "hetero atom" within X, as long as it is an atom other than a carbon atom or a hydrogen atom. Examples of the hetero atom include a halogen atom, an oxygen atom, a sulfur atom and a nitrogen atom. Examples of the halogen atom include a fluorine atom, a chlorine atom, an iodine atom and a bromine atom.

The "substituent group containing a hetero atom" (hereafter, sometimes referred to as "hetero atom-containing substituent") may consist solely of the hetero atom, or may be a group containing a group or atom other than a hetero atom.

Specific examples of the hetero atom-containing substituent which may substitute a portion of the carbon atoms constituting the aliphatic hydrocarbon group include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the hetero atom-containing substituent is —NH—, the substituent for substituting H (an alkyl group, an acyl group or the like) preferably has 1 to 10 carbon atoms, more preferably 1 to 8 carbon atoms, and most preferably 1 to 5 carbon atoms.

When the aliphatic hydrocarbon group is cyclic, the aliphatic hydrocarbon group may contain any of these substituent groups in the ring structure.

Examples of the hetero atom-containing substituent which may substitute a portion or all of the hydrogen atoms constituting the aliphatic hydrocarbon group include a halogen atom, an alkoxy group, a hydroxyl group, —C(=O)—$R^{80}$ [$R^{80}$ represents an alkyl group], —COO$R^{81}$ [$R^{81}$ represents a hydrogen atom or an alkyl group], a halogenated alkyl group, a halogenated alkoxy group, an amino group, an amido group, a nitro group, an oxygen atom (═O), a sulfur atom and a sulfonyl group (SO₂).

Examples of the halogen atom for the hetero atom-containing substituent include a fluorine atom, a chlorine atom, a bromine atom and an iodine atom, and a fluorine atom is preferable.

The alkyl group within the alkoxy group for the hetero atom-containing substituent may be linear, branched, cyclic, or a combination thereof. The number of carbon atoms thereof is preferably 1 to 30. When the alkyl group is linear or branched, the number of carbon atoms thereof is preferably 1 to 20, more preferably 1 to 17, still more preferably 1 to 15, and most preferably 1 to 10. Specific examples include the same alkyl groups as those described later as examples of linear or branched, saturated hydrocarbon group. When the alkyl group is cyclic (i.e., a cycloalkyl group), the number of carbon atoms is preferably 3 to 30, more preferably 3 to 20, still more preferably 3 to 15, still more preferably 4 to 12, and most preferably 5 to 10. The alkyl group may be monocyclic or polycyclic. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Specific examples of the polycycloalkane include adamantane, norbornane, isobornane, tricyclodecane and tetracyclododecane. These cycloalkyl groups may or may not have part or all of the hydrogen atoms bonded to the ring substituted with a substituent such as a fluorine atom or a fluorinated alkyl group.

In the —C(═O)—R$^{80}$ group and the —COOR$^{81}$ group for the hetero atom-containing substituent, examples of the alkyl group for R$^{80}$ and R$^{81}$ include the same alkyl groups as those described above for the alkyl group within the aforementioned alkoxy group.

Examples of the alkyl group within the halogenated alkyl group for the hetero atom-containing substituent include the same alkyl groups as those described above for the alkyl group within the aforementioned alkoxy group. As the halogenated alkyl group, a fluorinated alkyl group is particularly desirable.

Examples of the halogenated alkoxy group for the hetero atom-containing substituent include the aforementioned alkoxy groups in which part or all of the hydrogen atoms have been substituted with the aforementioned halogen atoms. As the halogenated alkoxy group, a fluorinated alkoxy group is preferable.

Examples of the hydroxyalkyl group for the hetero atom-containing substituent include the alkyl groups given as examples of the alkyl group within the aforementioned alkoxy group in which at least one hydrogen atom has been substituted with a hydroxyl group. The number of hydroxyl groups within the hydroxyalkyl group is preferably 1 to 3, and most preferably 1.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group. As the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure thereof, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure thereof, the hetero atom-containing substituent is preferably —O—, —C(═O)—O—, —S—, —S(═O)₂— or —S(═O)₂—O—. Specific examples of such aliphatic cyclic groups include groups represented by formulas (L1) to (L5) and (S1) to (S4) shown below.

[Chemical Formula 47]

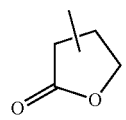

(L1)

(L2) 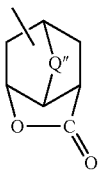

(L3) 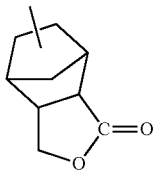

(L4) 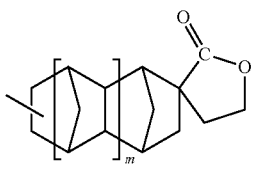

(L5) 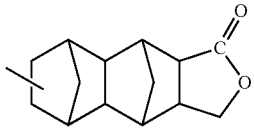

(S1) 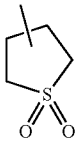

(S2) 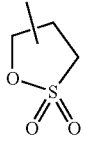

(S3) 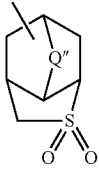

(S4) 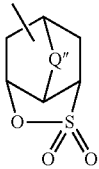

In the formulas, Q" represents an oxygen atom, a sulfur atom or an alkylene group which may contain an oxygen atom or a sulfur atom; and m represents an integer of 0 or 1.

In the formulas, the alkylene group for Q" is preferably linear or branched, and preferably has 1 to 5 carbon atoms. Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—]. Among these, a methylene group or an alkylmethylene group is preferable, and a methylene group, —CH($CH_3$)— or —C($CH_3$)$_2$— is particularly desirable.

The alkylene group may contain an oxygen atom (—O—) or a sulfur atom (—S—). As an example of such a group, the aforementioned alkylene group having —O— or —S— on the terminal or interposed between the carbon atoms can be mentioned. Specific examples thereof include —O—$R^{94}$—, —S—$R^{95}$—, —$R^{96}$—O—$R^{97}$— and —$R^{98}$—S—$R^{99}$—. Herein, each of $R^{94}$ to $R^{99}$ independently represents an alkylene group. Examples of the alkylene group include the same alkylene groups as those described above for Q". Among these, —O—$CH_2$—, —$CH_2$—O—$CH_2$—, —S—$CH_2$—, —$CH_2$—S—$CH_2$— and the like are preferable.

These aliphatic cyclic groups may have part or all of the hydrogen atoms substituted with a substituent. Examples of the substituent include an alkyl group, a halogen atom, an alkoxy group, a hydroxyl group, —C(=O)—$R^{80}$ [$R^{80}$ represents an alkyl group], —COO$R^{81}$ [$R^{81}$ represents a hydrogen atom or an alkyl group], a halogenated alkyl group, a halogenated alkoxy group, an amino group, an amide group, a nitro group, an oxygen atom (=O), a sulfur atom and a sulfonyl group ($SO_2$).

Examples of the alkyl group for the substituent include the same alkyl groups as those described above for the alkyl group within the alkoxy group for the aforementioned hetero atom-containing substituent.

As the alkyl group, an alkyl group of 1 to 6 carbon atoms is particularly desirable. The alkyl group is preferably linear or branched, and specific examples thereof include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the halogen atom, the alkoxy group, the —C(=O)—$R^{80}$ group, the —COO$R^{81}$ group, the halogenated alkyl group and the halogenated alkoxy group for the substituent, the same groups as those described above as examples of the hetero atom-containing substituent which may substitute a portion or all of the hydrogen atoms constituting the aforementioned aliphatic hydrocarbon group can be mentioned.

Among these examples, as the substituent for substituting the hydrogen atom of the aforementioned aliphatic cyclic group, an alkyl group, an oxygen atom (=O) or a hydroxyl group is preferable.

The aliphatic cyclic group may have one substituent, or two or more substituents. When the aliphatic cyclic group has a plurality of substituents, the substituents may be the same or different from each other.

As X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) above are preferable.

In the present invention, $R^{4"}$ preferably has X-$Q^1$- as a substituent. In such a case, $R^{4"}$ is preferably a group represented by the formula X-$Q^1$-$Y^{1'}$— (in the formula, $Q^1$ and X are the same as defined above; and $Y^{1'}$ represents an alkylene group of 1 to 4 carbon atoms which may have a substituent, or a fluorinated alkylene group of 1 to 4 carbon atoms which may have a substituent).

In the group represented by the formula X-$Q^1$-$Y^{1'}$—, as the alkylene group for $Y^{1'}$, the same alkylene group as those described above for $Q^1$ in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^{1'}$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—, —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—, —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$— and —$C(CH_3)(CH_2CH_3)$—.

$Y^{1'}$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may be substituted, either with atoms other than hydrogen atoms and fluorine atoms, or with groups.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5"}$ and $R^{6"}$ each independently represents an aryl group or an alkyl group. At least one of $R^{5"}$ and $R^{6"}$ represents an aryl group. It is preferable that both of $R^{5"}$ and $R^{6"}$ represent an aryl group.

As the aryl group for $R^{5"}$ and $R^{6"}$, the same as the aryl groups for $R^{1"}$ to $R^{3"}$ can be used.

As the alkyl group for $R^{5"}$ and $R^{6"}$, the same as the alkyl groups for $R^{1"}$ to $R^{3"}$ can be used.

It is particularly desirable that both of $R^{5"}$ and $R^{6"}$ represents a phenyl group.

As $R^{4"}$ in formula (b-2), the same groups as those mentioned above for $R^{4"}$ in formula (b-1) can be used.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfothium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphtyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalen-1-yl)tetrahydrothiophenium trifluoromethanesulfonate, heptafluoropropanesulfonate or nonafluorobutanesulfonate; 1-(4-ethoxynaphthalen-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has been replaced by either an alkylsulfonate such as methanesulfonate, n-propanesulfonate, n-butanesulfonate, n-octanesulfonate, 1-adamantanesulfonate, 2-norbornanesulfonate, d-camphor-10-sulfonate, benzenesulfonate, perfluorobenzenesulfonate or p-toluenesulfonate.

Furthermore, onium salts in which the anion moiety of these onium salts has been replaced by an anion moiety represented by any one of formulas (b1) to (b8) shown below can also be used.

[Chemical Formula 48]

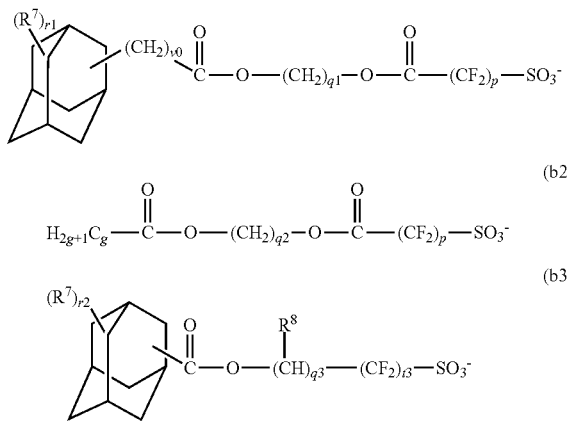

In the formulas, each p independently represents an integer of 1 to 3; v0 represents an integer of 0 to 3; each of q1 and q2 independently represents an integer of 1 to 5; q3 represents an integer of 1 to 12; each of r1 and r2 independently represents an integer of 0 to 3; g represents an integer of 1 to 20; t3 represents an integer of 1 to 3; each $R^7$ independently represents a substituent; and $R^8$ represents a hydrogen atom, an alkyl group of 1 to 5 carbon atoms or a halogenated alkyl group of 1 to 5 carbon atoms.

[Chemical Formula 49]

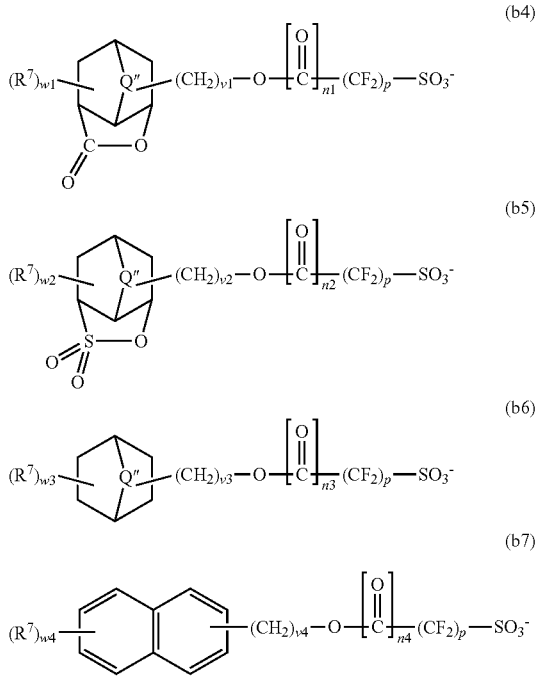

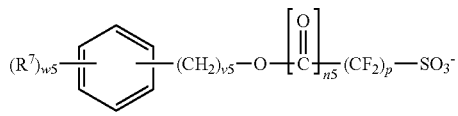

In the formulas, p, $R^7$ and Q" are the same as defined above; each of n1 to n5 independently represents 0 or 1; each of v1 to v5 independently represents an integer of 0 to 3; and each of w1 to w5 independently represents an integer of 0 to 3.

Examples of the substituent represented by $R^7$ include an alkyl group and a hetero atom-containing substituent. Examples of the alkyl group include the same alkyl groups as those described above as the substituent for the aromatic hydrocarbon group in the explanation of X. Examples of the hetero atom-containing substituent include the same hetero atom-containing substituents as those described above which may substitute part or all of the hydrogen atoms constituting the aforementioned aliphatic hydrocarbon group.

If there are two or more of the $R^7$ group, as indicated by the values r1, r2, and w1 to w5, then the two or more of the $R^7$ groups may be the same or different from each other.

The alkyl group and the halogenated alkyl group for $R^8$ are respectively the same as defined for the alkyl group and the halogenated alkyl group for R.

Each of r1, r2, and w1 to w5 is preferably an integer of 0 to 2, and more preferably 0 or 1.

v0 to v5 is preferably 0 to 2, and most preferably 0 or 1.

t3 is preferably 1 or 2, and most preferably 1.

q3 is preferably 1 to 5, more preferably 1 to 3, and most preferably 1.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 50]

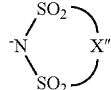

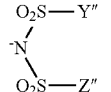

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all the hydrogen atoms are substituted with fluorine atoms.

Further, an onium salt-based acid generator in which the anion moiety ($R^{4"}SO_3^-$) in the aforementioned general formula (b-1) or (b-2) has been replaced with $R^{7"}$—COO— (in the formula, $R^{7"}$ represents an alkyl group or a fluorinated alkyl group) can also be used (the cation moiety is the same as that in general formula (b-1) or (b-2)).

As $R^{7"}$, the same groups as those described above for $R^{4"}$ can be used.

Specific examples of the group represented by the formula "$R^{7"}$—COO—" include a trifluoroacetate ion, an acetate ion, and a 1-adamantanecarboxylic acid ion.

In the present description, an oximesulfonate-based acid generator is a compound having at least one group represented by general formula (B-1) shown below, and has a feature of generating acid by irradiation. Such oxime sulfonate-based acid generators are widely used for chemically amplified resist compositions, and any of these known compounds may be selected as appropriate.

[Chemical Formula 51]

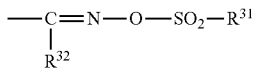

(B-1)

In the formula, each of $R^{31}$ and $R^{32}$ independently represents an organic group.

The organic group for $R^{31}$ and $R^{32}$ refers to a group containing a carbon atom, and may also include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. There are no particular limitations on the substituent, and examples thereof include a fluorine atom and a linear, branched or cyclic alkyl group having 1 to 6 carbon atoms. The expression "have a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 52]

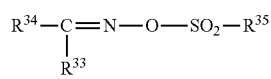

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 53]

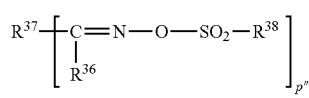

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more fluorinated, still more preferably 90% or more fluorinated. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be used.

[Chemical Formula 54]

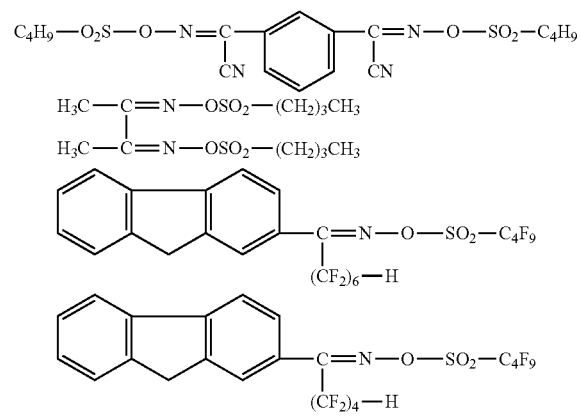

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of the acid generator may be used, or two or more types of the acid generators may be used in combination.

In the positive resist composition, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

[Optional Components]

The positive resist composition of the present invention may contain a nitrogen-containing organic compound (D) (hereafter referred to as the component (D)) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used.

In general, a low molecular weight compound (non-polymer) is used as the component (D). Examples of the component (D) include an aliphatic amine and an aromatic amine. Among these, an aliphatic amine is preferable, and a secondary aliphatic amine or tertiary aliphatic amine is particularly desirable. An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkylalcoholamines), and cyclic amines.

Specific examples of alkylamines and alkylalcoholamines include monoaklamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-oetylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and lauryldiethanolamine. Among these, trialkylamines and/or alkylalcoholamines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris {2-(1-ethoxyethoxy)ethyl}amine, tris {2-(1-ethoxypropoxy)ethyl}amine and tris[2-{2-(2-hydroxyethoxy)ethoxy}ethyl]amine.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline, 2,2'-dipyridyl and 4,4'-dipyridyl.

These compounds can be used either alone, or in combinations of two or more different compounds.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

Furthermore, in the positive resist composition, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added as an optional component.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

If desired, other miscible additives can also be added to the positive resist composition. Examples of such miscible additives include additive resins for improving the performance of the resist film, surfactants for improving the applicability, dissolution inhibitors, plasticizers, stabilizers, colorants, halation prevention agents, and dyes.

The positive resist composition described above can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These organic solvents can be used individually, or as a mixed solvent containing two or more different solvents.

Among these, propylene glycol monomethyl ether acetate (PGMEA), propylene glycol monomethyl ether (PGME), and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (5), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is adjusted appropriately to a concentration that enables application of a coating solution to a substrate in accordance with the thickness of the coating film. In general, the organic solvent is used in an amount such that the solid content of the resist composition becomes within the range from 1 to 20% by weight, and preferably from 2 to 15% by weight.

<<Second Resist Composition>>

There are no particular limitations on the second resist composition, that is, the chemically amplified resist composition used for forming the second resist film in the method of forming a resist pattern according to the present invention, and any of the multitude of chemically amplified resist compositions which have been proposed can be appropriately selected for use. This chemically amplified resist composition may be a positive resist composition which exhibits increased solubility in an alkali developing solution upon exposure, or a negative resist composition which exhibits reduced solubility in an alkali developing solution upon exposure, although a positive resist composition is preferred as the usability of the present invention can be enhanced.

As the second resist composition, for example, the resist compositions containing a base component (A') (hereafter, referred to as "component (A')") which exhibits changed solubility in an alkali developing solution by the action of acid and an acid generator component (B') (hereafter, referred to as "component (B')") which generates acid upon exposure can be used.

The component (A') may be a resin component which exhibits changed solubility in an alkali developing solution under the action of acid, a low molecular weight compound which exhibits changed solubility in an alkali developing solution under the action of acid, or a mixture of these components.

In those cases where the second resist composition in the present invention is a positive resist composition, a base component (hereafter referred to as "component (A1')") that exhibits increased solubility in an alkali developing solution under the action of acid is used as the component (A'). The component (A1') is substantially insoluble in an alkali developing solution prior to exposure, but when acid is generated from the component (B') upon exposure, the action of the acid causes an increase in the solubility in the alkali developing solution. Therefore, in the second patterning step, by conducting selective exposure of a resist film formed by applying the resist composition onto a substrate, the exposed portions change from an insoluble state to a soluble state in an alkali developing solution, whereas the unexposed portions remain substantially insoluble in an alkali developing solution, and hence, a resist pattern can be formed by alkali developing.

The component (A1') may be a resin component that exhibits increased solubility in an alkali developing solution under the action of acid (hereafter, referred to as "component (A1'-1)"), a low molecular weight compound that exhibits increased solubility in an alkali developing solution under the action of acid (hereafter, referred to as "component (A1'-2)"), or a mixture of the component (A1'-1) and the component (A1'-2).

As the component (A1'-1) and the component (A1'-2), the same as those described above for the component (A1-1) and the component (A1-2), respectively, can be used.

In the present invention, it is preferable to include the component (A1'-1) as the component (A'), and it is particularly desirable that the component (A1'-1) include a structural unit derived from an acrylate ester (such as the aforementioned structural units (a1) to (a4) and a structural unit (a5') described later).

The amount of the structural unit derived from an acrylate ester within the component (A1'-1), based on the combined total of all the structural units that constitute the component (A1'-1), is preferably at least 50 mol %, more preferably 80 mol % or greater, and may also be 100 mol %.

It is particularly desirable that the component (A1'-1) have a structural unit (a1') derived from an acrylate ester containing an acid dissociable, dissolution inhibiting group.

Further, it is preferable that the component (A1'-1) have at least one structural unit (a2') selected from the group consisting of structural units derived from an acrylate ester containing a lactone-containing cyclic group, and structural units derived from an acrylate ester containing a —$SO_2$—containing cyclic group, as well as the structural unit (a1').

Furthermore, it is preferable that the component (A1'-1) have a structural unit (a3') derived from an acrylate ester containing a polar group-containing aliphatic hydrocarbon group, as well as the structural unit (a1'), or the structural unit (a1') and the structural unit (a2').

Also, it is preferable that the component (A1'-1) have a structural unit (a5') represented by general formula (a5') shown below, as well as the structural unit (a1'), the structural unit (a1') and the structural unit (a2'), the structural unit (a1')

and the structural unit (a3'), or the structural unit (a1'), the structural unit (a2') and the structural unit (a3').

Each of these structural units may be used alone, or two or more types thereof may be used in combination.

[Chemical Formula 55]

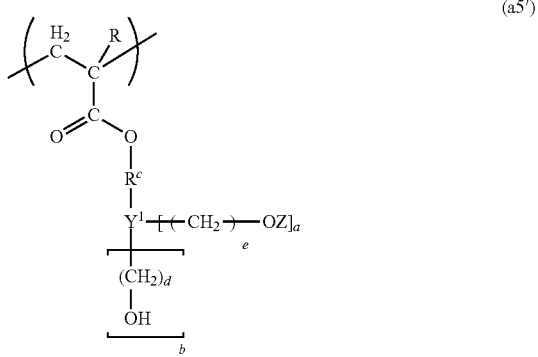

(a5')

In formula (a5'), R represents a hydrogen atom, an alkyl group of 1 to 5 carbon atoms or a halogenated alkyl group of 1 to 5 carbon atoms; $Y^1$ represents an aliphatic cyclic group; Z represents a tertiary alkyl group-containing group or an alkoxyalkyl group; $R^c$ represents a single bond or a divalent linking group; a represents an integer of 1 to 3 and b represents an integer of 0 to 2, provided that a+b=1 to 3, and each of d and e independently represents an integer of 0 to 3.

Of the various possibilities described above, as the structural unit (a1'), the same structural units for the structural unit (a1) as those described above in connection with the component (A1-1) can be used.

The amount of the structural unit (a1') within the component (A1'-1) based on the combined total of all structural units constituting the component (A1'-1) is preferably 10 to 80 mol %, more preferably 20 to 70 mol %, and still more preferably 25 to 50 mol %. By ensuring that the amount of the structural unit (a1') is at least as large as the lower limit of the above range, a pattern can be formed easily using a resist composition prepared from the component (A1'-1), whereas by ensuring that the amount is not more than the upper limit of the above range, a good balance can be achieved with the other structural units.

Of the various possibilities described above, as the structural unit (a2'), the same structural units for the structural unit (a2) as those described above in connection with the component (A1-1) can be used.

The amount of the structural unit (a2') within the component (A1'-1), based on the combined total of all the structural units that constitute the component (A1'-1), is preferably within a range from 5 to 60 mol %, more preferably from 10 to 50 mol %, and still more preferably from 20 to 50 mol %. When the amount of the structural unit (a2') is at least as large as the lower limit of the above-mentioned range, the effect of using the structural unit (a2') can be satisfactorily achieved. On the other hand, when the amount of the structural unit (a2') is no more than the upper limit of the above-mentioned range, a good balance can be achieved with the other structural units.

Of the various possibilities described above, as the structural unit (a3'), the same structural units for the structural unit (a3) as those described above in connection with the component (A1-1) can be used.

The amount of the structural unit (a3') within the component (A1'-1) based on the combined total of all structural units constituting the component (A1'-1) is preferably 5 to 50 mol %, more preferably 5 to 40 mol %, and still more preferably 5 to 25 mol %.

The structural unit (a5') is a structural unit represented by the aforementioned general formula (a5').

In formula (a5'), R is the same as defined above for R in the structural unit (a1). R is preferably a hydrogen atom or a methyl group.

$Y^1$ represents an aliphatic cyclic group. The term "aliphatic cyclic group" refers to a monocyclic group or polycyclic group that has no aromaticity.

The "aliphatic cyclic group" within the structural unit (a5') may or may not have a substituent. Examples of the substituent include an alkyl group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents (namely, the aliphatic ring) is not limited to rings constituted solely from carbon and hydrogen (not limited to hydrocarbon rings), and may contain an oxygen atom within the structure of the ring (aliphatic ring). Further, the "hydrocarbon ring" may be either saturated or unsaturated, but is preferably saturated.

The aliphatic cyclic group may be either a polycyclic group or a monocyclic group. Examples of aliphatic cyclic groups include groups in which two or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group. Specific examples include groups in which two or more hydrogen atoms have been removed from a monocycloalkane such as cyclopentane or cyclohexane; and groups in which two or more hydrogen atoms have been removed from a polycycloalkane such as adamantane, norbornane, isobornane, tricyclodecane or tetracyclododecane.

Further, examples of the aliphatic cyclic group include groups in which two or more hydrogen atoms have been removed from tetrahydrofuran or tetrahydropyrane which may or may not be substituted with a lower alkyl group, a fluorine atom or a fluorinated alkyl group.

The aliphatic cyclic group within the structural unit (a5') is preferably a polycyclic group, and a group in which two or more hydrogen atoms have been removed from adamantane is particularly desirable.

In the aforementioned general formula (a5'), Z represents a tertiary alkyl group-containing group or an alkoxyalkyl group.

(Tertiary Alkyl Group-Containing Group)

The term "tertiary alkyl group" describes an alkyl group containing a tertiary carbon atom. As mentioned above, the term "alkyl group" refers to a monovalent saturated hydrocarbon group, and includes chain-like (linear or branched) alkyl groups and cyclic alkyl groups.

The term "tertiary alkyl group-containing group" refers to a group which includes a tertiary alkyl group in the structure thereof. The tertiary alkyl group-containing group may be either constituted of only a tertiary alkyl group, or may be constituted of a tertiary alkyl group and an atom or group other than a tertiary alkyl group.

Examples of the "atom or group other than a tertiary alkyl group" which constitutes the tertiary alkyl group-containing group together with the tertiary alkyl group include a carbonyloxy group, a carbonyl group, an alkylene group and an oxygen atom (—O—).

Examples of the tertiary alkyl group-containing group for Z include tertiary alkyl group-containing groups which do not contain a cyclic structure, and tertiary alkyl group-containing groups which contain a cyclic structure.

A tertiary alkyl group-containing group which does not contain a cyclic structure contains a branched-chain tertiary alkyl group as the tertiary alkyl group, and includes no cyclic structure within the group structure.

As the branched tertiary alkyl group, for example, a group represented by general formula (I) shown below can be mentioned.

[Chemical Formula 56]

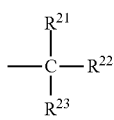

(I)

In formula (I), each of $R^{21}$ to $R^{23}$ independently represents a linear or branched alkyl group. The number of carbon atoms within the alkyl group is preferably from 1 to 5, and more preferably from 1 to 3.

Further, in the group represented by general formula (I), the total number of carbon atoms is preferably from 4 to 7, more preferably from 4 to 6, and most preferably 4 or 5.

Preferable examples of the group represented by general formula (I) include a tert-butyl group and a tert-pentyl group, and a tert-butyl group is more preferable.

Examples of the tertiary alkyl group-containing groups which do not contain a cyclic structure include the branched-chain tertiary alkyl groups described above, tertiary alkyl group-containing chain-like alkyl groups in which an aforementioned branched-chain tertiary alkyl group is bonded to a linear or branched alkylene group, tertiary alkyloxycarbonyl groups containing an aforementioned branched-chain tertiary alkyl group as the tertiary alkyl group, and tertiary alkyloxycarbonylalkyl groups containing an aforementioned branched-chain tertiary alkyl group as the tertiary alkyl group.

The alkylene group in the tertiary alkyl group-containing chain-like alkyl group is preferably an alkylene group of 1 to 5 carbon atoms, more preferably an alkylene group of 1 to 4 carbon atoms, and still more preferably an alkylene group of 1 or 2 carbon atoms.

As a chain-like tertiary alkyloxycarbonyl group, for example, a group represented by general formula (II) shown below can be mentioned.

In general formula (II), $R^{21}$ to $R^{23}$ are the same as defined above for $R^{21}$ to $R^{23}$ in general formula (I).

As the chain-like tertiary alkyloxycarbonyl group, a tert-butyloxycarbonyl group (t-boc) and a tert-pentyloxycarbonyl group are preferable.

[Chemical Formula 57]

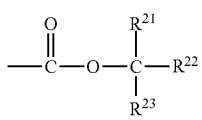

(II)

Examples of the chain-like tertiary alkyloxycarbonylalkyl groups include groups represented by general formula (III) shown below.

In general formula (III), $R^{21}$ to $R^{23}$ are the same as defined above for $R^{21}$ to $R^{23}$ in general formula (I).

f represents an integer of 1 to 3, and is preferably 1 or 2.

As the chain-like tertiary alkyloxycarbonylalkyl group, a tert-butyloxycarbonylmethyl group and a tert-butyloxycarbonylethyl group are preferable.

Of the above groups, the tertiary alkyl group-containing group which does not contain a cyclic structure is preferably a tertiary alkyloxycarbonyl group or a tertiary alkyloxycarbonylalkyl group, is more preferably a tertiary alkyloxycarbonyl group, and is most preferably a tert-butyloxycarbonyl group (t-boc).

[Chemical Formula 58]

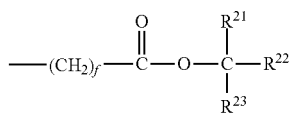

(III)

A tertiary alkyl group-containing group which contains a cyclic structure describes a group that includes a tertiary carbon atom and a cyclic structure within the group structure.

In the tertiary alkyl group-containing group which contains a cyclic structure, the cyclic structure preferably contains 4 to 12 carbon atoms, more preferably 5 to 10 carbon atoms, and most preferably 6 to 10 carbon atoms within the ring. Examples of the cyclic structure include groups in which one or more hydrogen atoms have been removed from a monocycloalkane or a polycycloalkane such as a bicycloalkane, tricycloalkane or tetracycloalkane. Preferable examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

Examples of the tertiary alkyl group-containing group which contains a cyclic structure include groups having the following group [1] or [2] as the tertiary alkyl group.

[1] A group in which a linear or branched alkyl group is bonded to a carbon atom that constitutes the ring of a cyclic alkyl group (cycloalkyl group), so that the carbon atom becomes a tertiary carbon atom.

[2] A group in which an alkylene group (branched alkylene group) having a tertiary carbon atom is bonded to a carbon atom that constitutes the ring of a cycloalkyl group.

In the above group [1], the linear or branched alkyl group preferably has 1 to 5 carbon atoms, more preferably 1 to 4 carbon atoms, and most preferably 1 to 3 carbon atoms.

Examples of the group (1) include a 2-methyl-2-adamantyl group, a 2-ethyl-2-adamantyl group, a 1-methyl-1-cycloalkyl group and a 1-ethyl-1-cycloalkyl group.

In the above group [2], the cycloalkyl group having the branched alkylene group bonded thereto may have a substituent. Examples of substituents include a fluorine atom, a fluorinated lower alkyl group of 1 to 5 carbon atoms, and an oxygen atom (=O).

Examples of the group [2] include groups represented by chemical formula (N) shown below.

[Chemical Formula 59]

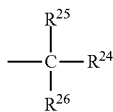

(IV)

In formula (IV), $R^{24}$ represents a cycloalkyl group which may or may not have a substituent. Examples of the substituent which the cycloalkyl group may have include a fluorine atom, a fluorinated alkyl group of 1 to 5 carbon atoms, and an oxygen atom (=O).

Each of $R^{25}$ and $R^{26}$ independently represents a linear or branched alkyl group. As the alkyl group, the same alkyl groups as those described above for $R^{21}$ to $R^{23}$ in general formula (I) may be mentioned.

(Alkoxyalkyl Group)

As the alkoxyalkyl group for Z, for example, a group represented by general formula (V) shown below may be mentioned.

[Chemical Formula 60]

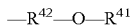

(v)

In the formula, $R^{41}$ represents a linear, branched or cyclic alkyl group.

When $R^{41}$ represents a linear or branched alkyl group, it is preferably an alkyl group of 1 to 5 carbon atoms, more preferably an ethyl group or a methyl group, and is most preferably an ethyl group.

When $R^{41}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, and which may or may not be substituted with a fluorine atom or a fluorinated alkyl group, may be mentioned. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

$R^{42}$ represents a linear or branched alkylene group. The alkylene group preferably has 1 to 5 carbon atoms, more preferably 1 to 3 carbon atoms, and most preferably 1 or 2 carbon atoms.

As the alkoxyalkyl group for Z, a group represented by general formula (VI) shown below is particularly desirable.

[Chemical Formula 61]

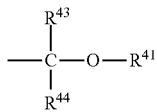

(VI)

In formula (VI), $R^{41}$ is the same as defined above, and each of $R^{43}$ and $R^{44}$ independently represents a linear or branched alkyl group or a hydrogen atom.

With respect to $R^{43}$ and $R^{44}$, the alkyl group preferably has 1 to 15 carbon atoms, and may be either linear or branched. As the alkyl group, an ethyl group or a methyl group is preferable, and a methyl group is most preferable.

It is particularly desirable that either one of $R^{43}$ and $R^{44}$ be a hydrogen atom, and the other be a methyl group.

Among the above-mentioned examples, as Z, a tertiary alkyl group-containing group is preferable, a group represented by general formula (II) above is more preferable, and a tert-butyloxycarbonyl group (t-boc) is most preferable.

In formula (a5'), $R^c$ represents a single bond or a divalent linking group. As examples of the divalent linking group, the same divalent linking groups as those described above for $Y^2$ in general formula (a1-0-2) can be given.

As the divalent linking group for $R^c$, a linear or branched alkylene group, a divalent alicyclic hydrocarbon group or a divalent linking group containing a hetero atom is preferable. Among these, a linear or branched alkylene group or a divalent linking group containing a hetero atom is more preferable, and a linear alkylene group is particularly desirable.

When $R^c$ represents an alkylene group, it preferably has 1 to 10 carbon atoms, more preferably 1 to 6 carbon atoms, still more preferably 1 to 4 carbon atoms, and most preferably 1 to 3 carbon atoms.

a represents an integer of 1 to 3, and b represents an integer of 0 to 2, with the provision that a+b=1 to 3.

a is preferably 1 or 2.

b is preferably 0.

a+b is preferably 1 or 2.

d represents an integer of 0 to 3, preferably 0 or 1, and more preferably 0.

e represents an integer of 0 to 3, preferably 0 or 1, and more preferably 0.

When b represents an integer of 1 or more, the structural unit represented by formula (a5') falls under the definition of the structural unit (a3'). However, such a structural unit represented by formula (a5') is regarded as the structural unit (a5'), but not the structural unit (a3').

Further, when Z represents an acid dissociable, dissolution inhibiting group, the structural unit represented by formula (a5') falls under the definition of the structural unit (a1'). However, such a structural unit represented by formula (a5') is regarded as the structural unit (a5'), but not the structural unit (a1').

As the structural unit (a5'), those in which $R^c$ in the above formula (a5') represents a single bond or a linear alkylene group of 1 to 3 carbon atoms are preferred. That is, structural units represented by general formula (a5'-1) shown below are preferred.

Of these, structural units represented by general formula (a5'-11), (a5'-12) or (a5'-13) are particularly desirable.

[Chemical Formula 62]

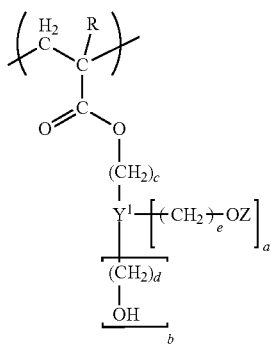

(a5'-1)

In the formula, R, Z, Y¹, a, b, d and e are the same as defined above, and c represents an integer of 0 to 3.

[Chemical Formula 63]

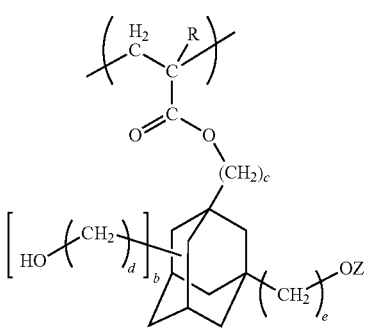

(a5'-11)

In the formula, R, Z, b, c, d and e are the same as defined above.

[Chemical Formula 64]

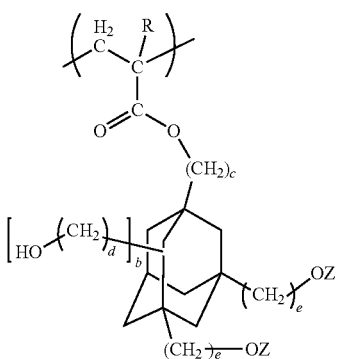

(a5'-12)

In the formula, R, Z, b, c, d and e are the same as defined above.

[Chemical Formula 65]

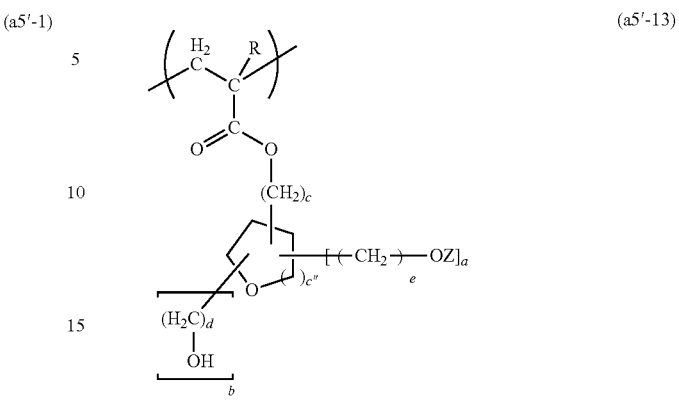

(a5'-13)

In the formula, R, Z, a, b, c, d and e are respectively the same as defined above, and c" represents an integer of 1 to 3.

In formula (a5'-11), c represents an integer of 0 to 3, preferably 0 or 1, and more preferably 0.

In formula (a5'-13), c" represents an integer of 1 to 3, preferably 1 or 2, and more preferably 1.

In those cases where c is 0 in formula (a5'-13), the oxygen atom on the terminal of the carbonyloxy group (—C(=O)—O—) within the acrylate ester is preferably not bonded to the carbon atom which is bonded to the oxygen atom within the cyclic group. That is, when c represents 0, it is preferable that there are at least two carbon atoms present between the terminal oxygen atom and the oxygen atom within the cyclic group (excluding the case where the number of such carbon atom is one (i.e., the case where an acetal bond is formed)).

The amount of the structural unit (a5') within the component (A1'-1), based on the combined total of all the structural units that constitute the component (A1'-1), is preferably within a range from 1 to 45 mol %, more preferably from 5 to 45 mol %, still more preferably from 5 to 40 mol %, and most preferably from 5 to 35 mol %. By ensuring that this amount is at least as large as the lower limit of the above range, the solubility of the component (A1'-1) within organic solvents, such as alcohol-based organic solvents, fluorine-based organic solvents, and ether-based organic solvents having no hydroxyl group, can be improved, whereas by ensuring that the amount is not more than the upper limit of the above range, a good balance can be achieved with the other structural units.

The component (A1'-1) may also include other structural units besides the above structural units (a1') to (a3') and (a5'), provided the inclusion of these other structural units does not impair the effects of the present invention.

There are no particular limitations on these other structural units, and any other structural unit which cannot be classified as one of the above structural units (a1') to (a3') and (a5') can be used without any particular limitations. Any of the multitude of conventional structural units used within resist resins for ArF excimer lasers or KrF excimer lasers (and particularly for ArF excimer lasers) or the like can be used.

Examples of other structural units include the structural unit (a4) described above in emulation with the component (A1).

The component (A1-1) is preferably a copolymer having the structural units (a1'), (a2'), (a3') and (a5'). Examples of such copolymers include a copolymer consisting of the above-mentioned structural units (a1'), (a2'), (a3') and (a5');

and a copolymer consisting of the above-mentioned structural units (a1'), (a2'), (a3'), (a4) and (a5').

As the component (A1'-1), a copolymer that includes four types of structural units represented by general formula (A1'-1-1) shown below is particularly desirable.

In formula (A1'-1-1), $R^{11}$ is preferably an alkyl group of 2 or more carbon atoms, and most preferably an ethyl group or an isopropyl group.

[Chemical Formula 66]

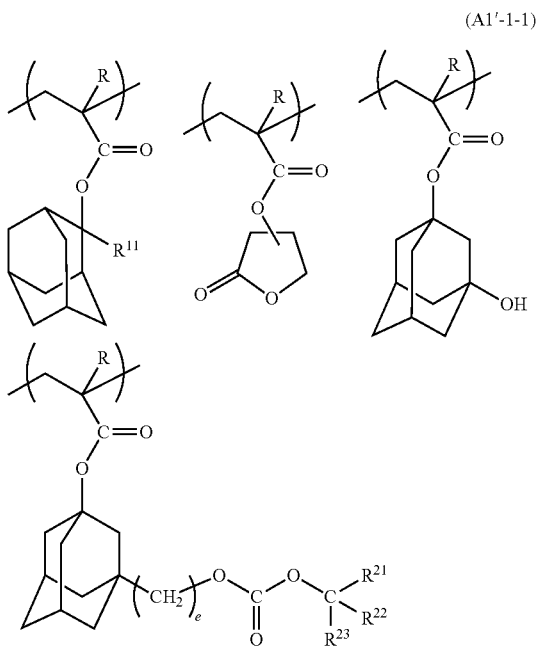

(A1'-1-1)

In the formula, R is the same as defined above, and the plurality of R may be either the same or different from each other; $R^{11}$ is the same as defined above for $R^{11}$ in formula (a1-1-01); $R^{21}$ to $R^{23}$ are respectively the same as defined above for $R^{21}$ to $R^{23}$ in formula (II); and e is the same as defined above for e in formula (a5').

The component (A1'-1) can be obtained, for example, by a conventional radical polymerization or the like of the monomers corresponding with each of the structural units, using a radical polymerization initiator such as azobisisobutyronitrile (AIBN).

Furthermore, in the component (A1'-1), by using a chain transfer agent such as HS—$CH_2$—$CH_2$—$CH_2$—$C(CF_3)_2$—OH during the above polymerization, a —$C(CF_3)_2$—OH group can be introduced at the terminals of the component (A1'-1). Such a copolymer having introduced a hydroxyalkyl group in which some of the hydrogen atoms of the alkyl group are substituted with fluorine atoms is effective in reducing developing defects and LER (line edge roughness:unevenness of the side walls of a line pattern).

The weight average molecular weight (Mw) (the polystyrene equivalent value determined by gel permeation chromatography (GPC)) of the component (A1'-1) is not particularly limited, but is preferably within a range from 1,000 to 50,000, more preferably from 1,500 to 30,000, and most preferably from 2,000 to 20,000. Provided the weight average molecular weight is not more than the upper limit of the above-mentioned range, the component (A1'-1) exhibits satisfactory solubility in a resist solvent when used as a resist, whereas provided the weight average molecular weight is at least as large as the lower limit of the above-mentioned range, the dry etching resistance and cross-sectional shape of the resist pattern can be improved.

Further, the dispersity (Mw/Mn) of the component (A1'-1) is not particularly limited, but is preferably 1.0 to 5.0, more preferably 1.0 to 3.0, and most preferably 1.0 to 2.5. Here, Mn is the number average molecular weight.

When the second resist composition is a negative resist composition, as the component (A'), a base component that is soluble in an alkali developing solution is used, and a cross-linking agent is blended therein.

In the negative resist composition, when acid is generated from the component (B) upon exposure, the action of this acid causes cross-linking between the base component and the cross-linking agent, and solubility of the base component in an alkali developing solution changes, thereby rendering the base component, which has been soluble, substantially insoluble in the alkali developing solution. As a result, when a resist film formed by using the negative resist composition is selectively exposed, then the exposed portions become insoluble in an alkali developing solution, whereas the unexposed portions remain soluble in the alkali developing solution, meaning alkali developing can then be used to remove only the unexposed portions, thereby forming a resist pattern.

As the base component of the negative resist composition, a resin that is soluble in an alkali developing solution (i.e., an alkali-soluble resin) is usually used.

As this alkali-soluble resin, it is preferable to use, for example, a resin having a structural unit derived from at least one of α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; a (meth)acrylic resin or polycycloolefin resin having a sulfoneamide group, as disclosed in U.S. Pat. No. 6,949,325; a (meth)acrylic resin having a fluorinated alcohol, as disclosed in U.S. Pat. No. 6,949,325, Japanese Unexamined Patent Application, First Publication No. 2005-336452 or Japanese Unexamined Patent Application, First Publication No. 2006-317803; and a polycycloolefin resin having a fluorinated alcohol, as disclosed in Japanese Unexamined Patent Application, First Publication No. 2006-259582, as such resins enable the formation of a favorable resist pattern with minimal swelling.

Here, the term "α-(hydroxyalkyl)acrylic acid" refers to one or both of acrylic acid, in which a hydrogen atom is bonded to the carbon atom on the α-position having the carboxyl group bonded thereto, and α-hydroxyalkylacrylic acid, in which a hydroxyalkyl group (and preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group is preferable, as it enables formation of a resist pattern with minimal swelling.

The amount of the cross-linking agent added is preferably within the range from 1 to 50 parts by weight, relative to 100 parts by weight of the alkali-soluble resin.

As the component (A), one type of component may be used alone, or two or more types may be used in combination.

The amount of the component (A) within the resist composition may be adjusted in accordance with factors such as the thickness of the resist film that is to be formed.

[Component (B')]

As the component (B'), the same acid generators as those described above for the component (B) in connection with the first resist composition can be used.

As the component (B'), one type of acid generator may be used alone, or two or more types thereof may be used in combination.

The amount of the component (B') within the second resist composition is preferably from 0.5 to 50 parts by weight and more preferably from 1 to 40 parts by weight, relative to 100 parts by weight of the component (A'). When the amount of the component (B') is within the above-mentioned range, formation of a resist pattern can be satisfactorily performed. Further, by virtue of the above-mentioned range, a uniform solution can be obtained and the storage stability becomes satisfactory.

[Optional Components]

The second resist composition may contain a nitrogen-containing organic compound (hereafter referred to as the component (D')) as an optional component.

As the component (D'), the same as those described above for the component (D) in connection with the first resist composition can be used.

As the component (D'), one type may be used alone, or two or more types may be used in combination.

The component (D') is typically used in an amount within a range from 0.01 to 5.0 parts by weight, relative to 100 parts by weight of the component (A'). When the amount of the component (D') is within the above-mentioned range, the shape of the resist pattern and the post exposure stability of the latent image formed by the pattern-wise exposure of the resist layer are improved.

Furthermore, in the second resist composition, for preventing any deterioration in sensitivity, and improving the resist pattern shape and the post exposure stability of the latent image formed by the pattern-wise exposure of the resist layer, at least one compound (hereafter referred to as the component (E')) selected from the group consisting of an organic carboxylic acid, or a phosphorus oxo acid or derivative thereof can be added as an optional component.

As the component (F), the same compounds as those described above for the component (E) in connection with the first resist composition can be used.

As the component (E'), one type of compound may be used alone, or two or more types may be used in combination.

The component (E') is typically used in an amount within a range from 0.01 to 5.0 parts by weight, relative to 100 parts by weight of the component (A').

If desired, other miscible additives can also be added to the second resist composition. Examples of such miscible additives include additive resins for improving the performance of the resist film, surfactants for improving the applicability, dissolution inhibitors, plasticizers, stabilizers, colorants, halation prevention agents, and dyes.

The second resist composition can be prepared by dissolving the materials for the resist composition in an organic solvent.

As described above in the explanation for the second patterning step, the second resist composition preferably contains the component (S') (namely, an organic solvent that does not dissolve the first resist film) as an organic solvent.

As the component (S') used in the second resist composition, one type of component may be used alone, or two or more types may be used in combination.

The second resist composition may contain another type of organic solvent other than the component (S'), provided the inclusion of the other organic solvent does not impair the effects of the component (S').

As the organic solvent other than the component (S'), it is particularly desirable to use the component (S) described above in connection with the first resist composition.

The added amount of this organic solvent other than the component (S'), based on the combined total of all the organic solvents added to the second resist composition, is preferably 0 to 20% by weight, and more preferably 1 to 15% by weight.

The amount of the combined total of all the organic solvents used for preparing the second resist composition is not particularly limited, and is usually adjusted appropriately so that the second resist composition can be prepared as a liquid with a concentration suitable to be applied onto a substrate. In general, the organic solvent is used in an amount such that the solid content of the resist composition becomes within the range from 1 to 20% by weight, and preferably from 2 to 15% by weight.

EXAMPLES

As follows is a description of examples of the present invention, although the scope of the present invention is by no way limited by these examples.

Test Example 1

1. Preparation of First Resist Composition

The components shown below in Table 1 were mixed together and dissolved to obtain positive resist composition solutions.

TABLE 1

|  | Component (A) | Component (B) | | Component (D) | Component (T) | Component (E) | Component (S) |
| --- | --- | --- | --- | --- | --- | --- | --- |
| Ex. 1 | (A)-1 | (B)-1 | (B)-2 | (D)-1 | (T)-1 | (E)-1 | (S)-1 |
|  | [100] | [10.0] | [1.0] | [1.00] | [0.66] | [1.82] | [3,200] |
| Ex. 2 | (A)-1 | (B)-1 | (B)-2 | (D)-1 | (T)-1 | (E)-1 | (S)-1 |
|  | [100] | [10.0] | [1.0] | [1.00] | [1.32] | [1.82] | [3,200] |
| Ex. 3 | (A)-1 | (B)-1 | (B)-2 | (D)-1 | (T)-2 | (E)-1 | (S)-1 |
|  | [100] | [10.0] | [1.0] | [1.00] | [0.46] | [1.82] | [3,200] |
| Ex. 4 | (A)-1 | (B)-1 | (B)-2 | (D)-1 | (T)-2 | (E)-1 | (S)-1 |
|  | [100] | [10.0] | [1.0] | [1.00] | [0.91] | [1.82] | [3,200] |
| Ex. 5 | (A)-1 | (B)-1 | (B)-2 | (D)-1 | (T)-2 | (E)-1 | (S)-1 |
|  | [100] | [10.0] | [1.0] | [1.00] | [1.82] | [1.82] | [3,200] |
| Ex. 6 | (A)-1 | (B)-1 | (B)-2 | (D)-1 | (T)-2 | (E)-1 | (S)-1 |
|  | [100] | [10.0] | [1.0] | [1.00] | [3.64] | [1.82] | [3,200] |
| Ex. 7 | (A)-1 | (B)-1 | (B)-2 | (D)-1 | (T)-3 | (E)-1 | (S)-1 |
|  | [100] | [10.0] | [1.0] | [1.00] | [0.60] | [1.82] | [3,200] |
| Ex. 8 | (A)-1 | (B)-1 | (B)-2 | (D)-1 | (T)-3 | (E)-1 | (S)-1 |
|  | [100] | [10.0] | [1.0] | [1.00] | [1.20] | [1.82] | [3,200] |

TABLE 1-continued

|  | Component (A) | Component (B) | | Component (D) | Component (T) | Component (E) | Component (S) |
|---|---|---|---|---|---|---|---|
| Ex. 9 | (A)-1 [100] | (B)-1 [10.0] | (B)-2 [1.0] | (D)-1 [1.00] | (T)-4 [0.50] | (E)-1 [1.82] | (S)-1 [3,200] |
| Ex. 10 | (A)-1 [100] | (B)-1 [10.0] | (B)-2 [1.0] | (D)-1 [1.00] | (T)-4 [1.00] | (E)-1 [1.82] | (S)-1 [3,200] |
| Ex. 11 | (A)-1 [100] | (B)-1 [10.0] | (B)-2 [1.0] | (D)-1 [1.00] | (T)-4 [2.00] | (E)-1 [1.82] | (S)-1 [3,200] |
| Comp. Ex. 1 | (A)-1 [100] | (B)-1 [10.0] | (B)-2 [1.0] | (D)-1 [1.00] | — | (E)-1 [1.82] | (S)-1 [3,200] |

In Table 1, the values in brackets [ ] indicate the amount (in terms of parts by weight) of the component added. Further, the reference characters indicate the following.

(A)-1: a copolymer represented by chemical formula (A)-1 shown below [Weight average molecular weight (Mw): 7,000; dispersity (Mw/Mn): 1.6. In the formula, the numerical value to the bottom right of the parentheses indicates the proportion (mol %) of that structural unit within the copolymer, and a1:a2:a3=35:45:20.]

(B)-1: a compound represented by chemical formula (B)-1 shown below (B)-2: a compound represented by chemical formula (B)-2 shown below (D)-1: tri-n-pentylamine (T)-1: a compound represented by chemical formula (T)-1 shown below (molecular weight: 321.41, thermal decomposition temperature: 257.5° C.)

(T)-2: a compound represented by chemical formula (T)-2 shown below (molecular weight: 250.25, thermal decomposition temperature: 224.2° C.)

(T)-3: a compound represented by chemical formula (T)-3 shown below (molecular weight: 279.13, thermal decomposition temperature: 251.8° C.)

(T)-4: a compound represented by chemical formula (T)-4 shown below (molecular weight: 237.17, thermal decomposition temperature: 177.2° C.)

(E)-1: salicylic acid (S)-1: a mixed solvent of propylene glycol monomethyl ether acetate/propylene glycol monomethyl ether=60/40 (weight ratio)

[Chemical Formula 67]

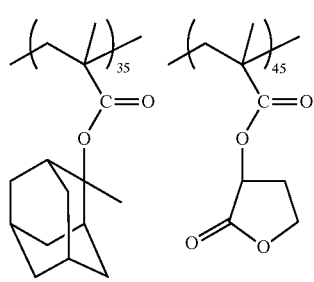

(A)-1

-continued

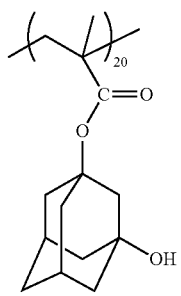

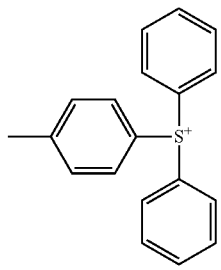 (B)-1

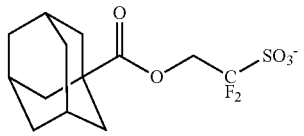

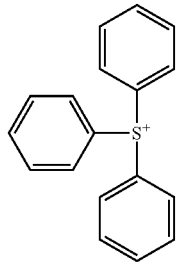 (B)-2

[Chemical Formula 68]

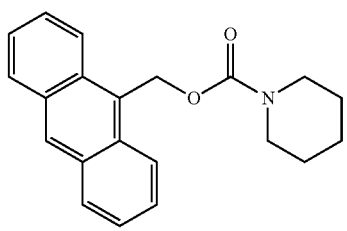 (T)-1

-continued (T)-2
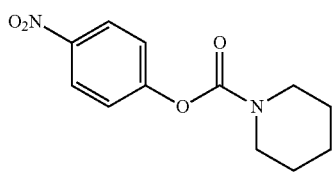

(T)-3
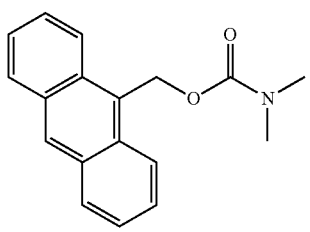

(T)-4
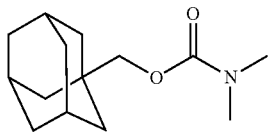

2. Preparation Example of Second Resist Composition

The components shown below in Table 2 were mixed together and dissolved to obtain positive resist composition solutions.

TABLE 2

| | Component (A') | Component (B') | | | Component (E') | Component (S') |
|---|---|---|---|---|---|---|
| 2-1 | (A')-1 [100] | (B')-1 [9.0] | (B')-2 [2.0] | (B')-3 [3.5] | (E')-1 [1.00] | (S')-1 [3,200] |

In Table 2, the values in brackets [ ] indicate the amount (in terms of parts by weight) of the component added. Further, the reference characters indicate the following.

(A')-1: a copolymer represented by chemical formula (A')-1 shown below [Mw: 7,000; Mw/Mn: 1.6]

(B')-1: a compound represented by chemical formula (B')-1 shown below (B')-2: (4-methylphenyl)diphenylsulfonium nonafluoro-n-butanesulfonate (B')-3: a compound represented by chemical formula (B')-3 shown below (E')-1: salicylic acid (S')-1: 1-butoxy-2-propanol

[Chemical Formula 69]

(A')-1
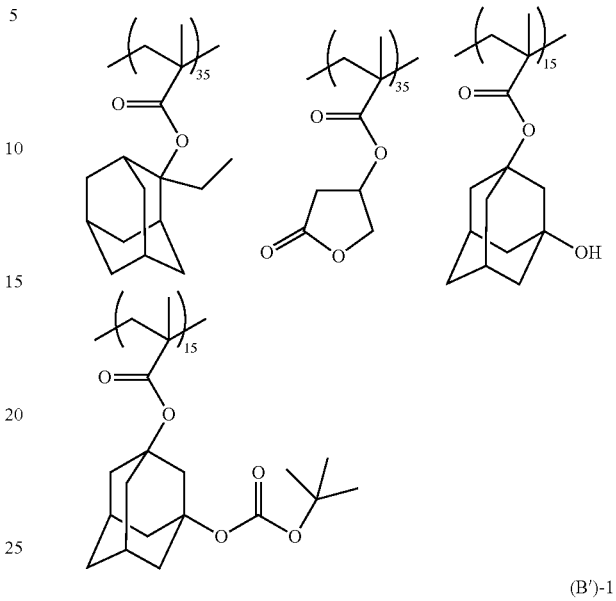

(B')-1

(B')-3
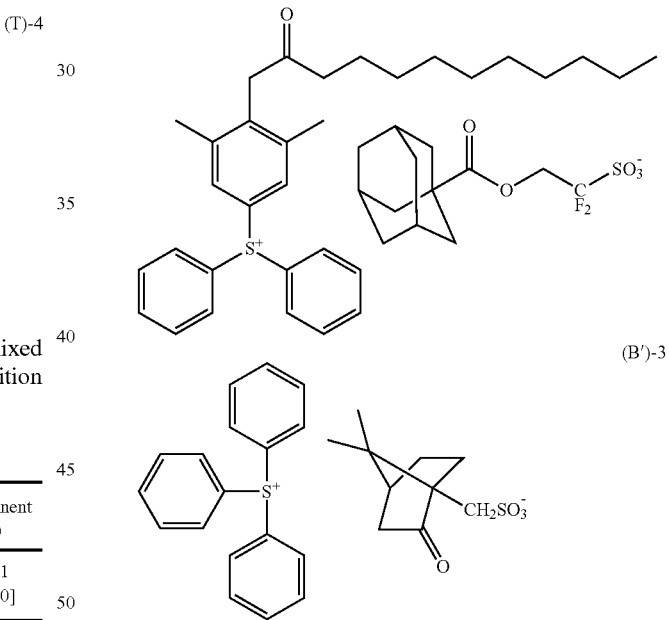

3. Evaluation of Suitability for Double Patterning Process

Each of the first resist compositions prepared as described above was evaluated by the following simulated double patterning process. That is, in the second patterning step, the second resist films were subjected to exposure across the entire surface followed by alkali developing to remove the entire second resist films, thereby evaluating the effects of the second patterning step on the first resist patterns formed using the respective first resist compositions.

First, an organic antireflection film composition (product name: ARC29, manufactured by Brewer Science Ltd.) was applied onto an 8-inch silicon wafer using a spinner, and the composition was then baked and dried on a hotplate at 205° C. for 60 seconds, thereby forming an organic antireflection film having a thickness of 82 nm. The resultant was used as a substrate. Subsequently, the aforementioned first resist composition [any one of those prepared in Examples 1 to 11 and Comparative Example 1] was applied on top of the organic antireflection film of this substrate using a spinner, and the composition was then prebaked (PAB) on a hotplate at 90° C. for 60 seconds, thereby forming a resist film (first resist film) having a film thickness of 100 nm.

The first resist film was then irradiated with an ArF excimer laser (193 nm) at an exposure dose shown in Table 3 (indicated as "1st exposure dose"), through a photomask targeting a line and space resist pattern (hereafter, referred to as "LS pattern") with a line width of 120 nm and a pitch of 240 nm, using an ArF exposure apparatus NSR-S302 (manufactured by Nikon Corporation, NA (numerical aperture)=0.60, ⅔ annular illumination). Thereafter, the first resist film was subjected to a post exposure bake (PEB) at 110° C. for 60 seconds, followed by alkali developing for 30 seconds at 23° C. in a 2.38% by weight aqueous solution of tetramethylammonium hydroxide (TMAH) and rinsing for 15 seconds using pure water. As a result, an LS pattern was formed. This LS pattern was subjected to hard baking at 150° C. for 60 seconds. The line width of the LS pattern following this hard baking was measured using a scanning electron microscope (SEM). The obtained results are indicated in Table 3 as "after 1st line width".

Next, the aforementioned second resist composition [2-1] was applied onto the substrate, on which the above LS pattern had been formed, using a spinner, and the composition was then prebaked (PAB) on a hotplate at 90° C. for 60 seconds, thereby forming a resist film (second resist film) having a film thickness of 80 nm.

The second resist film was then irradiated (exposure across the entire surface) with an ArF excimer laser (193 nm) at an exposure dose shown in Table 3 (indicated as "2nd exposure dose"), by an open frame exposure (exposure without using a photomask), using an ArF exposure apparatus NSR-S302 (manufactured by Nikon Corporation, NA=0.60, ⅔ annular illumination). Thereafter, the second resist film was subjected to a PEB treatment at 90° C. for 60 seconds, followed by alkali developing for 30 seconds at 23° C. in a 2.38% by weight aqueous solution of TMAH, rinsing for 15 seconds using pure water, and a postbake treatment at 100° C. for 60 seconds.

The surface of the substrate following this postbake treatment was observed using a SEM.

As a result, elimination of the LS pattern formed in the first resist film was observed in an example using the resist composition prepared in Comparative Example 1 as the first resist composition.

On the other hand, in examples where the resist compositions prepared in Examples 1 to 11 were used as the first resist compositions, persistence of the LS pattern formed in the first resist film was observed.

Further, with regard to the remained LS patterns obtained in the respective examples, although the line portions were damaged in the LS patterns of Examples 3, 4, 9 and 10, the line portions were kept intact in the LS patterns formed by the resist compositions of Examples 1, 2, 5 to 8 and 11. At this time, the line width of the LS patterns of Examples 1, 2, 5 to 8 and 11 that were remaining on the substrate was measured using a SEM. The obtained results are indicated in Table 3 as "after 2nd line width". Further, the difference between this "after 2nd line width" and the aforementioned "after 1st line width" (i.e., (after 2nd line width)−(after 1st line width)) is indicated in Table 3 as "Δ line width".

It should be noted that in the above evaluation, the 1st exposure dose corresponds to the optimum exposure dose for forming an LS pattern having a line width of 120 nm and a pitch of 240 nm using the respective first resist compositions, and the same exposure dose as the 1st exposure dose was employed as the 2nd exposure dose.

TABLE 3

| | First resist composition | | | | | |
|---|---|---|---|---|---|---|
| | Ex. 1 | Ex. 2 | Ex. 3 | Ex. 4 | Ex. 5 | Ex. 6 |
| Second resist composition | 2-1 | 2-1 | 2-1 | 2-1 | 2-1 | 2-1 |
| $1^{st}$ exposure dose (mJ/cm$^2$) | 27.0 | 35.0 | 20.0 | 20.0 | 20.0 | 19.0 |
| After $1^{st}$ line width (nm) | 123.8 | 119.0 | 116.7 | 116.6 | 114.1 | 124.9 |
| $2^{nd}$ exposure dose (mJ/cm$^2$) | 27.0 | 35.0 | 20.0 | 20.0 | 20.0 | 19.0 |
| After $2^{nd}$ line width (nm) | 99.0 | 97.1 | — | — | 101.4 | 112.4 |
| Δ line width (nm) | −24.8 | −21.9 | — | — | −12.7 | −12.5 |

| | First resist composition | | | | | |
|---|---|---|---|---|---|---|
| | Ex. 7 | Ex. 8 | Ex. 9 | Ex. 10 | Ex. 11 | Comp. Ex. 1 |
| Second resist composition | 2-1 | 2-1 | 2-1 | 2-1 | 2-1 | 2-1 |
| $1^{st}$ exposure dose (mJ/cm$^2$) | 30.0 | 40.0 | 21.0 | 21.0 | 19.0 | 21.0 |
| After $1^{st}$ line width (nm) | 119.8 | 121.2 | 119.2 | 120.5 | 120.3 | 117.6 |
| $2^{nd}$ exposure dose (mJ/cm$^2$) | 30.0 | 40.0 | 21.0 | 21.0 | 19.0 | 21.0 |
| After $2^{nd}$ line width (nm) | 99.9 | 105.4 | — | — | 97.1 | — |
| Δ line width (nm) | −19.9 | −15.8 | — | — | −23.2 | — |

From the results shown above, it was confirmed that elimination of the first resist pattern can be prevented and the double patterning process can be conducted favorably by using those to which the component (T) has been added as the first resist composition.

Further, it became apparent that when the same material was added as the component (T), the level of adverse effects on the first resist pattern (observed as the reduction in the line width) tended to reduce as the added amount of component (T) increased.

Furthermore, in those cases where the component (T)-1 or (T)-3 was used, it became clear that the sensitivity level of resists reduces in proportion to the added amount thereof. The reason for this observation is considered to be as follows. These components (T) are thought to exhibit high absorption coefficient for the radiation having a wavelength of 193 nm due to the structures thereof. As a result, a base (an amine) may be generated from the component (T) upon exposure during the first patterning step.

On the other hand, in those cases where the component (T)-2 was used, it became clear that the sensitivity level was kept at the same level or higher even when the added amount thereof was increased. Also with regard to the component (T)-4, the same trend as observed for the component (T)-2 was observed when the patterning was conducted while changing the added amount. It is thought that this is because as compared to the components (T)-1 and (T)-3, the components (T)-2 and (T)-4 exhibit lower absorption coefficient for the radiation having a wavelength of 193 nm, and the adverse effects related to the generation of base (amine) from the component (T) upon exposure are minimal.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

DESCRIPTION OF THE REFERENCE SYMBOLS

1: Substrate; 2: First resist film (positive-type); 3: Photomask; 4: Second resist film (positive-type); 5: Photomask

What is claimed is:

1. A method of forming a resist pattern comprising:
a first patterning step for forming a first resist pattern by applying a first chemically amplified resist composition onto a substrate to form a first resist film, followed by selective exposure and alkali developing of the first resist film;
a hard bake step for baking the first resist pattern; and
a second patterning step for forming a resist pattern by applying a second chemically amplified resist composition onto the substrate, on which the first resist pattern has been formed, to form a second resist film, followed by selective exposure and alkali developing of the second resist film,
wherein a resist composition containing a thermal base generator which is represented by general formula (T1-11), (T1-12) or (T1-13) shown below is used as the first chemically amplified resist composition in the first patterning step, and
the baking in the hard bake step is conducted under a bake condition such that a base is generated from the thermal base generator:

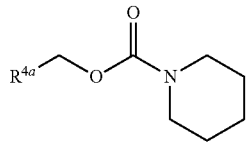
(T1-11)

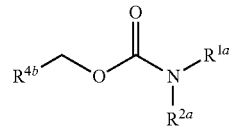
(T1-12)

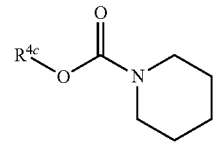
(T1-13)

wherein $R^{4a}$ represents an adamantyl group or an anthryl group; $R^{4b}$ represents an aliphatic cyclic group of 6 to 40 carbon atoms which may have a substituent, or a group in which one hydrogen atom has been removed from benzene, biphenyl, indene, naphthalene, anthracene or phenanthrene; $R^{4c}$ represents an aromatic cyclic group having at least a nitro group as a substituent; and each of $R^{1a}$ and $R^{2a}$ independently represents an alkyl group of 1 to 5 carbon atoms.

2. The method of forming a resist pattern according to claim 1, wherein the first chemically amplified resist composition is a positive resist composition.

3. The method of forming a resist pattern according to claim 1 or 2, wherein the first resist film is baked following exposure and prior to alkali developing in the first patterning step, under a bake condition such that a base does not substantially generate from the thermal base generator.

* * * * *

UNITED STATES PATENT AND TRADEMARK OFFICE
CERTIFICATE OF CORRECTION

PATENT NO. : 8,877,432 B2  
APPLICATION NO. : 13/073651  
DATED : November 4, 2014  
INVENTOR(S) : Jiro Yokoya et al.

Page 1 of 1

It is certified that error appears in the above-identified patent and that said Letters Patent is hereby corrected as shown below:

In the Specification

Col. 20, line 39, "group, NR"$_2$," should be --group, –NR"$_2$,--.
Col. 20, line 39, "O-R$^{3"}$" should be --O-R$^{3'}$--.
Col. 20, line 66, "hydroxyallyl" should be --hydroxyalkyl--.
Col. 22, line 10 "monocylic," should be --monocyclic,--.
Col. 23, line 21, "(—O—C(O)—O—)," should be --(—O—C(=O)—O—), -S—, —S(=O)$_2$-,--.
Col. 23, lines 52 and 56, "monocylic," should be --monocyclic,--.
Col. 23, lines 62 and 66, "polycylic," should be --polycyclic,--.
Col. 88, line 3, "—CH$_2$—S—CH$_2$." should be -- —CH$_2$—S—CH$_2$—.--.
Col. 93, line 19, "genera" should be --general--.
Col. 94, line 19, "(=O)—P]$_m$—B—" should be --(=O)—O]$_m$—B- --.
Col. 94, lines 20-21, "—A—O—C(O)—B—" should be -- -A—O—C(=O)—B— --.
Col. 98, line 33, "(a-4-1)" should be --(a4-1)--.
Col. 98, line 34, "(a-4-5)" should be --(a4-5)--.
Col. 102, lines 35-36, "sulfoneamide" should be --sulfonamide--.
Col. 102, line 41, "polycyclolefin" should be --polycycloolefin--.
Col. 104, line 40, "R$^{45}$" should be --R$^{48}$--.
Col. 112, line 4, "heteroatom" should be --hetero atom--.
Col. 118, line 27, diphenylsulfothum" should be --diphenylsulfonium--.
Col. 118, lines 32-33, "naphtyl)" should be --naphthyl)--.
Col. 125, line 39, "monoaklamines" should be --monoalkylamines--.
Col. 125, line 45, "tri-n-oetylamine," should be --tri-n-octylamine,--.
Col. 138, line 41, polycyclolefin" should be --polycycloolefin--.

Signed and Sealed this  
Twenty-fifth Day of August, 2015

Michelle K. Lee  
*Director of the United States Patent and Trademark Office*